United States Patent
Son et al.

(10) Patent No.: US 11,335,685 B2
(45) Date of Patent: May 17, 2022

(54) SEMICONDUCTOR MEMORY DEVICE

(71) Applicant: Samsung Electronics Co., Ltd., Suwon-si (KR)

(72) Inventors: Yong-Hoon Son, Suwon-si (KR); Hyung Joon Kim, Suwon-si (KR); Hyun Jung Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 94 days.

(21) Appl. No.: 16/693,889

(22) Filed: Nov. 25, 2019

(65) Prior Publication Data
US 2020/0350315 A1 Nov. 5, 2020

(30) Foreign Application Priority Data
Apr. 30, 2019 (KR) .................... 10-2019-0050695

(51) Int. Cl.
*H01L 27/108* (2006.01)
*H01L 27/11565* (2017.01)

(52) U.S. Cl.
CPC ........ *H01L 27/108* (2013.01); *H01L 27/1085* (2013.01); *H01L 27/10808* (2013.01); *H01L 27/10855* (2013.01); *H01L 27/10873* (2013.01); *H01L 27/10885* (2013.01); *H01L 27/10891* (2013.01); *H01L 27/11565* (2013.01)

(58) Field of Classification Search
CPC ......... H01L 27/10808; H01L 27/10891; H01L 27/10873; H01L 27/10855; H01L 27/10885; H01L 27/11582; H01L 27/11521; H01L 27/11551; H01L 27/11568; H01L 27/11578; H01L 27/10805; H01L 27/10847; H01L 27/1052; H01L 27/1085; H01L 27/108; H01L 27/11565
See application file for complete search history.

(56) References Cited

U.S. PATENT DOCUMENTS

| | | |
|---|---|---|
| 8,294,209 B2 | 10/2012 | Jeon et al. |
| 8,338,873 B2 | 12/2012 | Son et al. |
| 8,441,053 B2 | 5/2013 | Chen et al. |
| 8,482,049 B2 | 7/2013 | Son et al. |

(Continued)

FOREIGN PATENT DOCUMENTS

KR 101070317 B1 10/2011

*Primary Examiner* — Shouxiang Hu
(74) *Attorney, Agent, or Firm* — Harness, Dickey & Pierce, P.L.C.

(57) ABSTRACT

Disclosed are semiconductor memory devices and methods of fabricating the same. The semiconductor memory device comprises a first semiconductor pattern that is on a substrate and that includes a first end and a second end that face each other, a first conductive line that is adjacent to a lateral surface of the first semiconductor pattern between the first and second ends and that is perpendicular to a top surface of the substrate, a second conductive line that is in contact with the first end of the first semiconductor pattern, is spaced part from the first conductive line, and is parallel to the top surface of the substrate, and a data storage pattern in contact with the second end of the first semiconductor pattern. The first conductive line has a protrusion that protrudes adjacent to the lateral surface of the first semiconductor pattern.

20 Claims, 65 Drawing Sheets

(56) References Cited

U.S. PATENT DOCUMENTS

| | | | |
|---|---|---|---|
| 9,659,788 B2 | 5/2017 | Surla et al. | |
| 9,997,373 B2 | 6/2018 | Hudson | |
| 10,008,265 B2 | 6/2018 | Hsu | |
| 10,068,917 B2 | 9/2018 | Kanamori et al. | |
| 10,096,610 B1 | 10/2018 | Hopkins et al. | |
| 10,784,272 B2 * | 9/2020 | Lee | H01L 23/53295 |
| 2013/0134492 A1 | 5/2013 | Yang et al. | |
| 2013/0161713 A1 * | 6/2013 | Yamazaki | H01L 27/108 257/296 |
| 2014/0054538 A1 * | 2/2014 | Park | H01L 45/1253 257/5 |
| 2017/0053906 A1 * | 2/2017 | Or-Bach | H01L 27/11578 |
| 2020/0212041 A1 * | 7/2020 | Machkaoutsan | H01L 27/10805 |

* cited by examiner

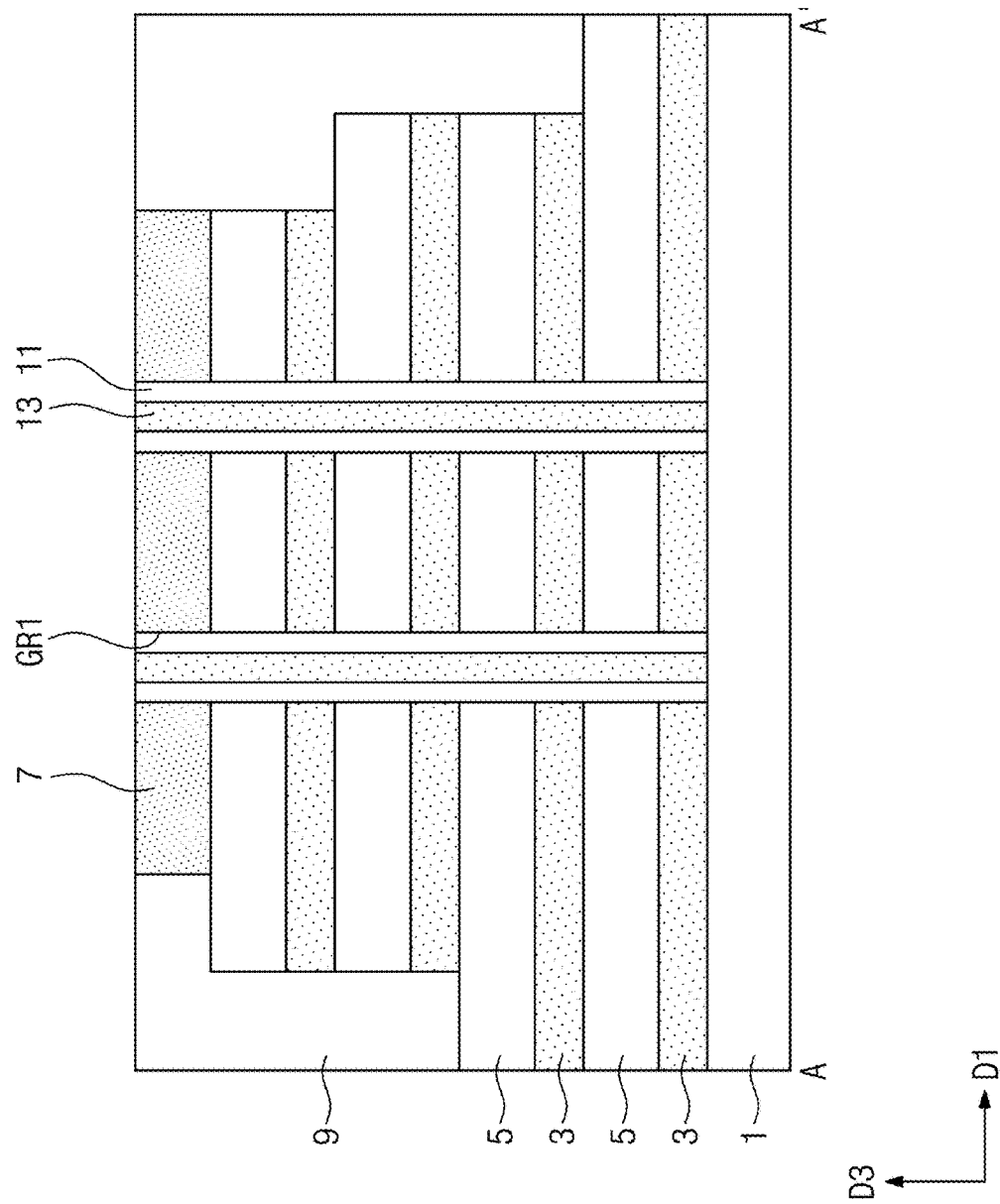

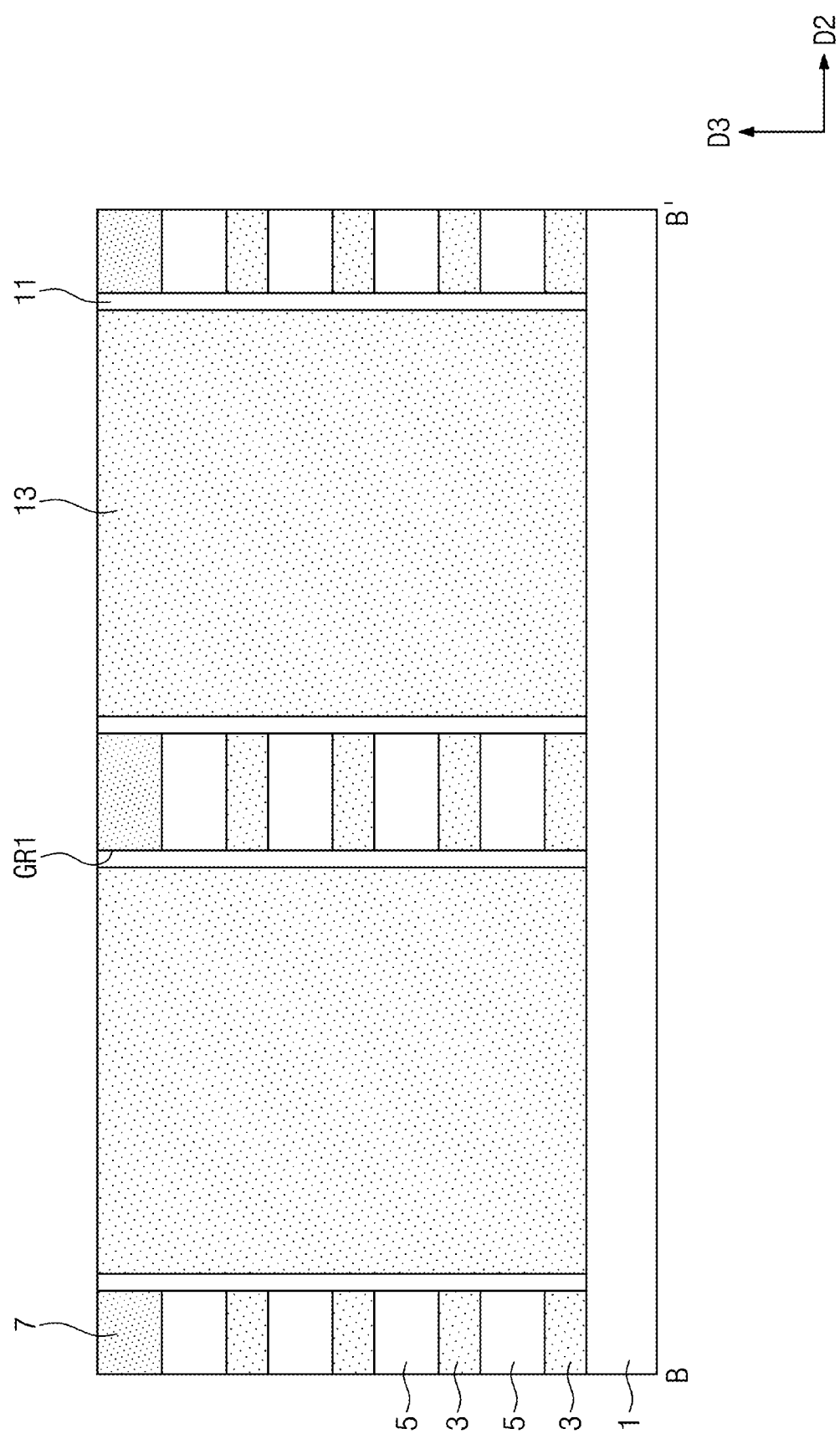

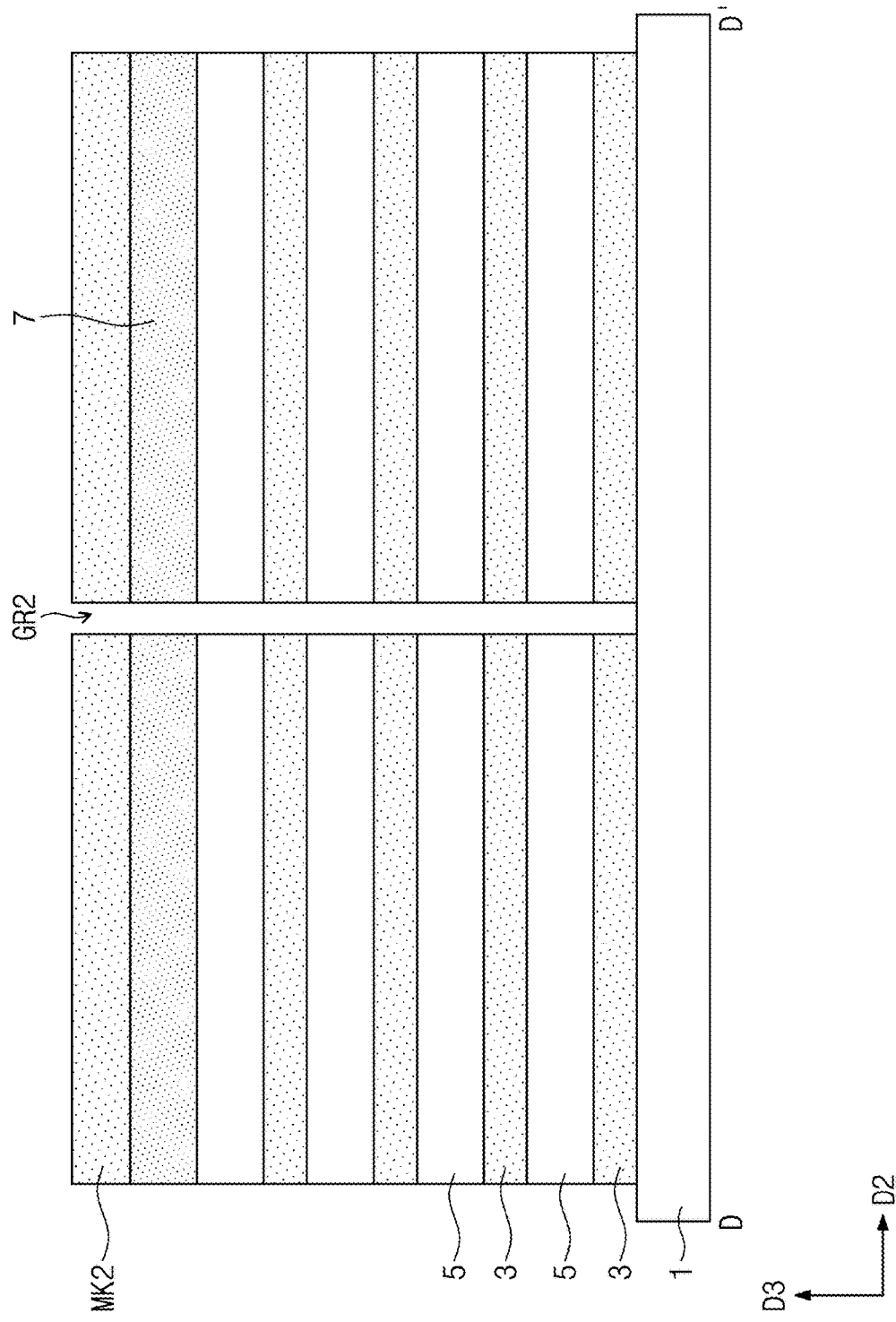

SEMICONDUCTOR MEMORY DEVICE

CROSS-REFERENCE TO RELATED APPLICATION

This U.S. nonprovisional application claims priority under 35 U.S.C. § 119 to Korean Patent Application No. 10-2019-0050695 filed on Apr. 30, 2019 in the Korean Intellectual Property Office, the entire contents of which are hereby incorporated by reference.

BACKGROUND

Inventive concepts relate to a semiconductor device and/or a method of fabricating the same, and more particularly, to a semiconductor memory device with increased integration and/or a method of fabricating the same.

Semiconductor devices have been highly integrated to satisfy high performance and low manufacture costs of semiconductor devices, which are required by and/or expected by customers. Since integration of semiconductor devices is an important factor in determining product price, high integrated semiconductor devices are increasingly demanded. Integration of typical two-dimensional or planar semiconductor devices is primarily determined by the area occupied by a unit memory cell, such that it is greatly influenced by the level of technology for forming fine patterns. However, the extremely expensive processing equipment needed or used to increase pattern fineness may set a practical limitation on increasing the integration of the two-dimensional or planar semiconductor devices. Therefore, there have been proposed three-dimensional semiconductor memory devices having three-dimensionally arranged memory cells.

SUMMARY

Some example embodiments of inventive concepts provide a semiconductor memory device with increased integration.

Some example embodiments of inventive concepts provide a method of fabricating a semiconductor memory device, which method is capable of increasing productivity.

An object of inventive concepts is not limited to the mentioned above, and other objects which have not been mentioned above will be clearly understood to those of ordinary skill in the art from the following description.

According to some example embodiments of inventive concepts, a semiconductor memory device may include a first semiconductor pattern on a substrate, the first semiconductor pattern including a first end and a second end facing the first end, a first conductive line adjacent to a lateral surface of the first semiconductor pattern, the first conductive line between the first end and the second end, the first conductive line perpendicular to a top surface of the substrate, a second conductive line in contact with the first end of the first semiconductor pattern and spaced part from the first conductive line, the second conductive line parallel to the top surface of the substrate, and a data storage pattern in contact with the second end of the first semiconductor pattern. The first conductive line includes a protrusion that protrudes adjacent to the lateral surface of the first semiconductor pattern.

According to some example embodiments of inventive concepts, a semiconductor memory device may include a plurality of first interlayer dielectric patterns and a plurality of second interlayer dielectric patterns on a substrate, the plurality of first interlayer dielectric patterns alternating with the plurality of second interlayer dielectric patterns, a first conductive line penetrating the second interlayer dielectric patterns and the first interlayer dielectric patterns and extending perpendicularly from a top surface of the substrate, and a plurality of semiconductor patterns between the first conductive line and the second interlayer dielectric patterns, respectively. The semiconductor patterns contact the second interlayer dielectric patterns, respectively.

According to some example embodiments of inventive concepts, a semiconductor memory device may include a plurality of first interlayer dielectric patterns and a plurality of second interlayer dielectric patterns on a substrate, the plurality of first interlayer dielectric patterns alternating with the plurality of second interlayer dielectric patterns, a first conductive line and a second conductive line, the first conductive line and the second conductive line penetrating the second interlayer dielectric patterns and the first interlayer dielectric patterns, the first conductive line and the second conductive line extending perpendicularly from a top surface of the substrate, the first and second conductive lines being spaced apart from each other, a plurality of first semiconductor patterns between the first conductive line and the second interlayer dielectric patterns, respectively, and a plurality of second semiconductor patterns between the second conductive line and the second interlayer dielectric patterns, respectively. The first conductive line has a structure symmetrical to a structure of the second conductive line.

According to some example embodiments of inventive concepts, a method of fabricating a semiconductor memory device may include alternately stacking a plurality of first interlayer dielectric layers and a plurality of second interlayer dielectric layers on a substrate, successively etching the second interlayer dielectric layers and the first interlayer dielectric layers, the successively etching forming a first groove exposing the substrate, the first groove elongated in a first direction, the successively etching forming a plurality of first interlayer dielectric patterns and a plurality of second interlayer dielectric patterns, using the first groove to partially remove the second interlayer dielectric patterns and to form a plurality of first recessed regions that partially expose top and bottom surfaces of the first interlayer dielectric patterns, and forming a plurality of semiconductor patterns in the first recessed regions, respectively. The semiconductor patterns are spaced apart from each other.

BRIEF DESCRIPTION OF THE DRAWINGS

FIGS. 4B, 5B, 6B, 7B, 8C, 9C, 10C, and 11C illustrate cross-sectional views taken along line A-A' of FIGS. 4A, 5A, 6A, 7A, 8A, 9A, 10A, and 11A, respectively.

FIGS. 5C, 6C, 7C, 8D, 9D, 10D, and 11D illustrate cross-sectional views taken along line B-B' of FIGS. 5A, 6A, 7A, 8A, 9A, 10A, and 11A, respectively.

FIGS. 11F, 12D, 14E, and 15D illustrate cross-sectional views taken along line D-D' of FIGS. 11B, 12A, 14B, and 15A, respectively.

DETAILED DESCRIPTION OF EXAMPLE EMBODIMENTS

Figure 1:
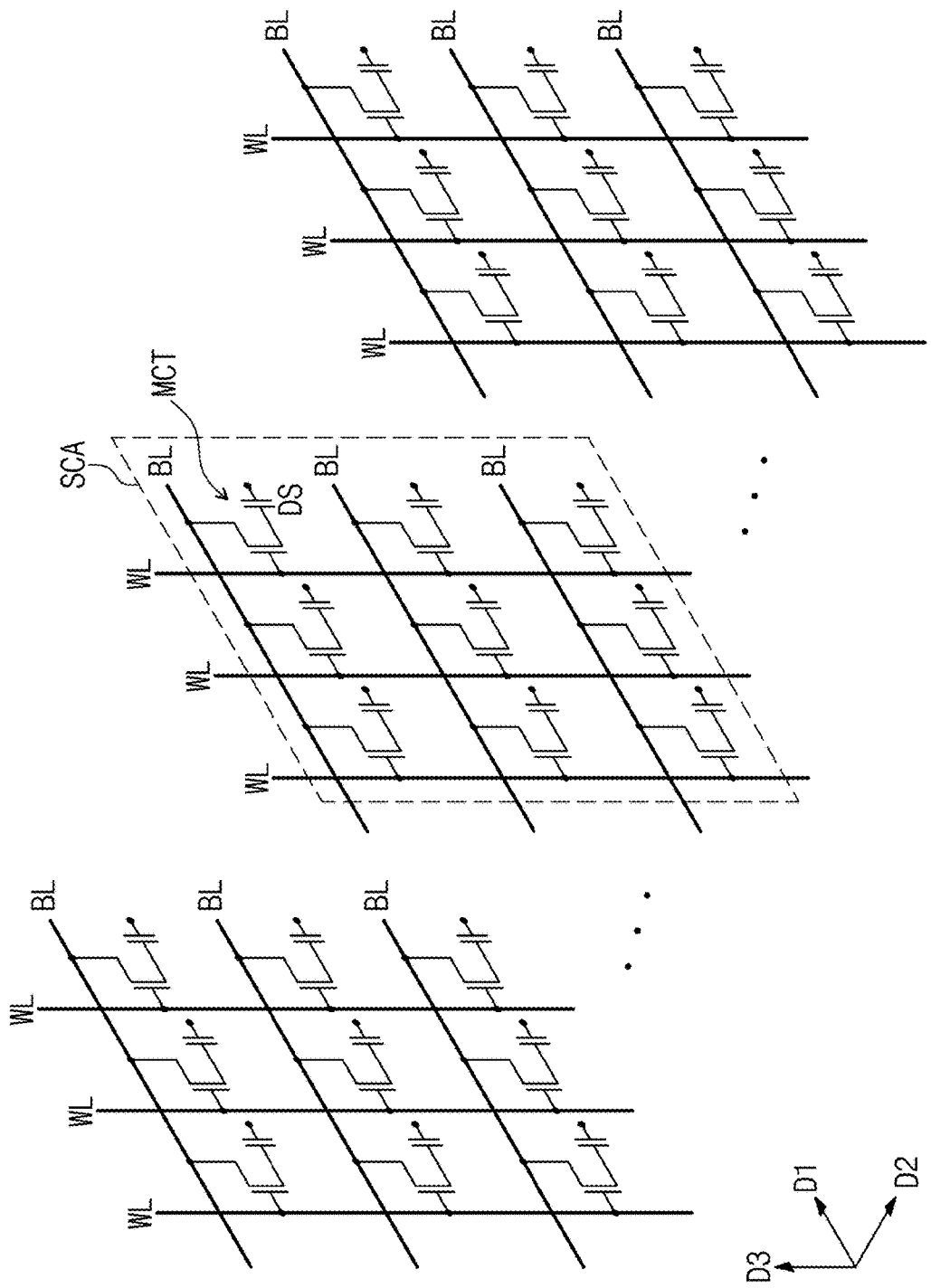
FIG. 1 illustrates a simplified circuit diagram showing a cell array of a three-dimensional semiconductor memory device according to some example embodiments of inventive concepts.

FIG. 1 illustrates a simplified circuit diagram showing a cell array of a three-dimensional semiconductor memory device according to some example embodiments of inventive concepts.

Referring to FIG. 1, a three-dimensional semiconductor memory device according to some example embodiments of inventive concepts may include a cell array consisting of or including a plurality of sub-cell arrays SCA. The sub-cell arrays SCA may be arranged along a second direction D2.

Each of the sub-cell arrays SCA may include a plurality of bit lines BL, a plurality of word lines WL, and a plurality of memory cell transistors MCT. The bit lines may correspond to columns, and the word lines may correspond to rows. One memory cell transistor MCT may be disposed between one word line WL and one bit line BL.

The bit lines BL may be or include conductive patterns (e.g., metal and/or doped polysilicon lines) that are spaced apart from and disposed on a substrate. The bit lines BL may extend in a first direction D1. The bit lines BL in one sub-cell array SCA may be spaced apart from each other in a vertical direction (e.g., a third direction D3).

The word lines WL may be or include conductive patterns (e.g., metal lines and/or doped polysilicon lines) that extend in a direction (e.g., the third direction D3) perpendicular to the substrate. The word lines WL in one sub-cell array SCA may be spaced apart from each other in the first direction D1.

A gate of the memory cell transistor MCT may be connected to the word line WL, and a source of the memory cell transistor MCT may be connected to the bit line BL. Each of the memory cell transistors MCT may include a data storage element DS. For example, the data storage element DS may be or include a capacitor, and a drain of the memory cell transistor MCT may be connected to the capacitor. The data storage element DS may correspond to a volatile storage element, and may be repeatedly refreshed. The data storage element DS may correspond to an element of a dynamic random access memory. However, inventive concepts are not limited thereto. For example, the data storage element DS may be or include a memristor, and a drain of the memory cell transistor MCT may be connected to the memristor.

Figure 2A:
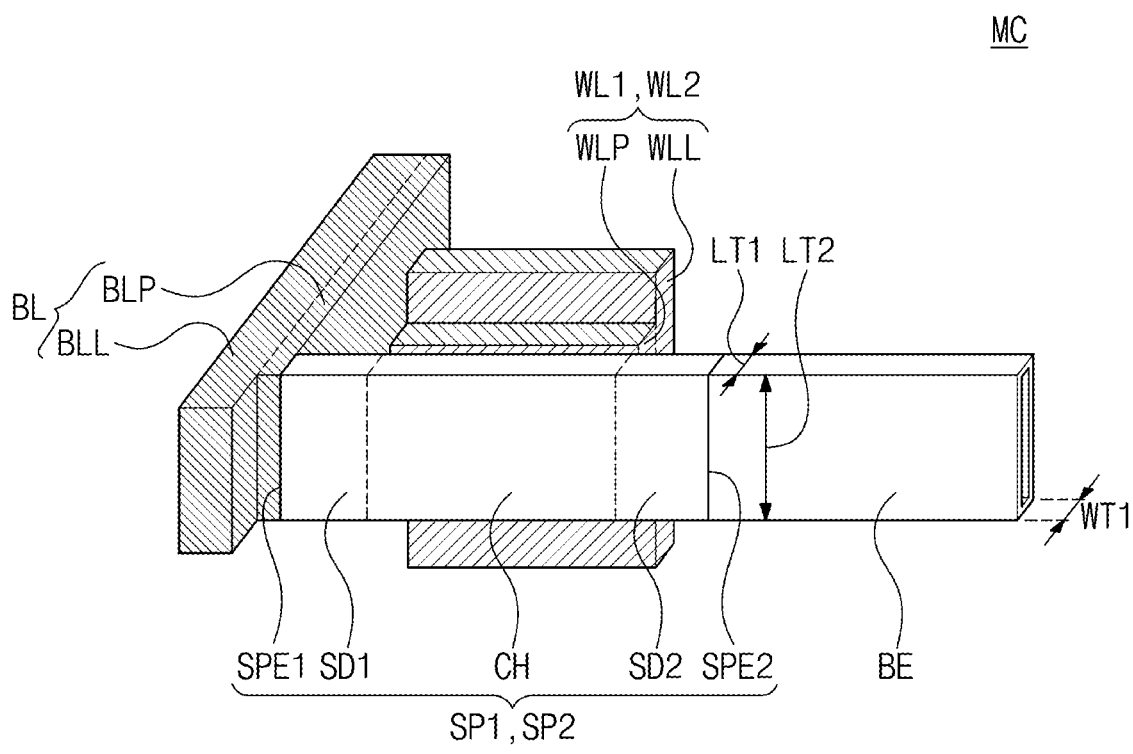
FIG. 2A illustrates a perspective view showing a unit memory cell of a three-dimensional semiconductor memory device according to some example embodiments of inventive concepts.

FIG. 2A illustrates a perspective view showing a unit memory cell of a three-dimensional semiconductor memory device according to some example embodiments of inventive concepts.

Referring to FIG. 2A, a three-dimensional semiconductor memory device according to some example embodiments of inventive concepts may include a unit memory cell MC that consists of or includes a semiconductor pattern SP1 or SP2, a bit line BL, a word line WL1 or WL2, and a first electrode BE. The word line WL1 or WL2 may correspond to a gate of the memory cell transistor MCT discussed above with reference to FIG. 1. The bit line BL and the word line WL1 or WL2 may include a conductive material. For example, the conductive material may include one or more of a doped semiconductor material (doped silicon, doped germanium, etc.), a conductive metal nitride material (titanium nitride, tantalum nitride, etc.), a metallic material (tungsten, titanium, tantalum, etc.), and a metal-semiconductor compound (tungsten silicide, cobalt silicide, titanium silicide, etc.).

The bit line BL may have a linear shape extending in a first direction D1. Either or both of the semiconductor patterns SP1 or SP2 may have a bar shape elongated in a second direction D2 intersecting the first direction D1. The word line WL1 or WL2 may have a linear shape extending in a third direction D3 intersecting the first and second directions D1 and D2.

Either or both of the semiconductor patterns SP1 or SP2 may include a semiconductor material. For example, the semiconductor material may include silicon, germanium, silicon-germanium, and/or indium gallium zinc oxide (IGZO). Either or both of the semiconductor patterns SP1 or SP2 may include a first end SPE1 and a second end SPE2 that face each other. Either or both of the semiconductor patterns SP1 or SP2 may have therein a first source/drain region SD1 adjacent to the first end SPE1 and a second source/drain region SD2 adjacent to the second end SPE2. The first and second source/drain regions SD1 and SD2 may be doped with the same conductivity type impurity. For example, the first and second source/drain regions SD1 and SD2 may both be doped with phosphorus, and/or the first and second source/drain regions SD1 and SD2 may both be doped with arsenic, and/or the first and second source/drain regions SD1 and SD2 may both be doped with boron. A concentration of dopants of a first conductivity type in the first source/drain region may be the same as a concentration of dopants of the first conductivity type in the second source/drain region SD2.

The semiconductor patterns SP1 and SP2 may have therein a channel region CH between the first source/drain region SD1 and the second source/drain region SD2. The channel region CH may correspond to a channel of the memory cell transistor MCT discussed above with reference to FIG. 1. The first and second source/drain regions SD1 and SD2 may respectively correspond to source and drain of the memory cell transistor MCT discussed above with reference to FIG. 1. Either or both of the semiconductor patterns SP1 or SP2 may have a first length LT1 parallel to the first direction D1 and a second length LT2 parallel to the third direction D3. For example, the second length LT2 may be greater than the first length LT1.

The bit line BL may contact the first end SPE1 of either or both of the semiconductor patterns SP1 or SP2. The bit line BL may include a bit line part BLL that extends in the first direction D1 and a bit line protrusion BLP that protrudes from the bit line part BLL toward the first end SPE1 of either or both of the semiconductor patterns SP1 or SP2. The bit line BL may be located at the same level as that of either or both of the semiconductor patterns SP1 or SP2. The bit line BL may have a bottom surface coplanar with that of either or both of the semiconductor patterns SP1 or SP2. The bit line BL may have a top surface coplanar with that of either or both of the semiconductor patterns SP1 or SP2.

The word line WL1 or WL2 may include a word line part WLL that extends in the third direction D3 and a word line protrusion WLP that protrudes from the word line part WLL toward either or both of the semiconductor patterns SP1 or SP2. The word line WL1 or WL2 may be adjacent to the channel region CH of either or both of the semiconductor patterns SP1 or SP2. The unit memory cell MC of the semiconductor memory device according to some example embodiments may have a single gate transistor structure in which one gate is adjacent to one channel region CH.

The first electrode BE may contact the second end SPE2 of either or both of the semiconductor patterns SP1 or SP2. The first electrode BE may have a hollow cylindrical shape, or a hollow parallelepiped shape. The first electrode BE may have a hollow shape having an ellipse in cross-section. The first electrode BE may constitute, or be included in, a portion of a capacitor. The first electrode BE may have a top surface at the same height (or level) as that of either or both of the semiconductor patterns SP1 or SP2 located at the same height as that of the first electrode BE. The first electrode BE may have a bottom surface at the same height as that of either or both of the semiconductor patterns SP1 or SP2 located at the same height as that of the first electrode BE. The first electrode BE may have a first width WT1 parallel to the first direction D1. The first width WT1 may be the same as the first length LT1. The first electrode BE may be replaced with a data storage pattern different therefrom. For example, the data storage pattern may be a phase change material pattern, a magnetic tunnel junction (MTJ) pattern, or a variable resistance pattern. A three-dimensional semiconductor memory device according to inventive concepts may have a homogenous collection of data storage patterns, e.g. all the data storage patterns may be of the same structure, or the three-dimensional semiconductor device may have a heterogeneous collection of data storage patterns, e.g. some of the data storage patterns may be different than others. For example, some data storage patterns may correspond to a phase change material, and some other data storage patterns may correspond to a capacitor; however, inventive concepts are not limited thereto.

Figure 2B:
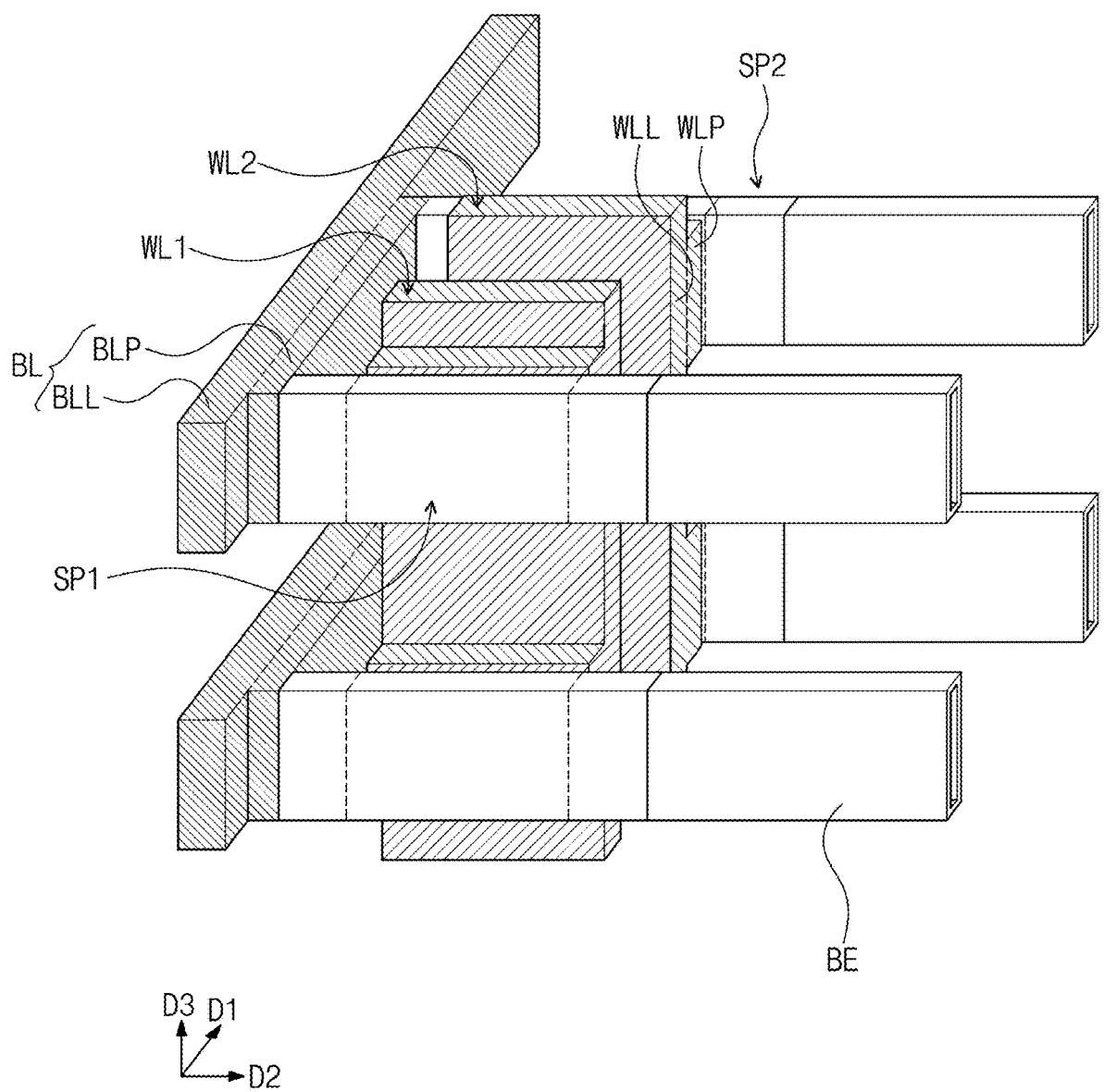
FIG. 2B illustrates a perspective view showing memory cells of a three-dimensional semiconductor memory device according to some example embodiments of inventive concepts.

FIG. 2B illustrates a perspective view showing memory cells of a three-dimensional semiconductor memory device according to some example embodiments of inventive concepts.

Referring to FIG. 2B, a plurality of the unit memory cells MC of FIG. 2A may be arranged in the first, second, and third directions D1, D2, and D3 to constitute, or be included in, a multi-layered cell array or a multi-layered sub-cell array. A single bit line BL may contact neighboring first and second semiconductor patterns SP1 and SP2. A single bit line protrusion BLP of the bit line BL may simultaneously contact the first semiconductor pattern SP1 and the second semiconductor pattern SP2 that are adjacent to each other. The bit line BL may have an uneven structure at its lateral surface adjacent to the first and second semiconductor patterns SP1 and SP2.

A first word line WL1 and a second word line WL2 may be disposed between the first semiconductor pattern SP1 and the second semiconductor pattern SP2 that are adjacent to each other. The first word line WL1 may have a structure symmetrical to that of the second word line WL2. For example, the first word line WL1 and the second word line WL2 may be mirror images of one another. The first and second word lines WL1 and WL2 may include their word line protrusions WLP that protrude toward the first and second semiconductor patterns SP1 and SP2. Each of the first and second word lines WL1 and WL2 may have an uneven structure at its lateral surface adjacent to a corresponding one of the first and second semiconductor patterns SP1 and SP2.

Figure 3A:
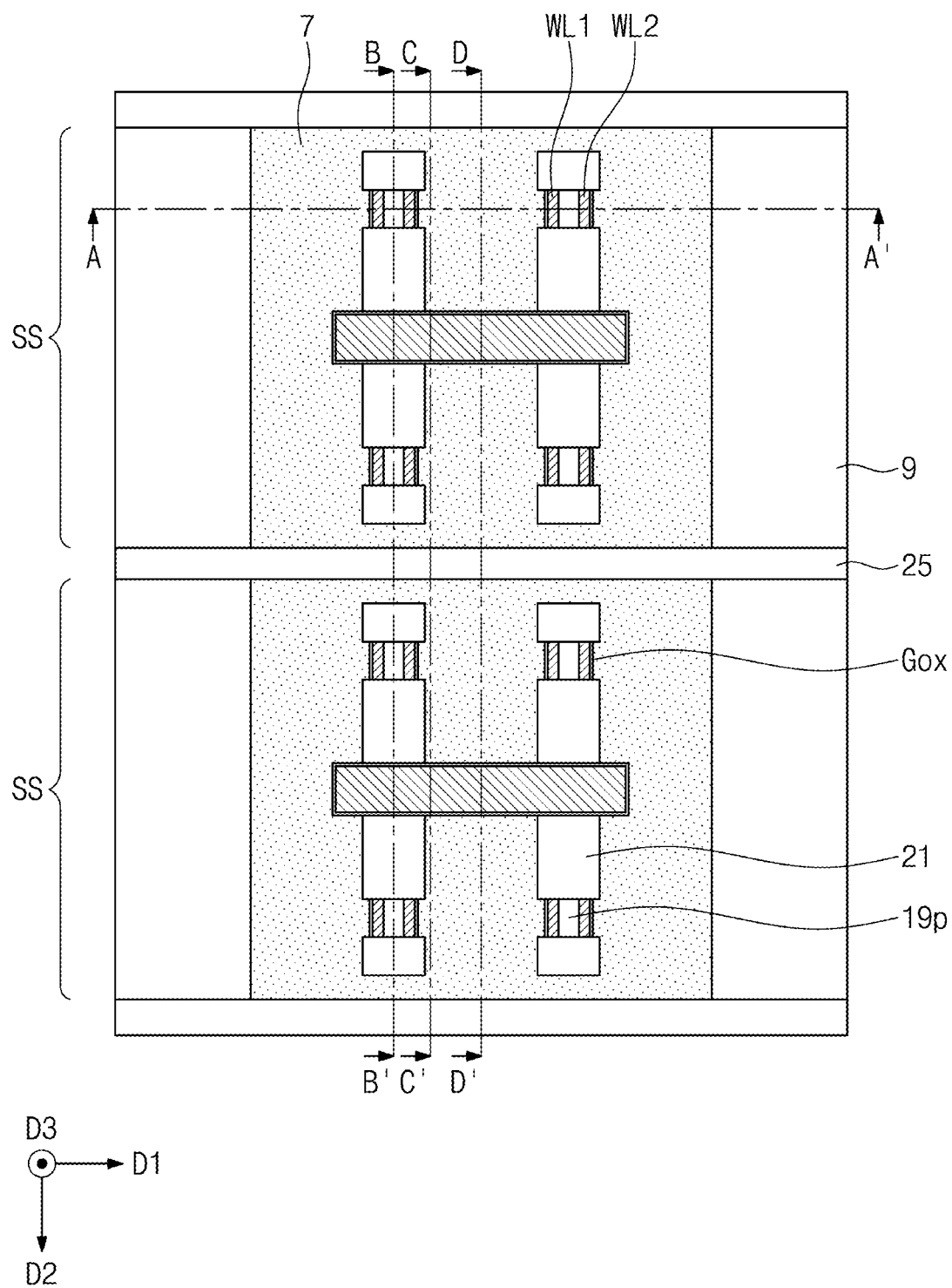
FIG. 3A illustrates a top plan view showing a three-dimensional semiconductor memory device according to some example embodiments of inventive concepts.
Figure 3B:
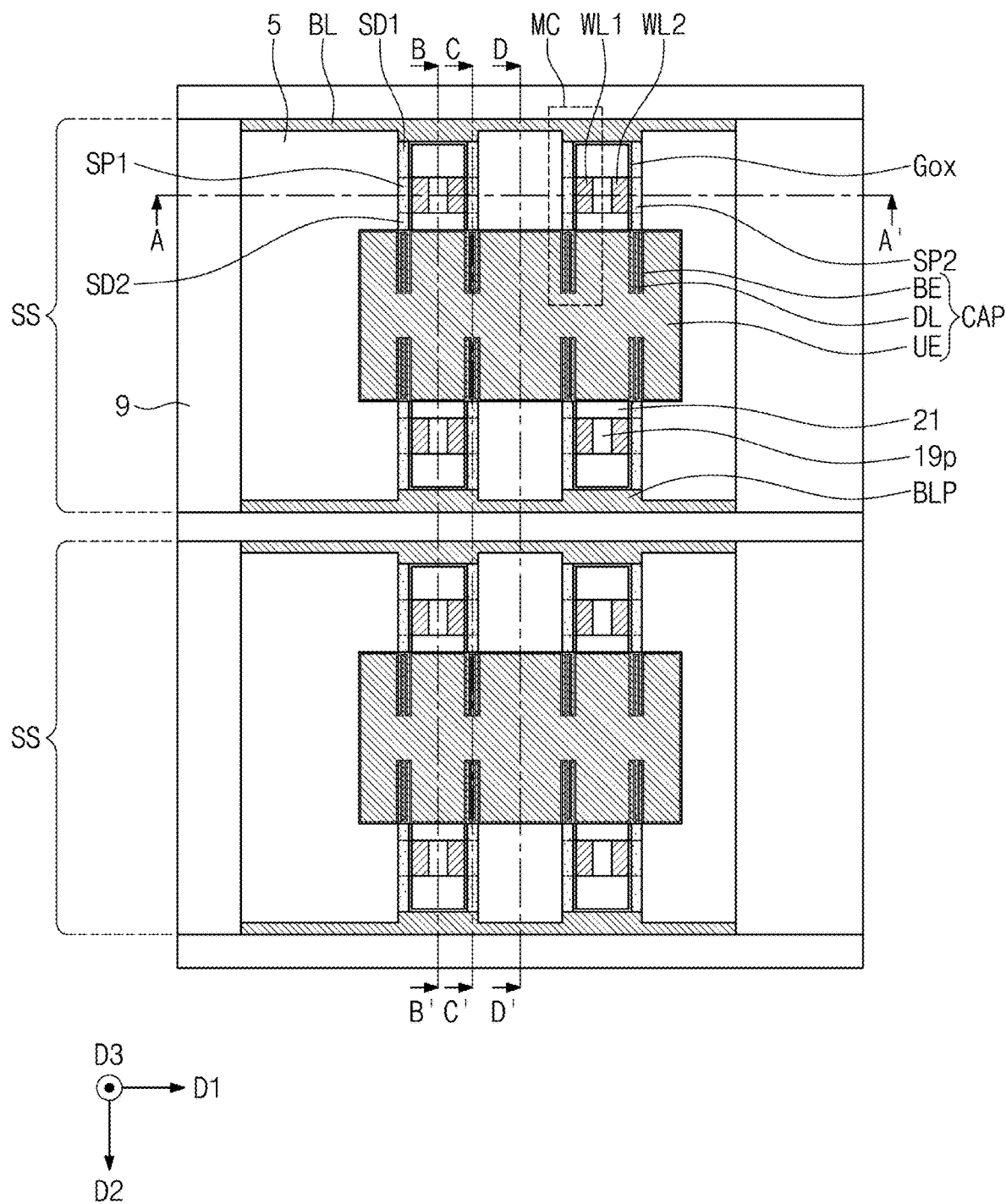
FIG. 3B illustrates a plan view at a certain level showing a three-dimensional semiconductor memory device according to some example embodiments of inventive concepts.
Figure 3C:
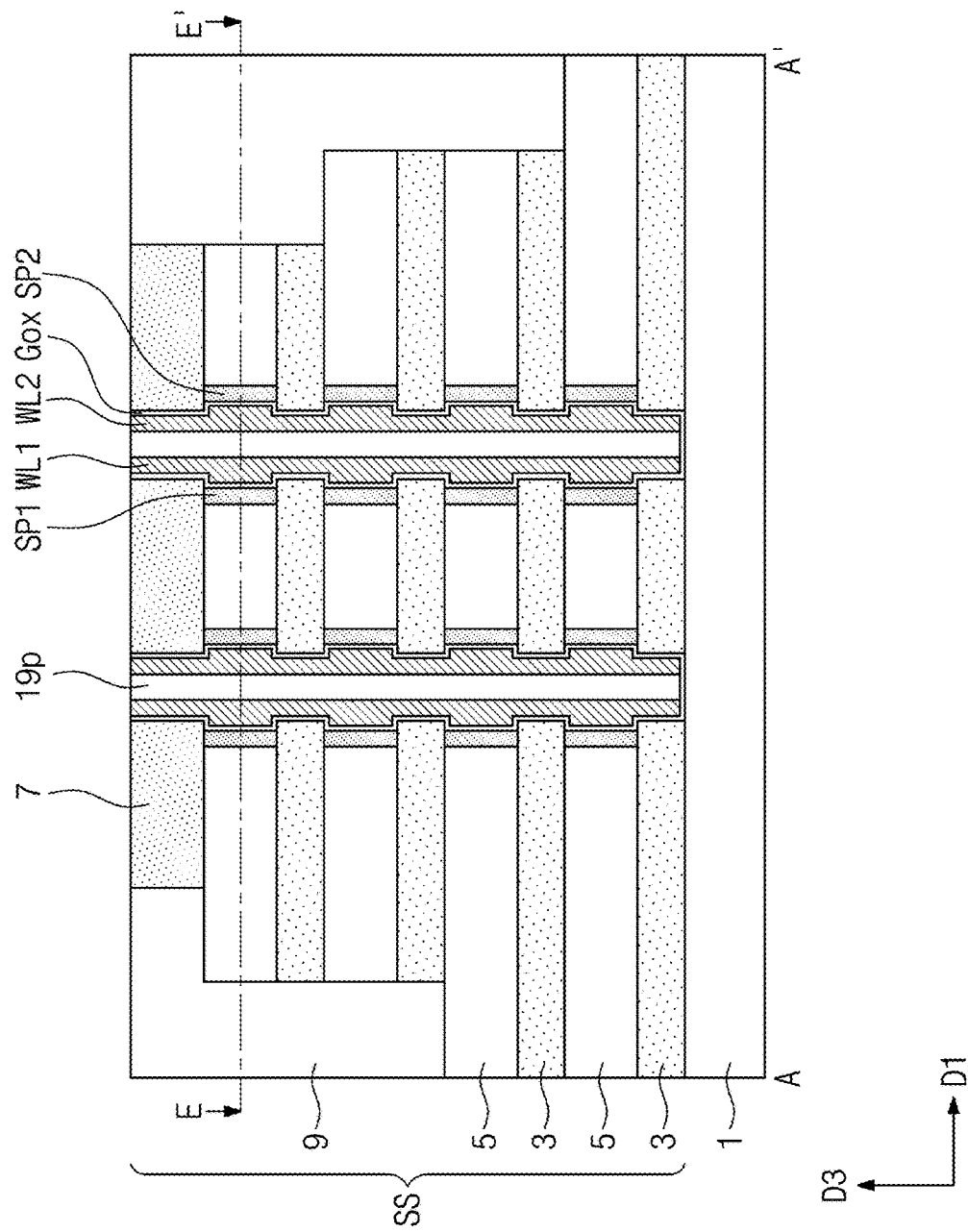
FIG. 3C illustrates a cross-sectional view taken along line A-A' of FIG. 3A or 3B.
Figure 3D:
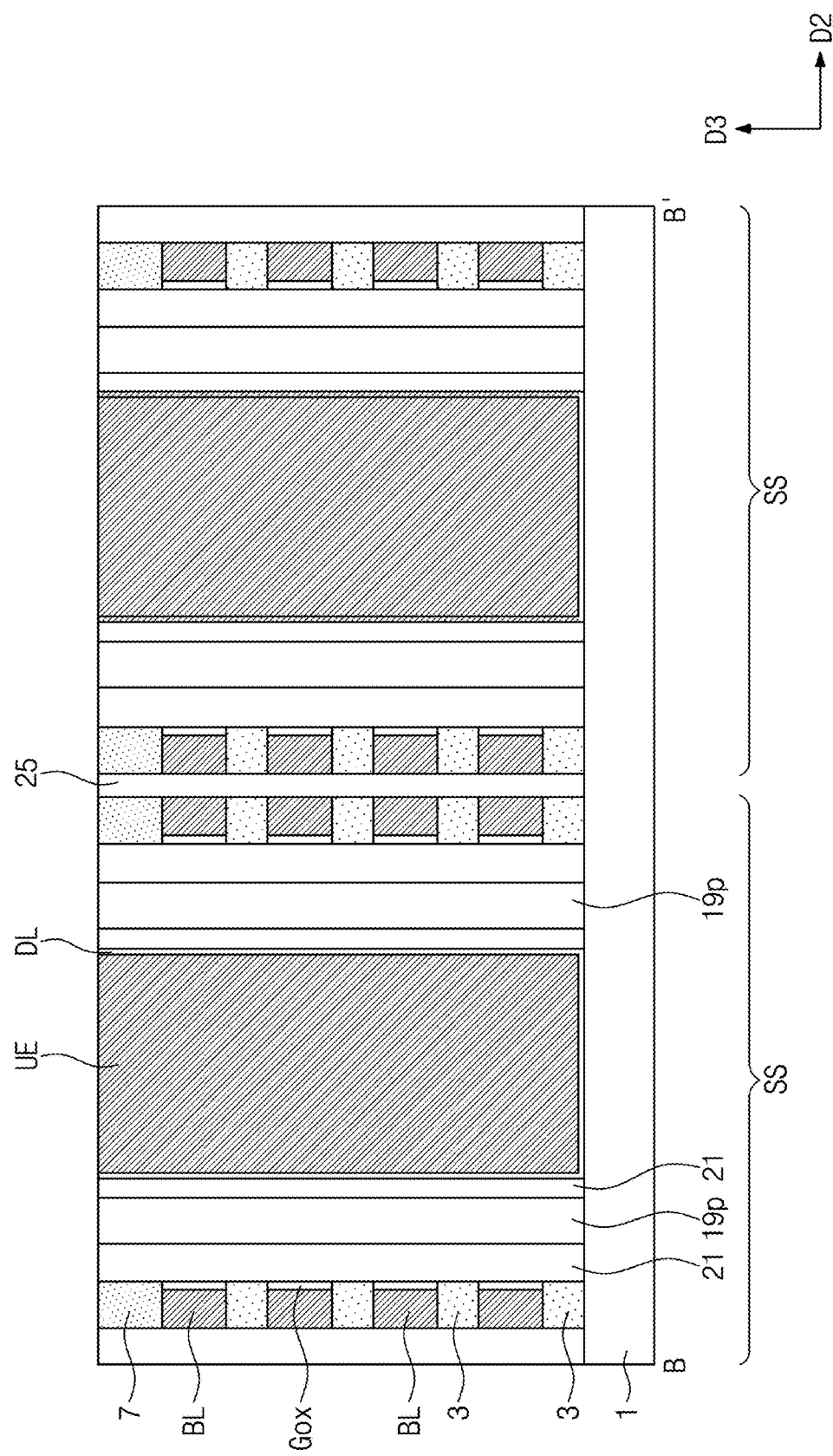
FIG. 3D illustrates a cross-sectional view taken along line B-B' of FIG. 3A or 3B.
Figure 3E:
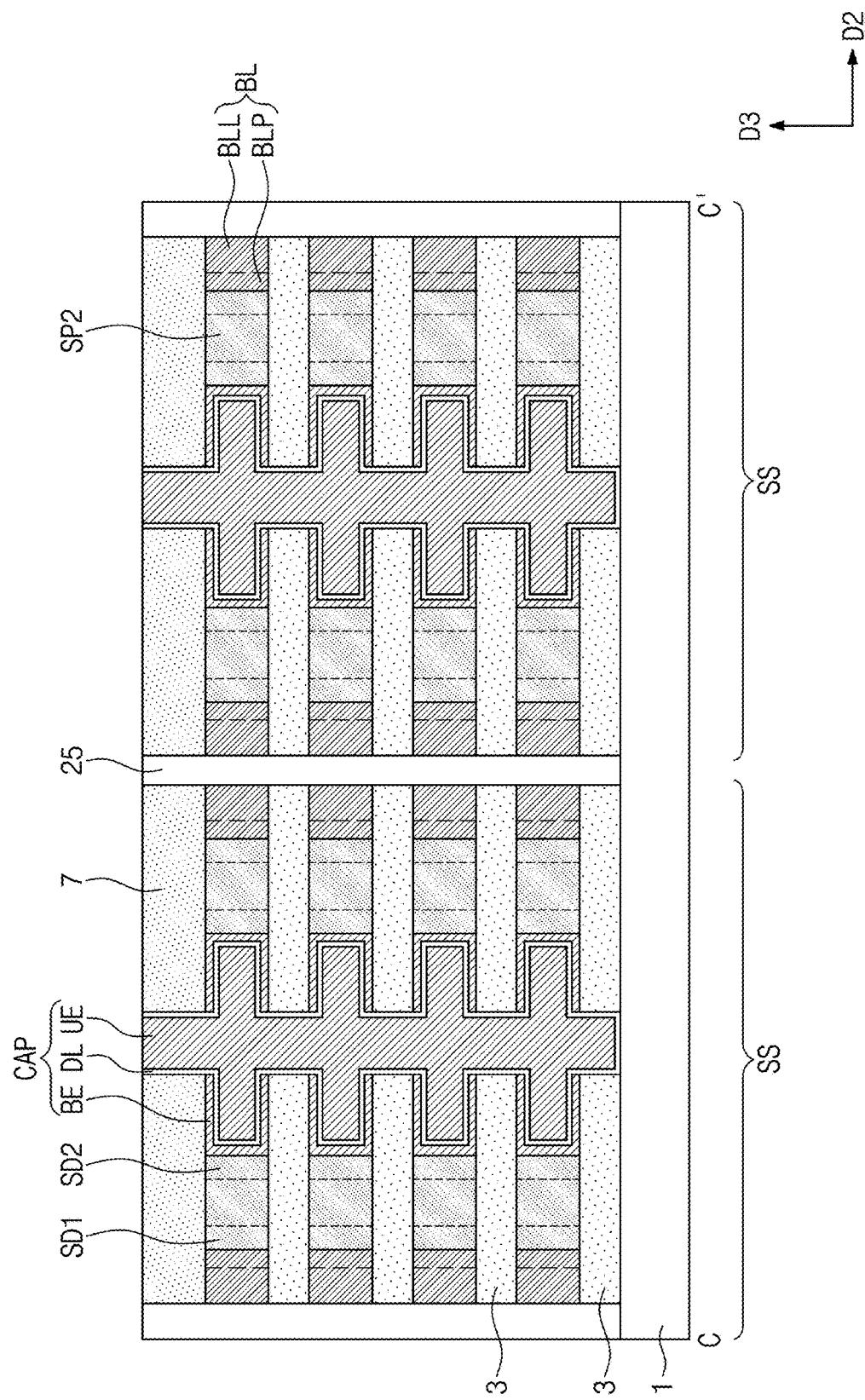
FIG. 3E illustrates a cross-sectional view taken along line C-C' of FIG. 3A or 3B.
Figure 3F:
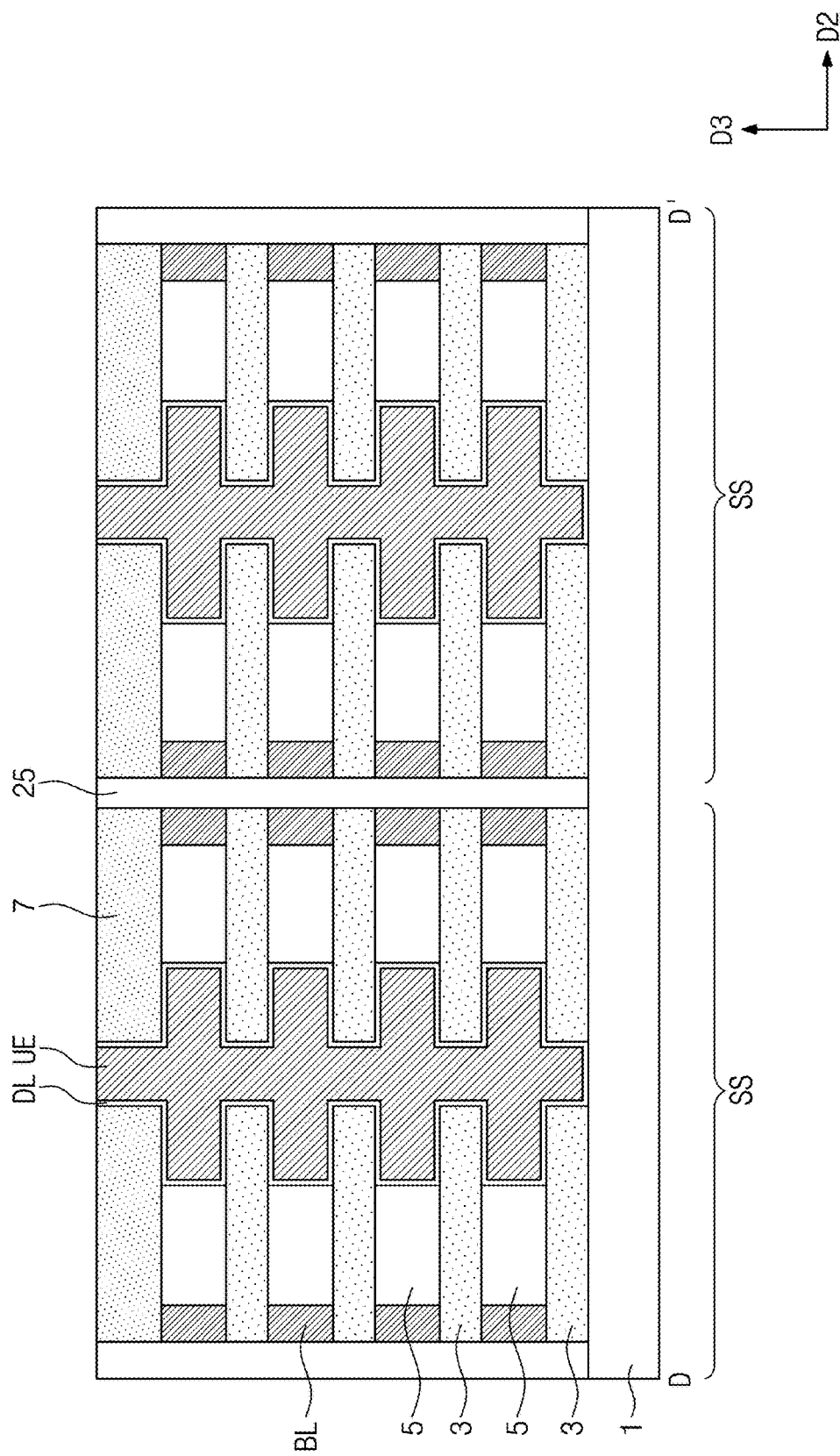
FIG. 3F illustrates a cross-sectional view taken along line D-D' of FIG. 3A or 3B.

FIG. 3A illustrates a top plan view showing a three-dimensional semiconductor memory device according to some example embodiments of inventive concepts. FIG. 3B illustrates a plan view at a certain level showing a three-dimensional semiconductor memory device according to some example embodiments of inventive concepts. For example, FIG. 3B corresponds to a slice of FIG. 3A at a certain thickness along D3. FIG. 3C illustrates a cross-sectional view taken along line A-A' of FIG. 3A or 3B. FIG. 3B may correspond to a plan view taken along line E-E' of FIG. 3C. FIG. 3D illustrates a cross-sectional view taken along line B-B' of FIG. 3A or 3B. FIG. 3E illustrates a cross-sectional view taken along line C-C' of FIG. 3A or 3B. FIG. 3F illustrates a cross-sectional view taken along line D-D' of FIG. 3A or 3B.

Referring to FIGS. 3A to 3F, a substrate 1 may be provided thereon with stack structures SS spaced apart from each other. The substrate 1 may include a semiconductor material. For example, the substrate 1 may be a single crystalline silicon substrate and/or a silicon-on-insulator (SOI) substrate. The stack structures SS may have, e.g. may each have, the same structure, and a separation dielectric pattern 25 may separate the stack structures SS from each other. The separation dielectric pattern 25 may include one or more of a silicon oxide layer, a silicon nitride layer, and a silicon oxynitride layer. When viewed in plan view, the separation dielectric pattern 25 may have a linear shape extending in a first direction D1. Each of the stack structures SS may constitute, or be included in, a sub-cell array. The stack structures SS may be arranged along a second direction D2.

Referring to FIGS. 3C and 3F, first interlayer dielectric patterns 3 and second interlayer dielectric patterns 5 may be alternately stacked on the substrate 1 of each stack structure SS. The first interlayer dielectric patterns 3 may include a dielectric material having an etch selectivity with respect to the second interlayer dielectric patterns 5. For example, the first interlayer dielectric patterns 3 may include a silicon oxide layer, and the second interlayer dielectric patterns 5 may include a silicon nitride layer. Alternatively, the first interlayer dielectric patterns 3 may include a silicon nitride layer, and the second interlayer dielectric patterns 5 may include a silicon oxide layer. The first interlayer dielectric patterns 3 may not include a silicon nitride layer, and the second interlayer dielectric patterns 5 may not include a silicon oxide layer. The etch selectivity may be or correspond to an isotropic etch selectivity from a wet etch process. The wet etch process may include a wet chemical such as, but not limited to be, at least one of buffered hydrogen fluoride or phosphoric acid. The interlayer dielectric patterns 3 or 5 including silicon oxide may have a higher etch rate in the presence of buffered hydrogen fluoride than the interlayer dielectric patterns 3 or 5 including silicon nitride; similarly, the interlayer dielectric patterns 3 or 5 including silicon nitride may have a higher etch rate in the presence of phosphoric acid than the interlayer dielectric patterns 3 or 5 including silicon oxide. The first interlayer dielectric patterns 3 may not include a silicon oxide layer, and the second interlayer dielectric patterns 5 may not include a silicon nitride layer. The first interlayer dielectric patterns 3 and/or the second interlayer dielectric patterns 5 may be formed with a chemical vapor deposition (CVD) process; however, inventive concepts are not limited thereto. The first interlayer dielectric patterns 3 and the second interlayer dielectric patterns may be formed at the same time, or, alternatively, may be formed at different times.

As shown in FIG. 3C, the first and second interlayer dielectric patterns 3 and 5 may have a stepwise shape at ends thereof. A third interlayer dielectric pattern 7 may be disposed on an uppermost one of the second interlayer dielectric patterns 5. The third interlayer dielectric pattern 7 may include a dielectric material having an etch selectivity with respect to the second interlayer dielectric patterns 5. For example, the third interlayer dielectric pattern 7 may include a silicon oxynitride layer. The third interlayer dielectric pattern 7 may not include either or both of a silicon oxide layer and a silicon nitride layer. The third interlayer dielectric pattern 7 may be formed at the same time as the formation of the first interlayer dielectric patterns 3 and the second interlayer dielectric patterns 5; however, inventive concepts are not limited thereto. For example, a CVD process may include placing the substrate 1 into a CVD chamber, alternatively forming the interlayer dielectric patterns 3 and the interlayer dielectric patterns 5, and forming the third interlayer dielectric pattern 7. The ends of the first and second interlayer dielectric patterns 3 and 5 may be covered with a fourth interlayer dielectric pattern 9. The fourth interlayer dielectric pattern 9 may include a dielectric material having an etch selectivity with respect to at least the second interlayer dielectric patterns 5. The further fourth interlayer dielectric pattern 9 may be formed at a different process than the formation of either or any of the first interlayer dielectric patterns 3, the second interlayer dielectric patterns 5, or the third interlayer dielectric pattern 7. Furthermore, although FIG. 3C illustrates four first interlayer dielectric patterns 3 and four second interlayer dielectric patterns 5, inventive concepts are not limited thereto. For example, there may be more or fewer interlayer dielectric patterns 3 and interlayer dielectric patterns 5 than illustrated in FIG. 3C. Furthermore, although FIG. 3C illustrates that a step in the interlayer dielectric patterns 3 and interlayer dielectric patterns 5 is asymmetric, e.g. asymmetric between the right side of FIG. 3C and the left side of FIG. 3C, inventive concepts are not limited thereto, and the step may be symmetric between the right side and the left side. Furthermore, although FIG. 3C illustrates that a thickness of the interlayer dielectric patterns 3 is less than a thickness of the interlayer dielectric patterns 5, inventive concepts are not limited thereto, and a thickness of the interlayer dielectric patterns 3 may be the same as, or thicker than, a thickness of the interlayer dielectric patterns 5.

Referring to FIG. 3C, word lines WL1 and WL2 may penetrate the third interlayer dielectric pattern 7, the second interlayer dielectric patterns 5, and the first interlayer dielectric patterns 3, and may be perpendicular to a top surface of the substrate 1. The word lines WL1 and WL2 may include a conductive material. For example, the word lines WL1 and WL2 may include at least one of a metal or doped polysilicon. The word lines WL1 and WL2 may include a first word line WL1 and a second word line WL2 that neighbor each other in the first direction D1. The first word line WL1 may have a shape symmetrical to that of the second word line WL2. For example, the first word line WL1 may be a mirror image of the second word line WL2. The first direction D1 may be parallel to the top surface of the substrate 1. The first word line WL1 and the second word line WL2 may be formed with a CVD process; however, inventive concepts are not limited thereto.

As shown in FIG. 3C, a first semiconductor pattern SP1 may be interposed between the first word line WL1 and each of the second interlayer dielectric patterns 5. A second semiconductor pattern SP2 may be interposed between the second word line WL2 and each of the second interlayer dielectric patterns 5. There may be provided a pair of first and second semiconductor patterns SP1 and SP2 that neighbor each other in the first direction D1 at the same height, e.g. at the same level. A plurality of pairs of semiconductor patterns SP1 and SP2 may be disposed to constitute, or be included in, a multi-layered array. Only the first interlayer dielectric pattern 3 may be present between the semiconductor patterns SP1 and SP2 that are stacked. The first and second semiconductor patterns SP1 and SP2 may contact, e.g. directly contact, the second interlayer dielectric patterns 5 adjacent thereto. Sidewalls of the second interlayer dielectric patterns 5 adjacent to the first and second semiconductor patterns SP1 and SP2 may be spaced apart from sidewalls of the first interlayer dielectric patterns 3. The first interlayer dielectric patterns 3 may protrude more toward the word lines WL1 and WL2 than the second interlayer dielectric patterns 5 protrudes toward the word lines WL1 and WL2. The first and second semiconductor patterns SP1 and SP2 may have their sidewalls spaced apart from the sidewalls of the first interlayer dielectric patterns 3. The first interlayer dielectric patterns 3 may protrude more toward the word lines WL1 and WL2 than the first and second semiconductor patterns SP1 and SP2.

Referring still to FIG. 3C, a gate dielectric layer Gox may be interposed between the word lines WL1 and WL2 and the semiconductor patterns SP1 and SP2. The gate dielectric layer Gox may include a high-k dielectric layer, a silicon oxide layer, a silicon nitride layer, a silicon oxynitride layer, or a combination thereof. The high-k dielectric layer may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate. The gate dielectric layer Gox may be formed with a CVD process such as a plasma enhanced CVD (PECVD) process and/or a low pressure CVD (LPCVD) process; however, inventive concepts are not limited thereto. The gate dielectric layer Gox may have a cross-section having an uneven structure. The gate dielectric layer Gox may also be interposed between the substrate 1 and the word lines WL1 and WL2. A first buried dielectric pattern 19$p$ may be interposed between the word lines WL1 and WL2 neighboring each other.

Referring to FIGS. 3B and 3E, bit lines BL may be disposed between the first interlayer dielectric patterns 3. The bit lines BL may contact corresponding first source/drain regions SD1 of the first and second semiconductor patterns SP1 and SP2. The bit lines BL may have their uneven structures at their lateral surfaces adjacent to the first and second semiconductor patterns SP1 and SP2. A capacitor CAP may contact second source/drain regions SD2 of the first and second semiconductor patterns SP1 and SP2. The capacitor CAP may include a first electrode BE, a dielectric layer DL, and a second electrode UE. The first electrode BE may have a hollow cylindrical shape and/or a hollow shape having an oval or elliptical cross-section.

The dielectric layer DL may cover, e.g. conformally cover, surfaces of a plurality of first electrodes BE. The second electrode UE may be adjacent to the plurality of first electrodes BE. The second electrode UE may fill insides of the first electrodes BE. Each of the first and second electrodes BE and UE may include a conductive material. The conductive material may be one of a doped semiconductor material (such as doped single-crystal silicon, doped polysilicon, doped germanium, etc.), a conductive metal nitride material (such as titanium nitride, tantalum nitride, etc.), a metallic material (such as tungsten, titanium, tantalum, etc.), and a metal-semiconductor compound (such as tungsten silicide, cobalt silicide, titanium silicide, etc.). The dielectric layer DL may be interposed between the second electrode UE and the substrate 1. The dielectric layer DL may include one or more of metal oxide such as hafnium oxide, zirconium oxide, aluminum oxide, lanthanum oxide, tantalum oxide, and titanium oxide, and perovskite-structured dielectric such as SrTiO$_3$(STO), (Ba,Sr)TiO$_3$(BST), BaTiO$_3$, PZT, and PLZT.

Referring to FIGS. 3B and 3D, a second buried dielectric pattern 21 may be interposed between the first buried dielectric pattern 19$p$ and the bit line BL and between the first buried dielectric pattern 19$p$ and the second electrode UE. The gate dielectric layer Gox may be interposed between the bit line BL and the second buried dielectric pattern 21. The dielectric layer DL may be interposed between the second buried dielectric pattern 21 and the second electrode UE. The first and second buried dielectric patterns 19$p$ and 21 may independently include one or more of a silicon oxide layer, a silicon nitride layer, and a silicon oxynitride layer. The first and second buried dielectric patterns 19$p$ and 21 may not include the same material.

A three-dimensional semiconductor memory device according to some example embodiments of inventive concepts may be configured such that a single unit memory cell is constituted by, or corresponds to, the bit line BL and the semiconductor pattern SP1 and SP2 which are located at the same level as that of the bit line BL. In addition, only the first interlayer dielectric pattern 3 may be present between the semiconductor patterns SP1 and SP2 that are stacked. Therefore, the semiconductor memory device may decrease in overall height. Furthermore, the three-dimensional semiconductor memory device according to some example embodiments of inventive concepts may be configured such that each of the semiconductor pattern SP1 and SP2 has the first length LT1 less than the second length LT2, and that neighboring first and second semiconductor patterns SP1 and SP2 are disposed to constitute, or correspond to, a single pair, with the result that the semiconductor memory device may decrease in overall width. As a result, the semiconductor memory device may increase in integration.

The following will describe a method of fabricating the semiconductor memory device of FIGS. 3A to 3F.

FIGS. 4A, 5A, 6A, 7A, 8A, 9A, 10A, 11A, and 14A illustrate top plan views showing a method of fabricating a semiconductor memory device having the top plan view of FIG. 3A. FIGS. 4B, 5B, 6B, 7B, 8C, 9C, 10C, and 11C illustrate cross-sectional views taken along line A-A' of FIGS. 4A, 5A, 6A, 7A, 8A, 9A, 10A, and 11A, respectively. FIGS. 5C, 6C, 7C, 8D, 9D, 10D, and 11D illustrate cross-sectional views taken along line B-B' of FIGS. 5A, 6A, 7A, 8A, 9A, 10A, and 11A, respectively. FIGS. 8B, 9B, 10B, 11B, 12A, 13A, 14B, 15A, and 16A illustrate plan views at a certain level showing a method of fabricating a semiconductor memory device having the plan view of FIG. 3B. FIGS. 12B, 13C, 14C, and 15B illustrate cross-sectional views taken along line B-B' of FIGS. 12A, 13A, 14B, and 15A, respectively. FIG. 13B illustrates a cross-sectional view taken along line A-A' of FIG. 13A. FIGS. 9E, 11E, 12C, 13D, 14D, 15C, and 16B illustrate cross-sectional views taken along line C-C' of FIGS. 9B, 11B, 12A, 13A, 14B, 15B, and 16A, respectively. FIGS. 11F, 12D, 14E, and 15D illustrate cross-sectional views taken along line D-D' of FIGS. 11B, 12A, 14B, and 15A, respectively.

Figure 4A:
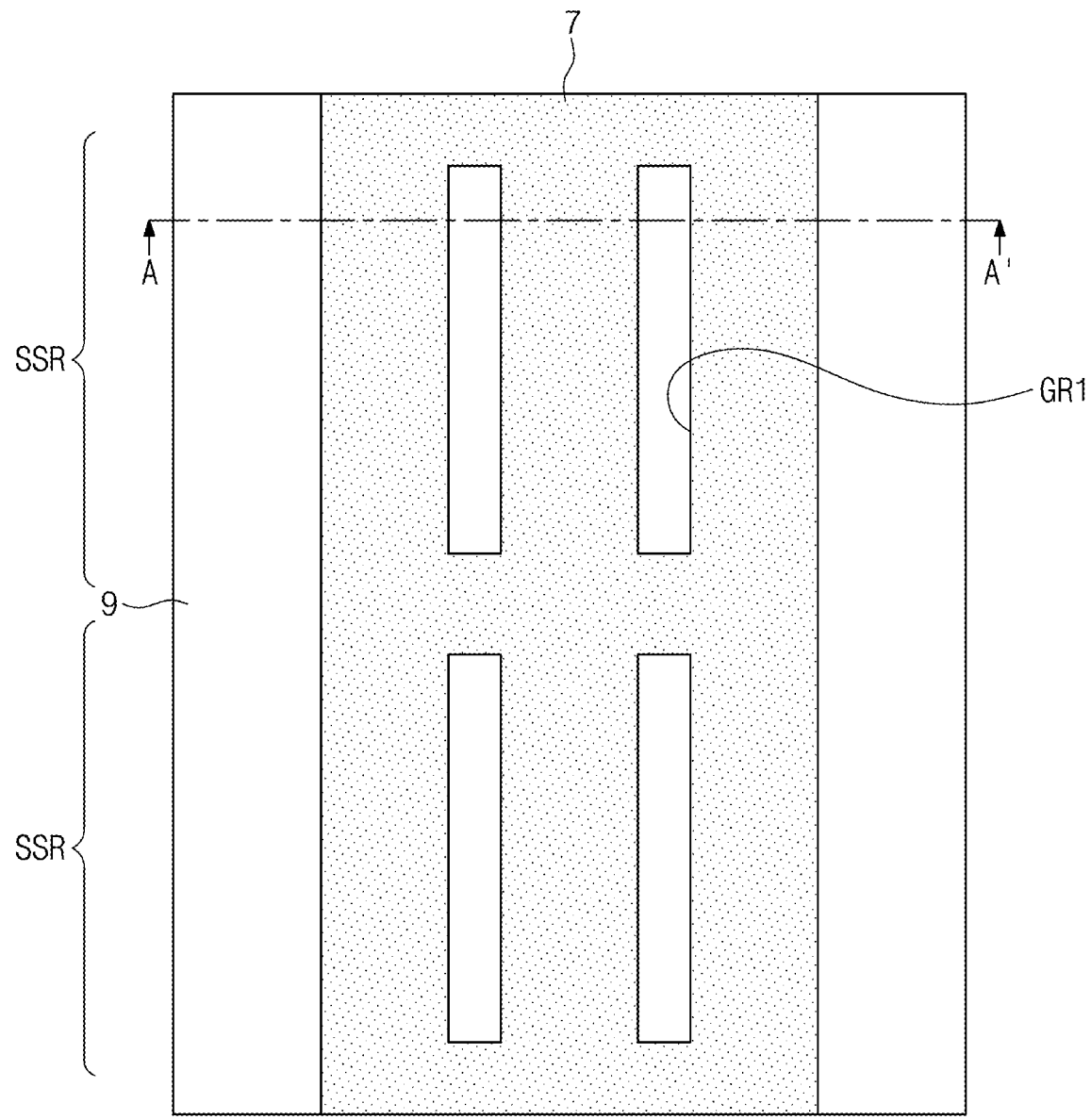
FIGS. 4A, 5A, 6A, 7A, 8A, 9A, 10A, 11A, and 14A illustrate top plan views showing a method of fabricating a semiconductor memory device having the top plan view of FIG. 3A.
Figure 4B:
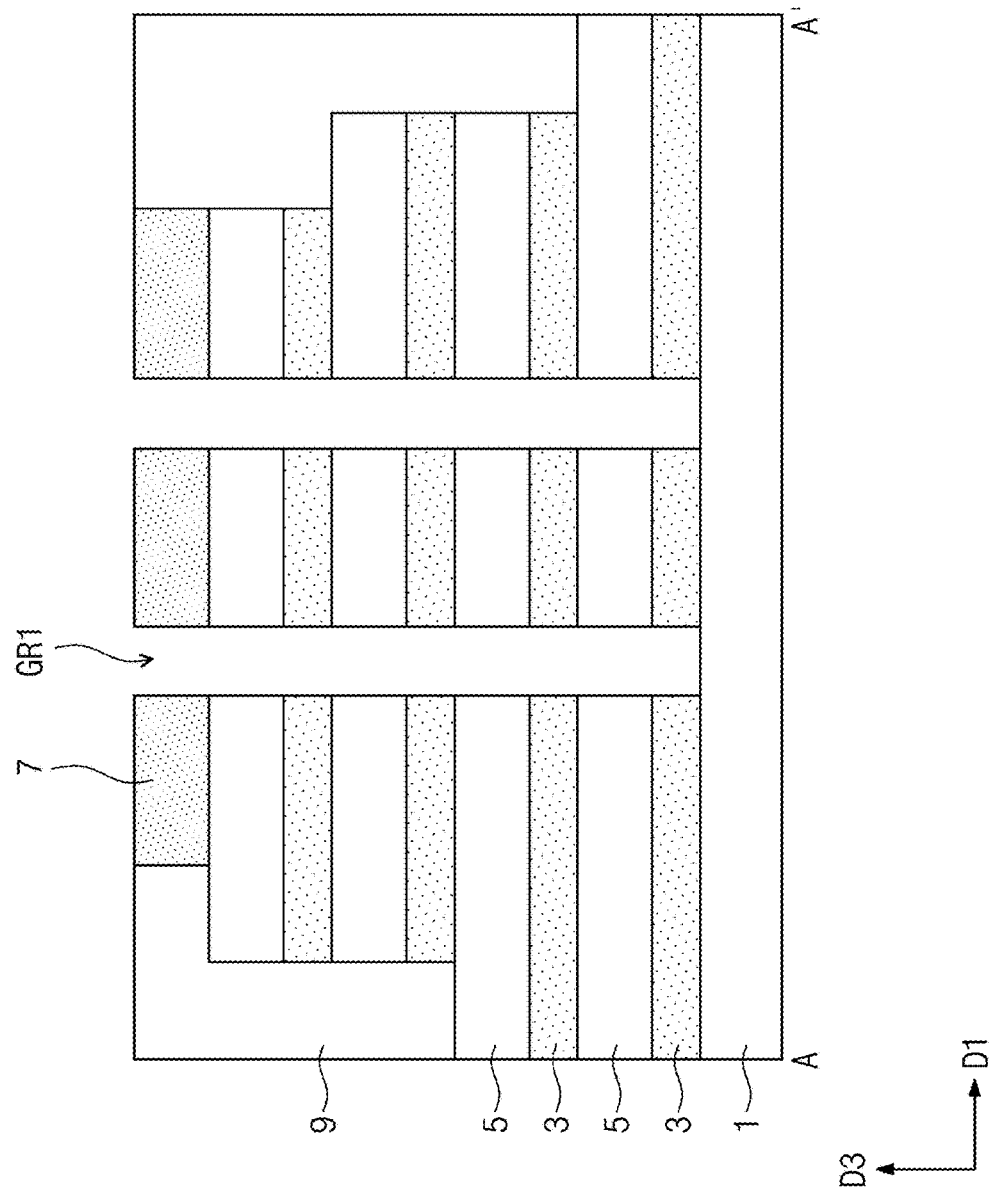

Referring to FIGS. 4A and 4B, a substrate 1 may be provided. The substrate 1 may include a plurality of stack structure regions SSR that are spaced apart from each other. First interlayer dielectric layers and second interlayer dielectric layers may be alternately stacked on the substrate 1. A third interlayer dielectric layer may be formed on an uppermost one of the second interlayer dielectric layers. The second interlayer dielectric layers may include a dielectric material having an etch selectivity with respect to the first and third interlayer dielectric layers. The first to third interlayer dielectric patterns may be formed in PECVD process, e.g. may be formed simultaneously in a PECVD process; however, inventive concepts are not limited thereto. Furthermore, although only four first interlayer dielectric layers and four second interlayer dielectric layers are illustrated, inventive concepts are not limited thereto. The first to third interlayer dielectric layers may undergo a trimming process and an etching process that are performed several times to form first, second, and third interlayer dielectric patterns 3, 5, and 7 whose ends constitute a stepwise shape, as illustrated in FIG. 4B. A number of times that the trimming process and the etching process is performed is not limited, and may be once, twice, three times, four times, or more than four times. The first, second, and third interlayer dielectric patterns 3, 5, and 7 may be etched to form a plurality of first grooves GR1 that expose the substrate 1. The first grooves GR1 may be elongated in the second direction D2. As shown in FIG. 4B, on a single stack structure region SSR, the first grooves GR1 may be spaced apart from each other in the first direction D1. Two first grooves GR1 are, by way of example, illustrated on a single stack structure region SSR, but the number of the first grooves GR1 is not limited thereto. For example, more than two first grooves GR1 may be provided. The first groove GR1 may extend to expose a surface of the substrate 1.

Figure 5A:
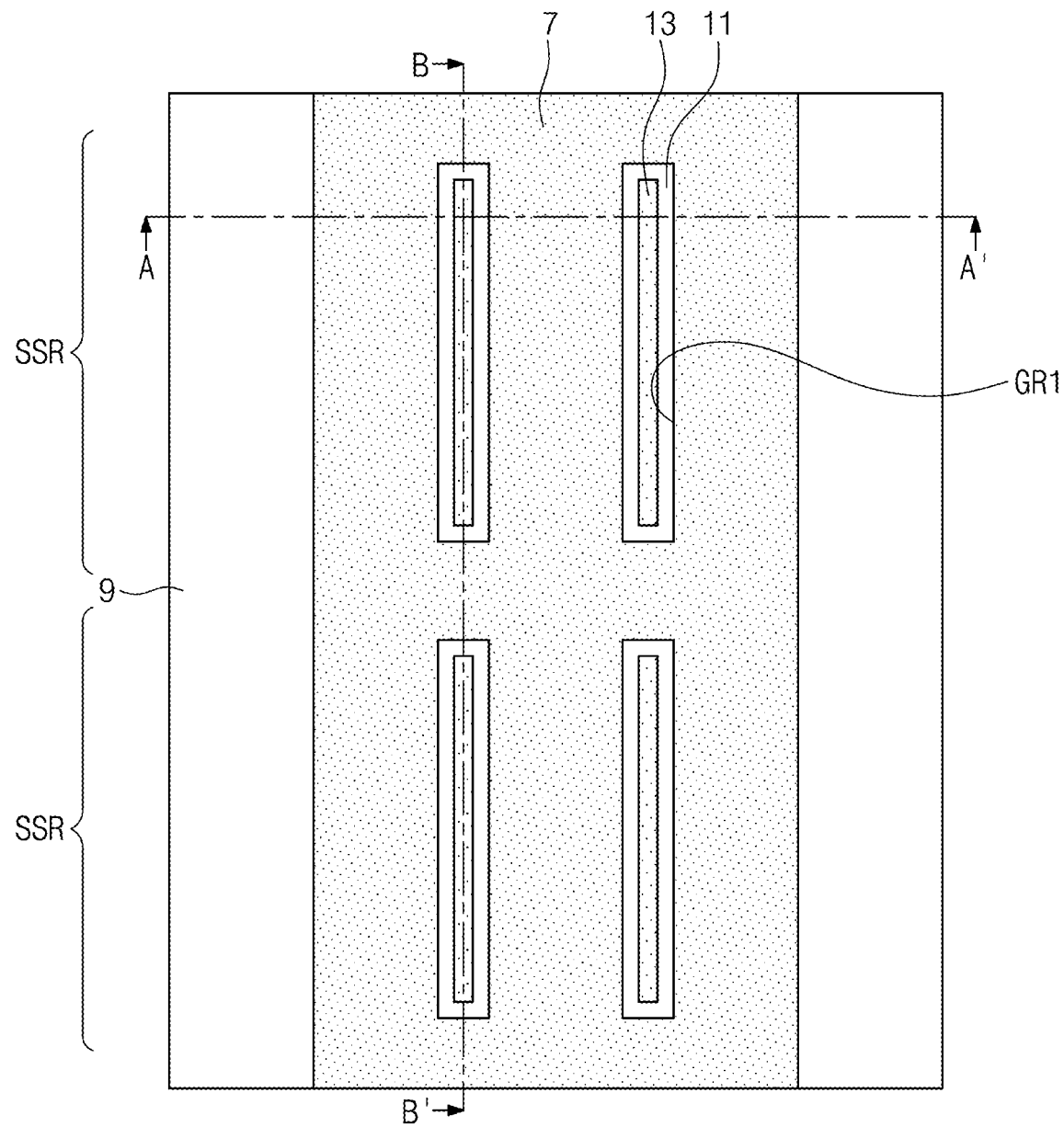

Referring to FIGS. 5A to 5C, a sacrificial space layer may be conformally formed on an entire surface of the substrate 1, and then an anisotropic etching process may be performed to form sacrificial spacers 11 covering sidewalls of the first grooves GR1 and to expose a top surface of the substrate 1 in the first groove GR1. The sacrificial spacer 11 may be formed of a material having an etch selectivity with respect to the substrate 1 and the first, second, and third interlayer dielectric patterns 3, 5, and 7. For example, the sacrificial spacer 11 may include silicon-germanium. For example, the sacrificial spacer 11 may include silicon-germanium if the substrate 1 is a silicon substrate. After the sacrificial spacers 11 are formed, a sacrificial buried layer may surround an entire surface of the substrate 1 to fill the first grooves GR1, and then a planarization etching process may be performed to form sacrificial buried patterns 13 in corresponding first grooves GR1. The planarization etching process may include a blanket etch-back process and/or a chemical mechanical planarization (CMP) process. The sacrificial buried pattern 13 may be formed of a material having an etch selectivity with respect to the sacrificial spacer 11. For example, the sacrificial buried pattern 13 may include a silicon oxide layer. The sacrificial buried pattern 13 may include a silicon oxide layer when the sacrificial spacer 11 includes a silicon nitride layer.

Figure 6A:
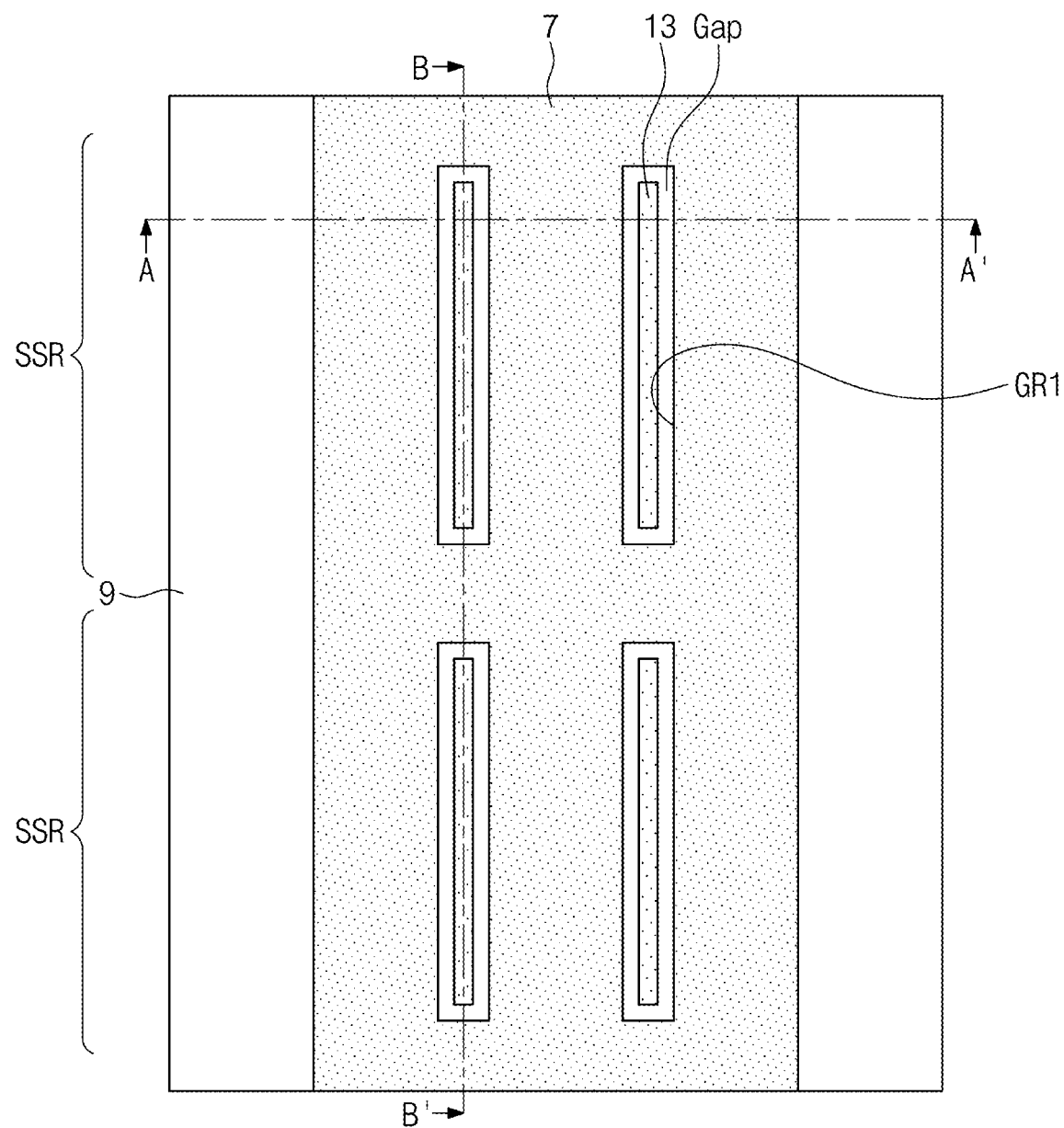
Figure 6B:
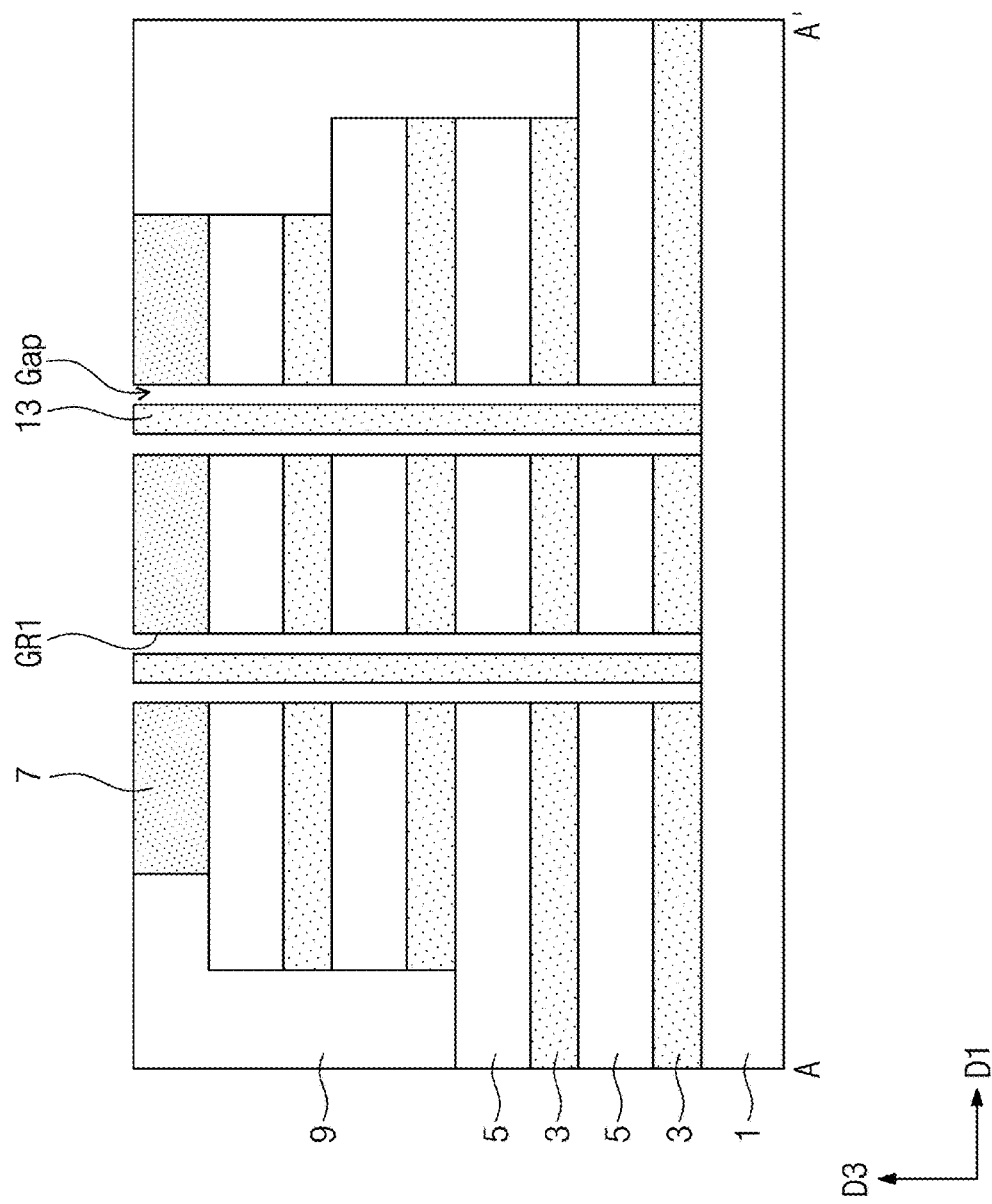
Figure 6C:
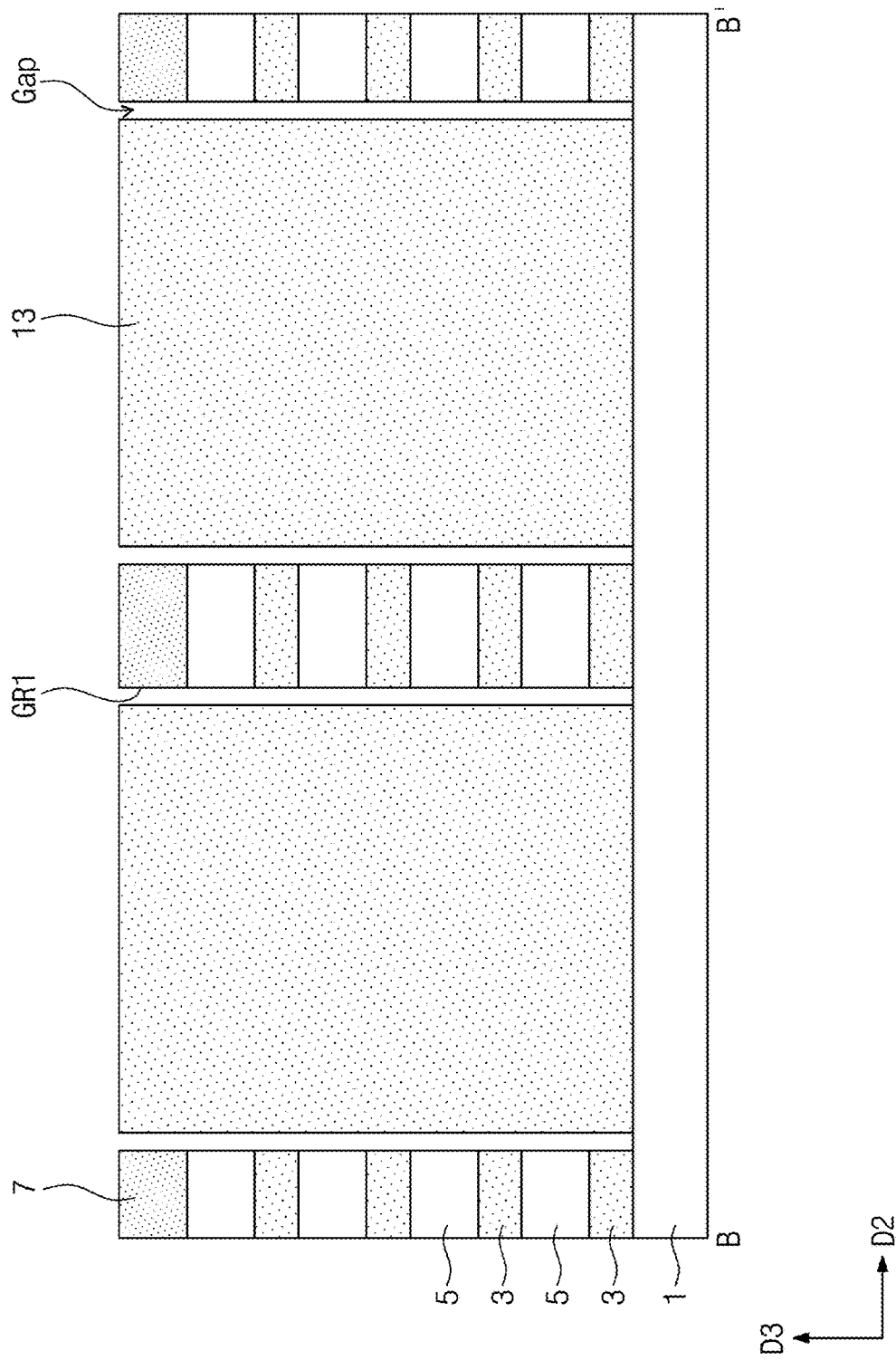

Referring to FIGS. 6A to 6C, an isotropic and/or anisotropic etching process may be performed such that the sacrificial spacers 11 may all be removed to form gap regions Gap each of which exposes sidewalls of the first and second interlayer dielectric patterns 3 and 5 and a sidewall of the sacrificial buried pattern 13. The gap region Gap may overlap the first groove GR1. The top surface of the substrate 1 may be partially or fully exposed in the gap region Gap.

Figure 7A:
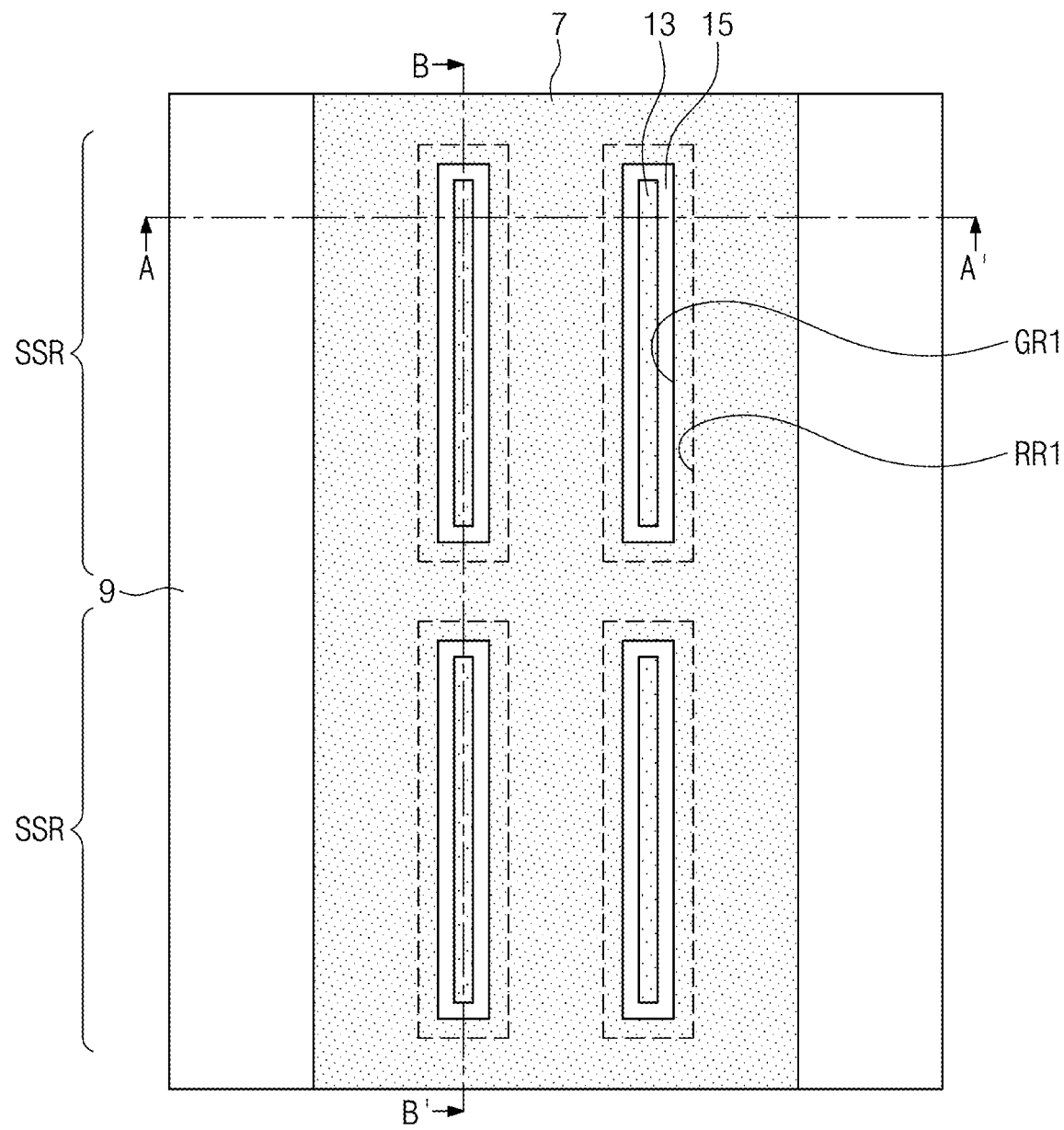
Figure 7B:
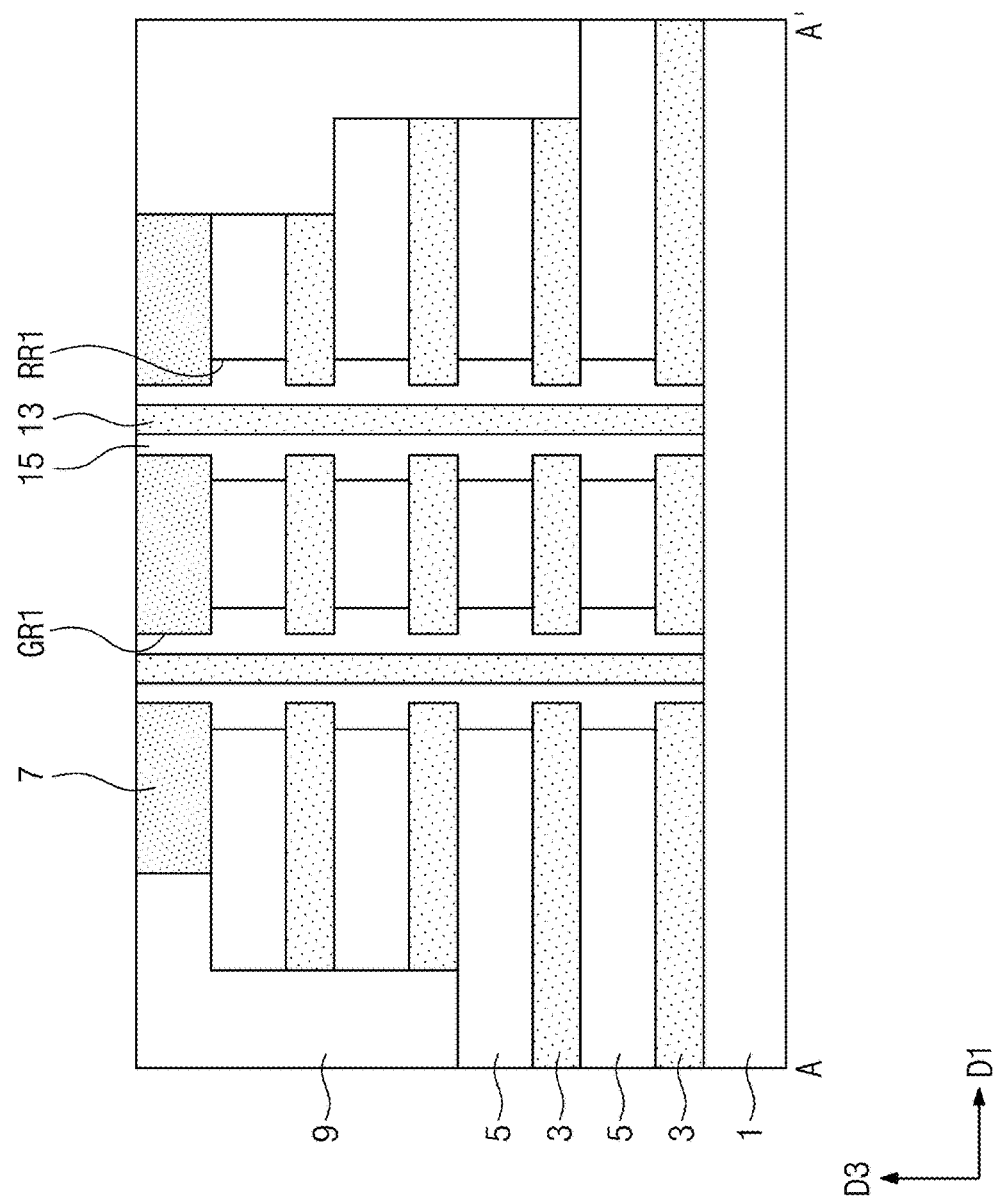
Figure 7C:
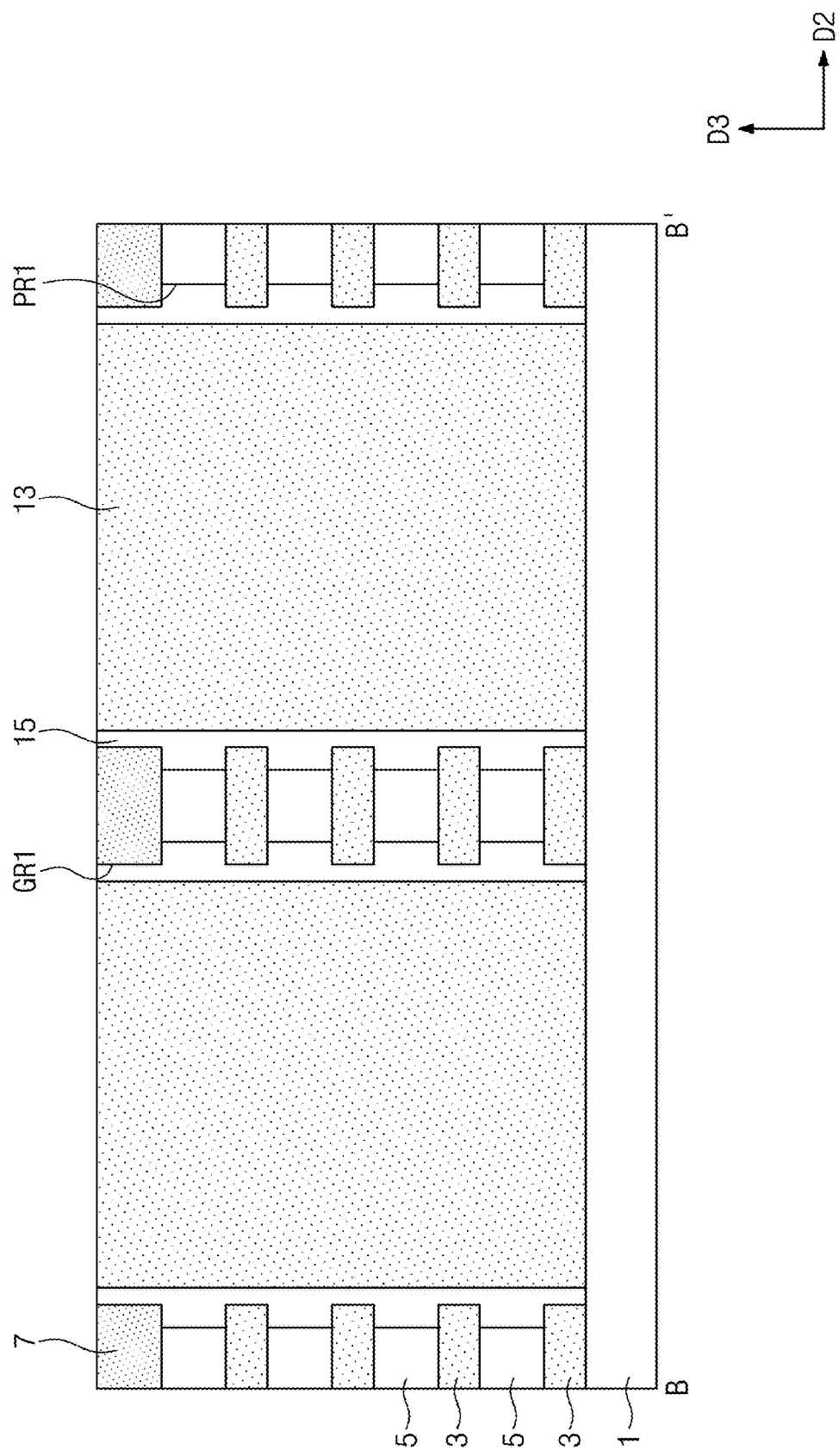

Referring to FIGS. 7A to 7C, an isotropic etching process may be performed to recess (or partially remove) the second interlayer dielectric patterns 5 exposed in the first groove GR1. The isotropic etching process may include a wet etching process; however, inventive concepts are not limited thereto. Thus, the sidewalls of the second interlayer dielectric patterns 5 may not be aligned with the sidewalls of the first and third interlayer dielectric patterns 3 and 7, and the first and third interlayer dielectric patterns 3 and 7 may be exposed on their top and bottom surfaces. Alternatively or additionally, first recessed regions RR1 may be formed which are defined by the sidewalls of the second interlayer dielectric patterns 5 and the top and bottom surfaces of the first and third interlayer dielectric patterns 3 and 7. Semiconductor layers 15 may be formed to fill the first grooves GR1 and the first recessed regions RR1. The semiconductor layer 15 may contact the sidewall of the sacrificial buried pattern 13 and the top surface of the substrate 1. The semiconductor layer 15 may include, for example, silicon, germanium, silicon-germanium, and/or indium gallium zinc oxide (IGZO). The semiconductor layer 15 may be formed by deposition and annealing processes. Alternatively or additionally, when the semiconductor layer 15 is formed of single crystalline silicon or of single crystalline silicon-germanium, a selective epitaxial growth (SEG) process may be employed to form the semiconductor layer 15. The SEG process may be doped or undoped. The SEG process may begin epitaxial growth on a surface of the substrate 1. The semiconductor layer 15 may be formed to cover the sidewalls and top and bottom surfaces of the first, second, and third interlayer dielectric patterns 3, 5, and 7.

Figure 8A:
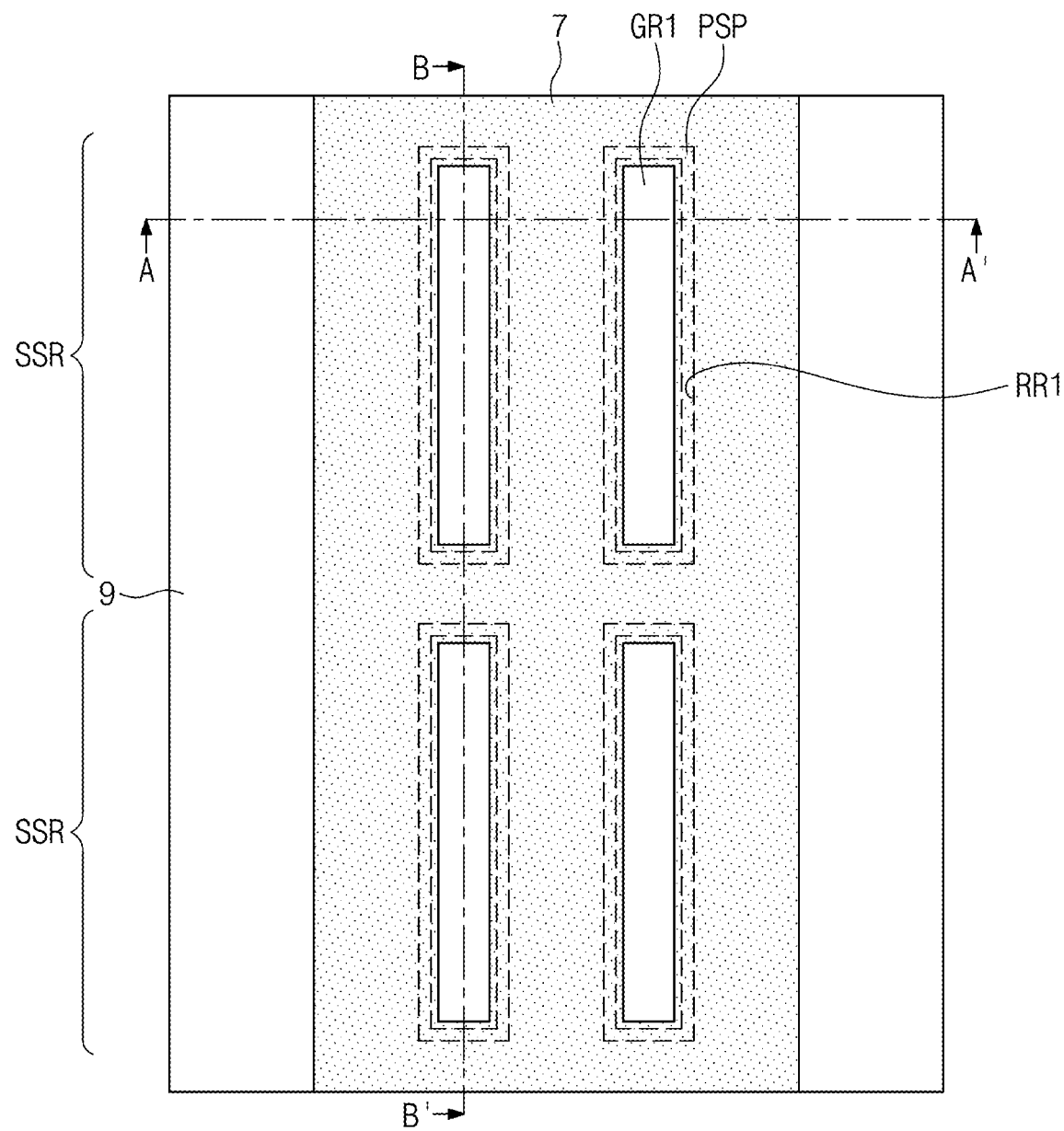
Figure 8B:
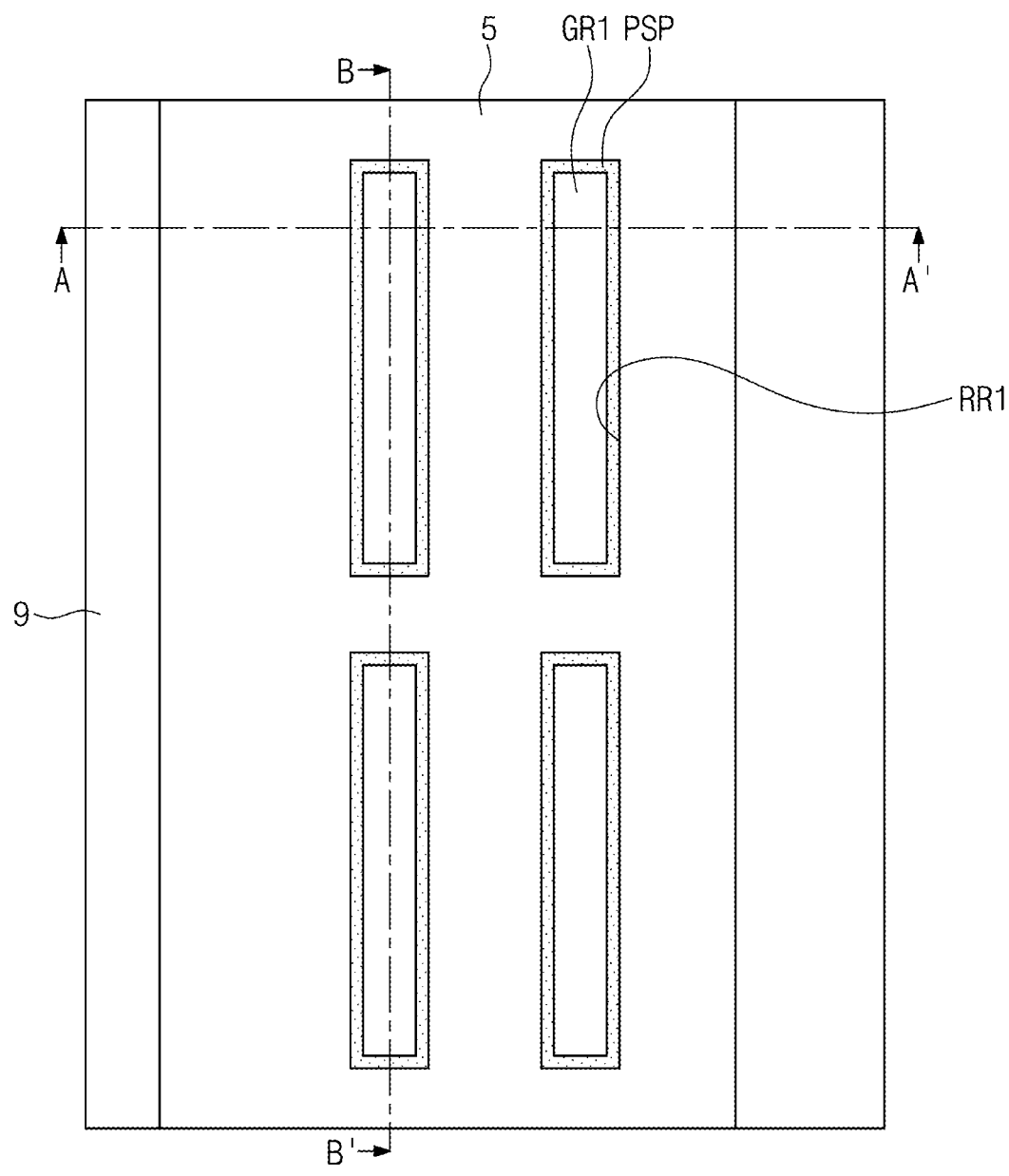
FIGS. 8B, 9B, 10B, 11B, 12A, 13A, 14B, 15A, and 16A illustrate plan views at a certain level showing a method of fabricating a semiconductor memory device having the plan view of FIG. 3B.
Figure 8C:
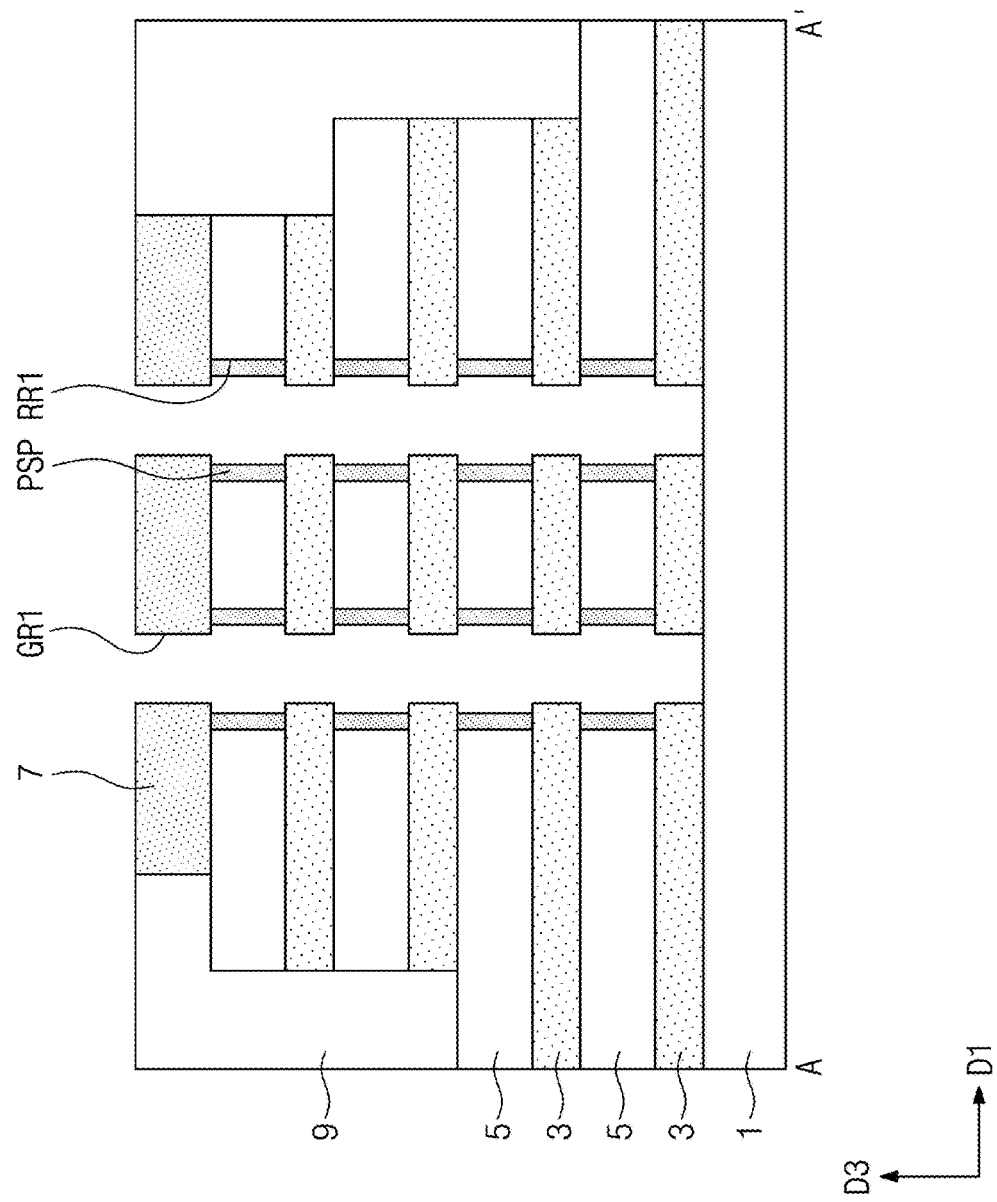
Figure 8D:
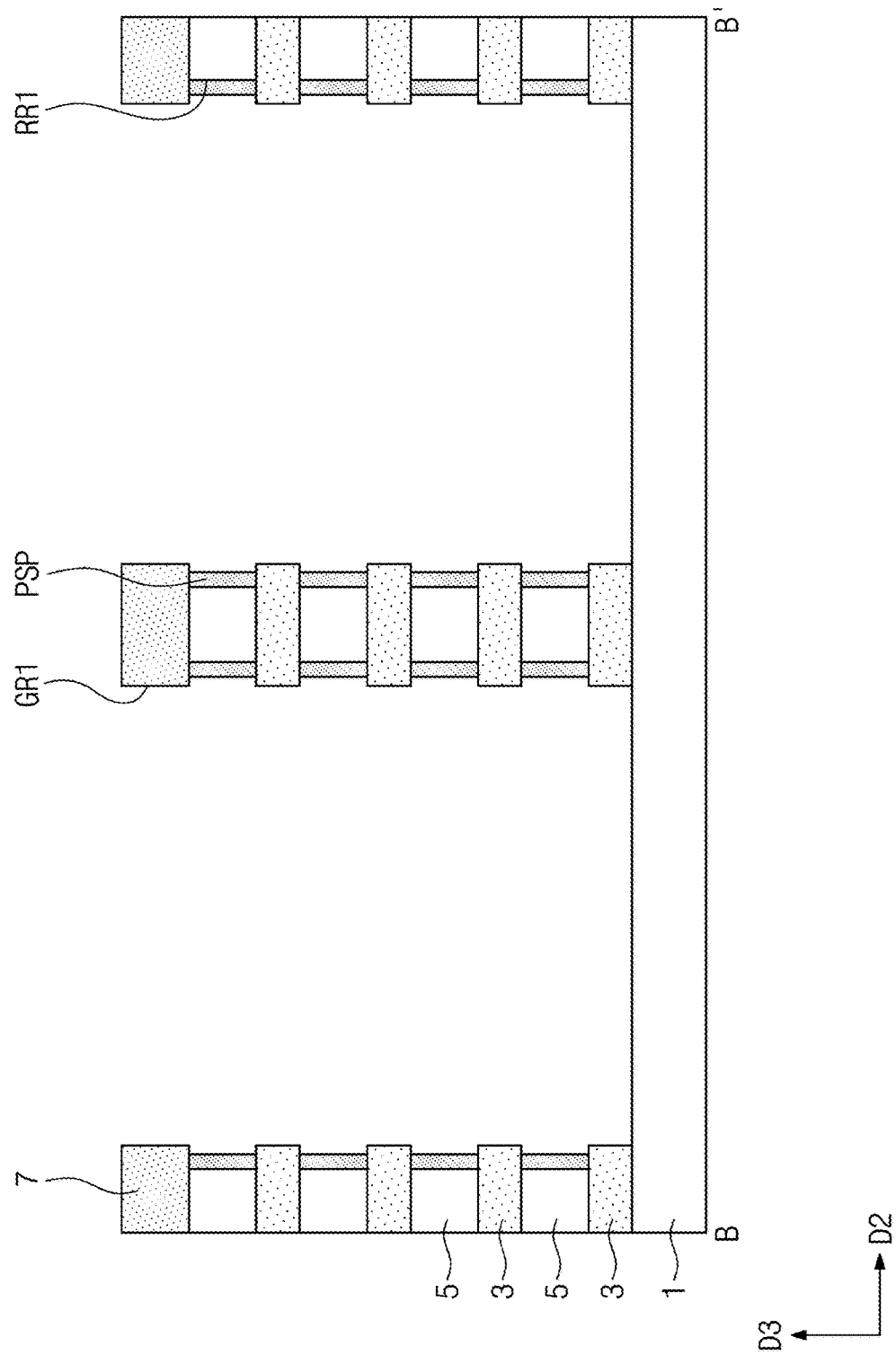
Figure 9A:
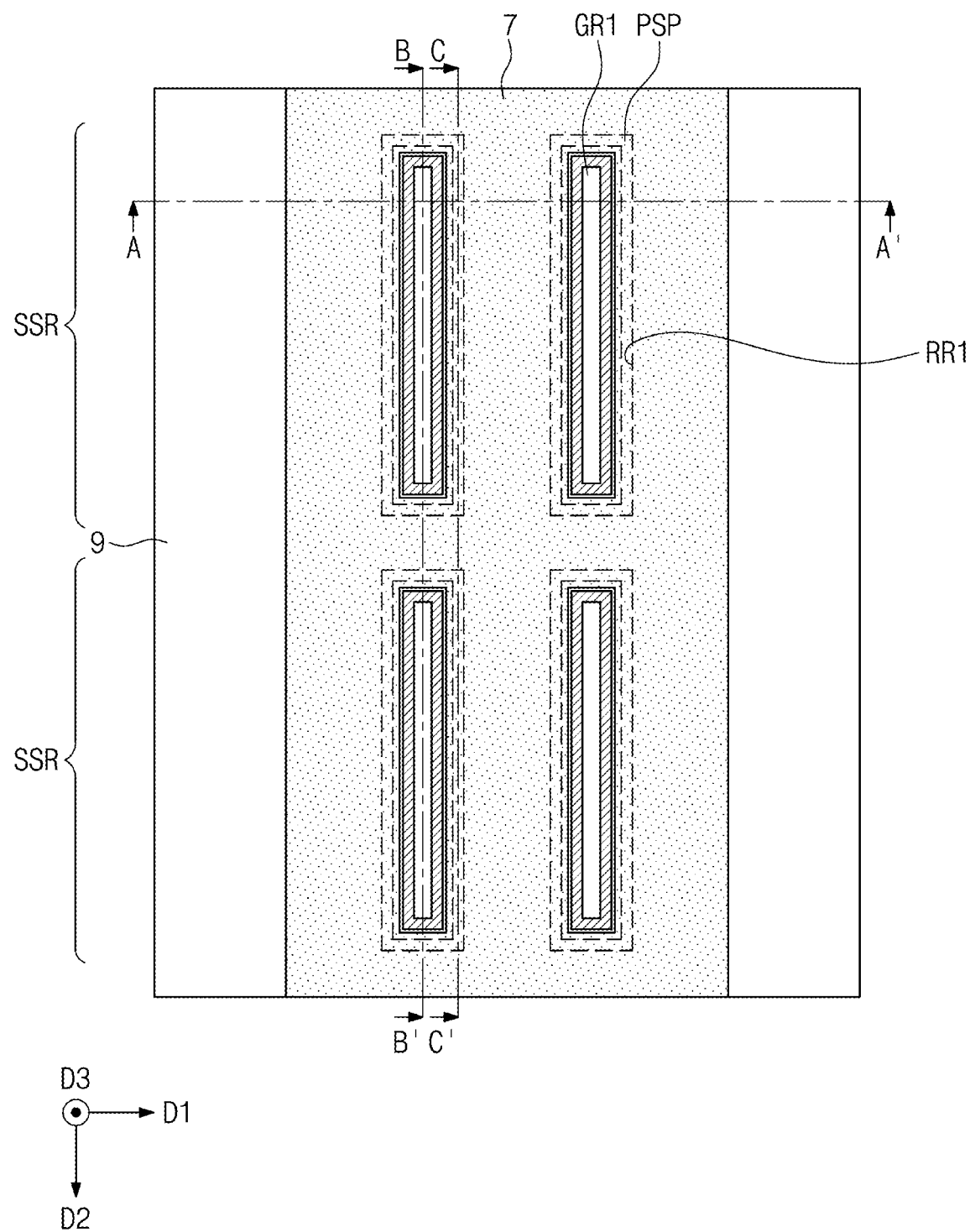
Figure 9B:
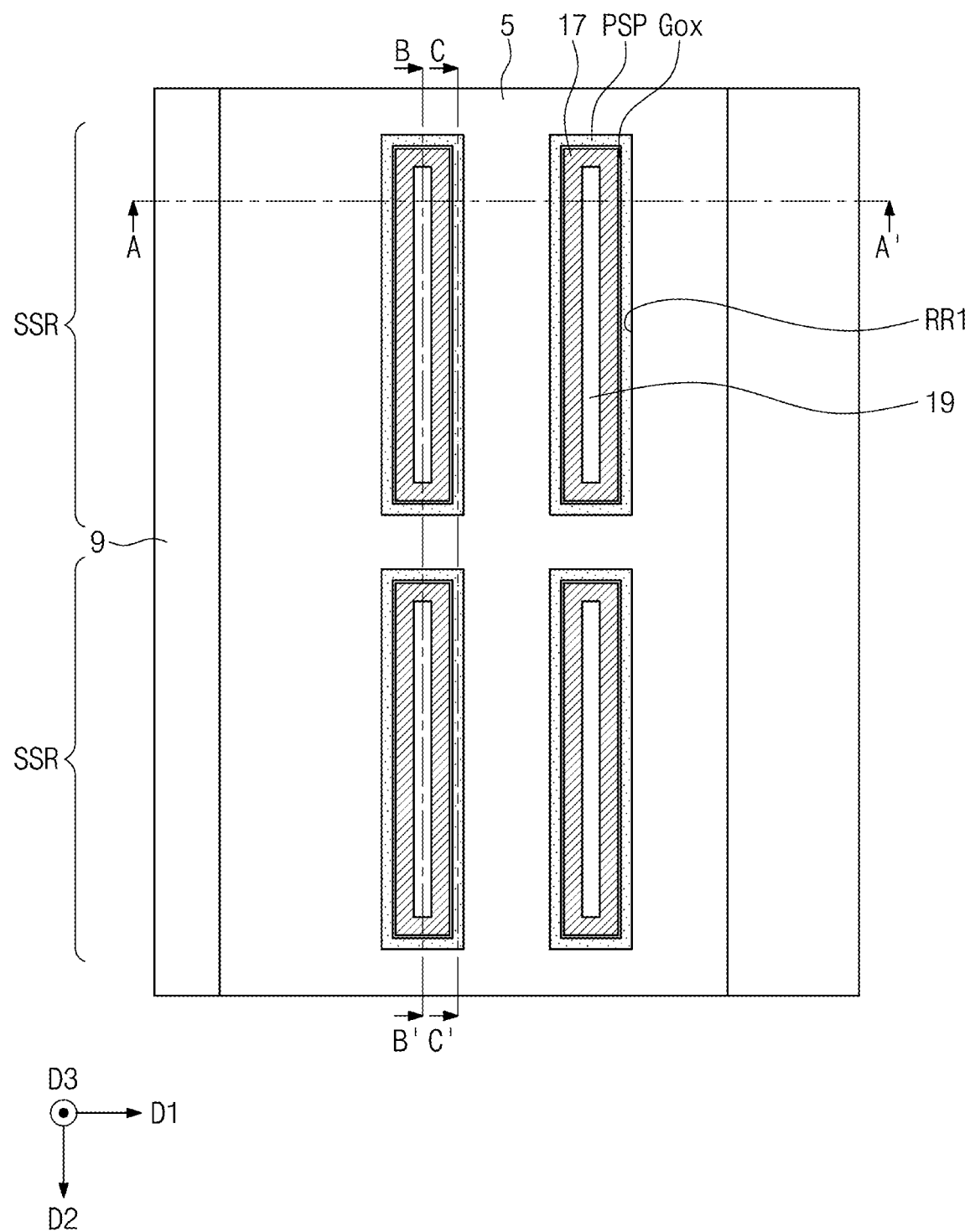
Figure 9C:
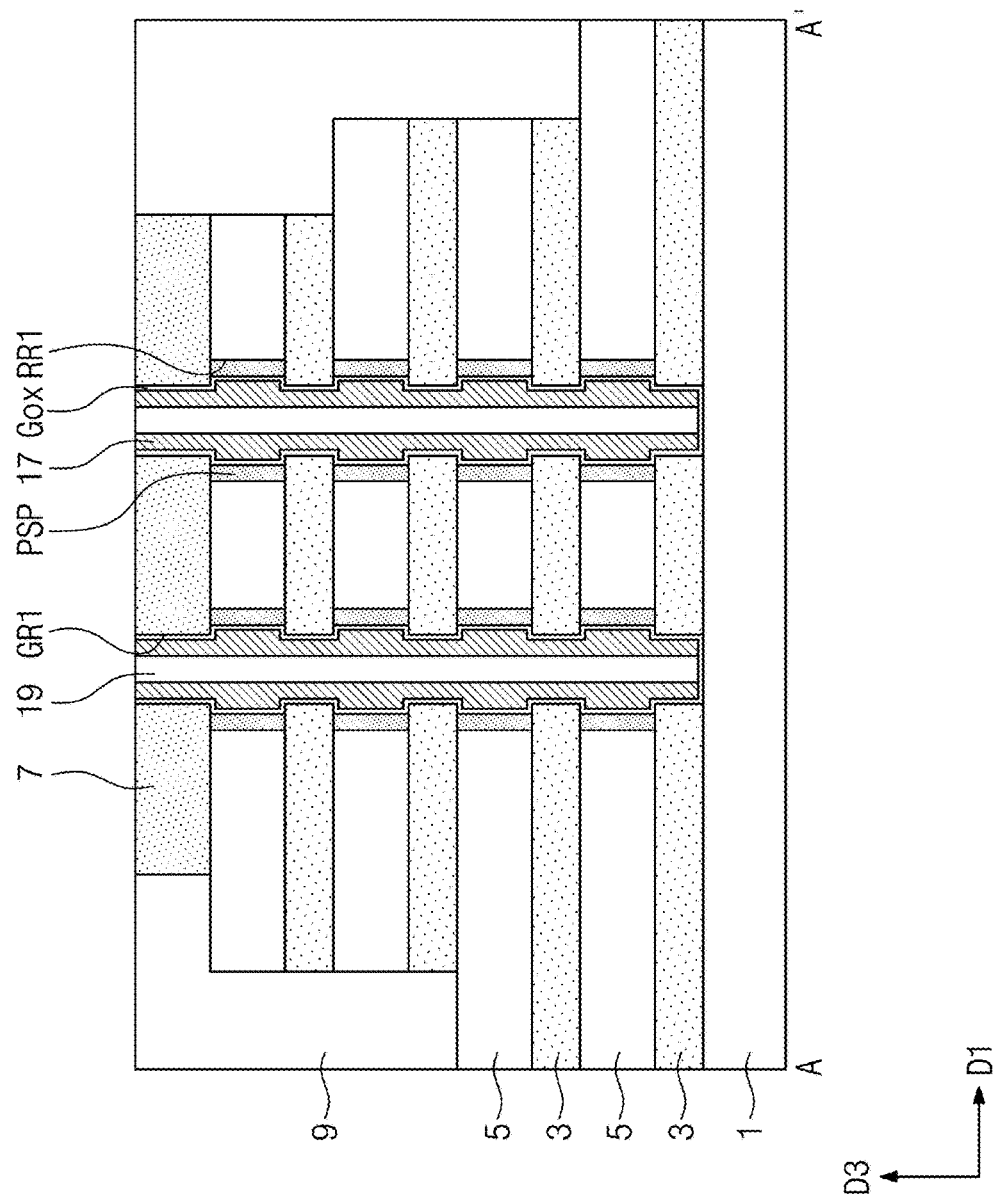
Figure 9D:
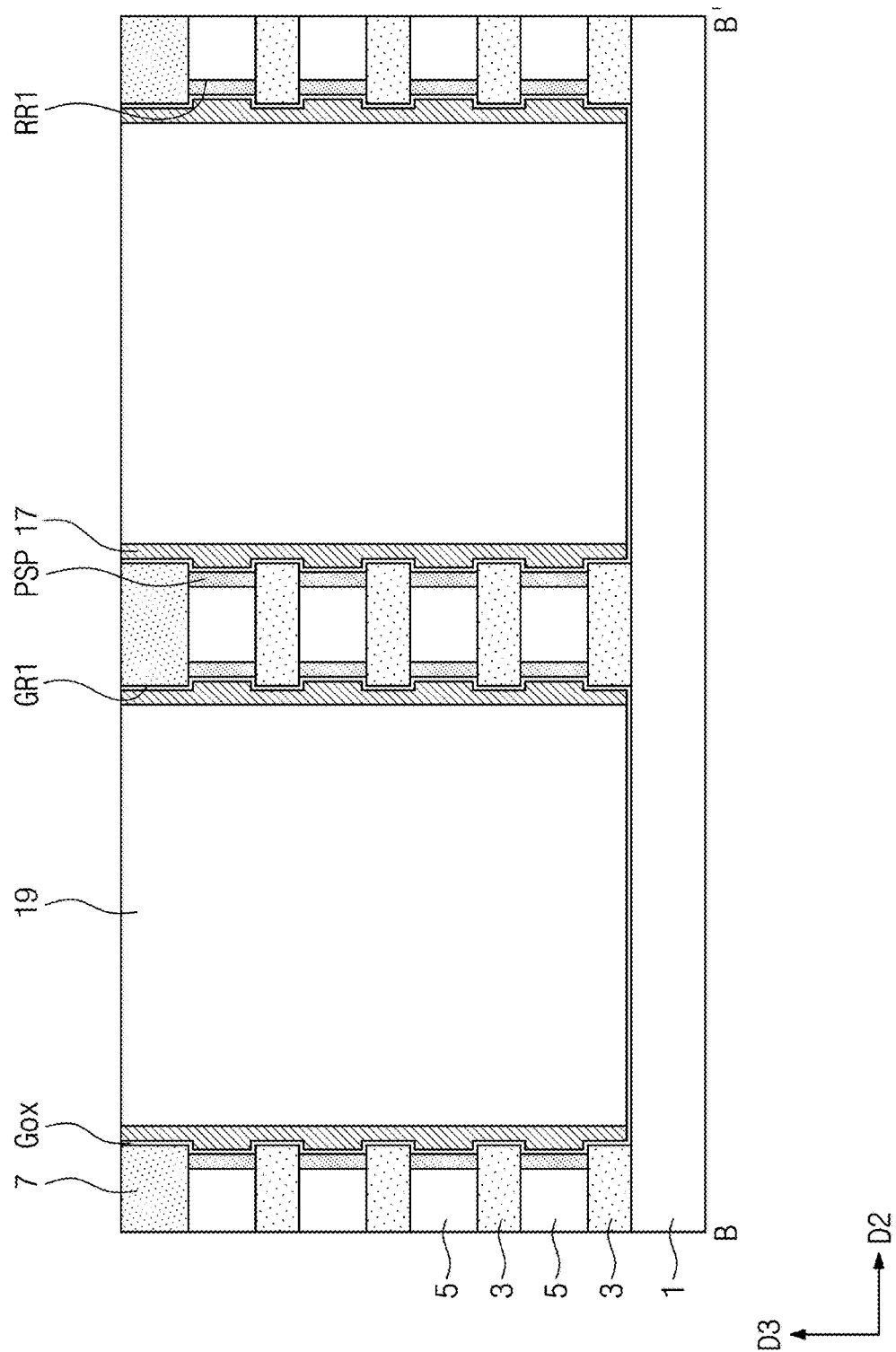
Figure 9E:
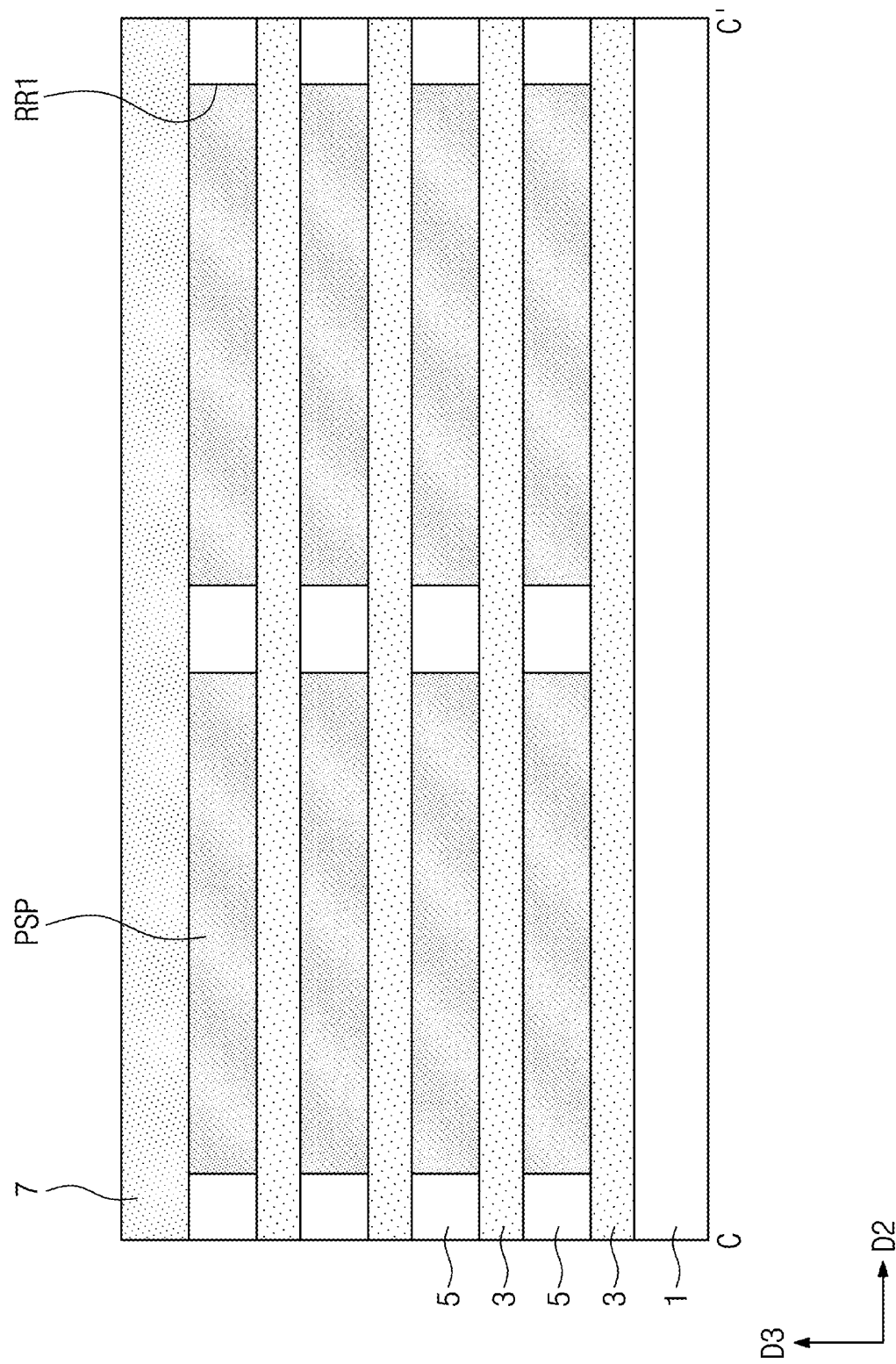
FIGS. 9E, 11E, 12C, 13D, 14D, 15C, and 16B illustrate cross-sectional views taken along line C-C' of FIGS. 9B, 11B, 12A, 13A, 14B, 15B, and 16A, respectively.
Figure 10A:
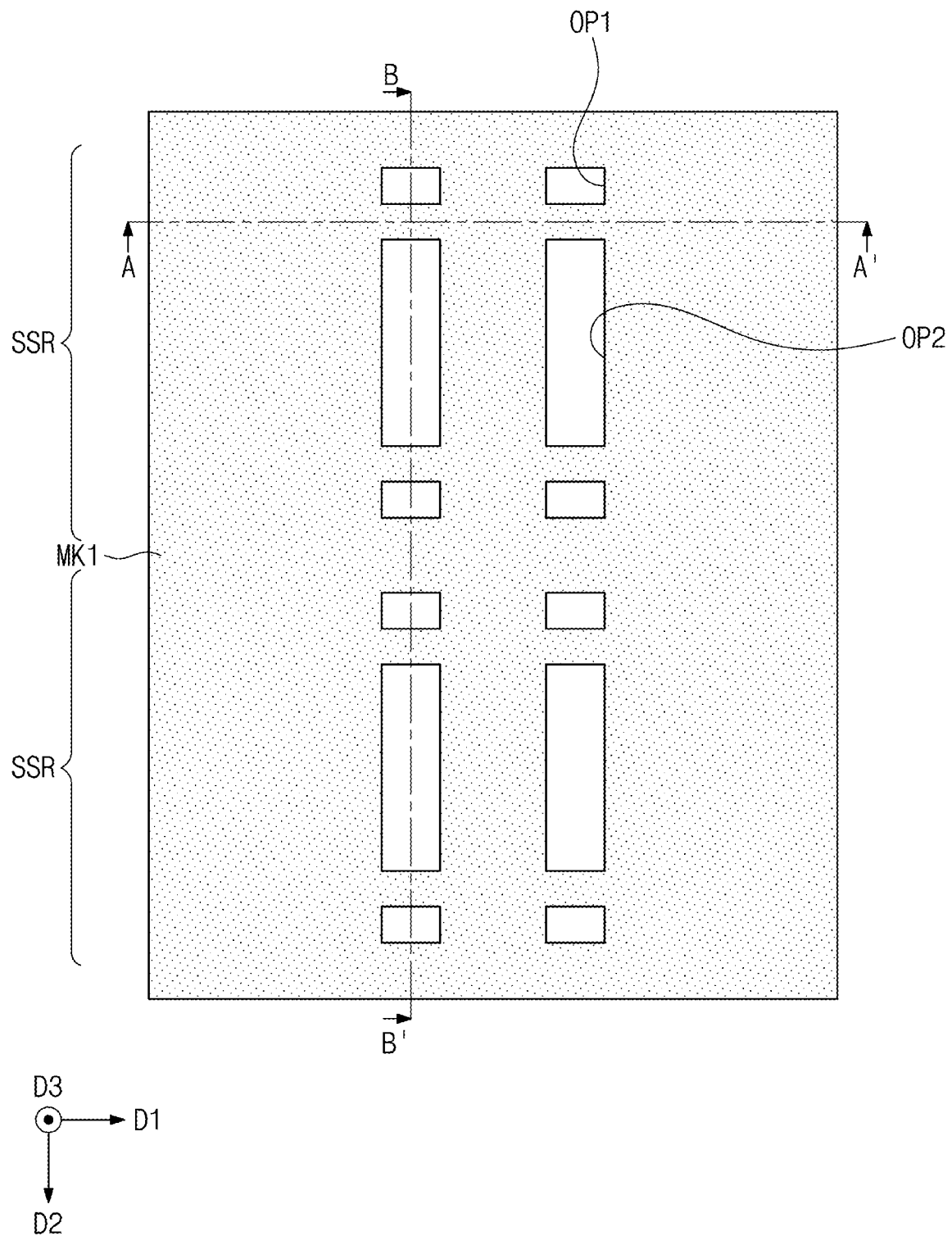
Figure 10B:
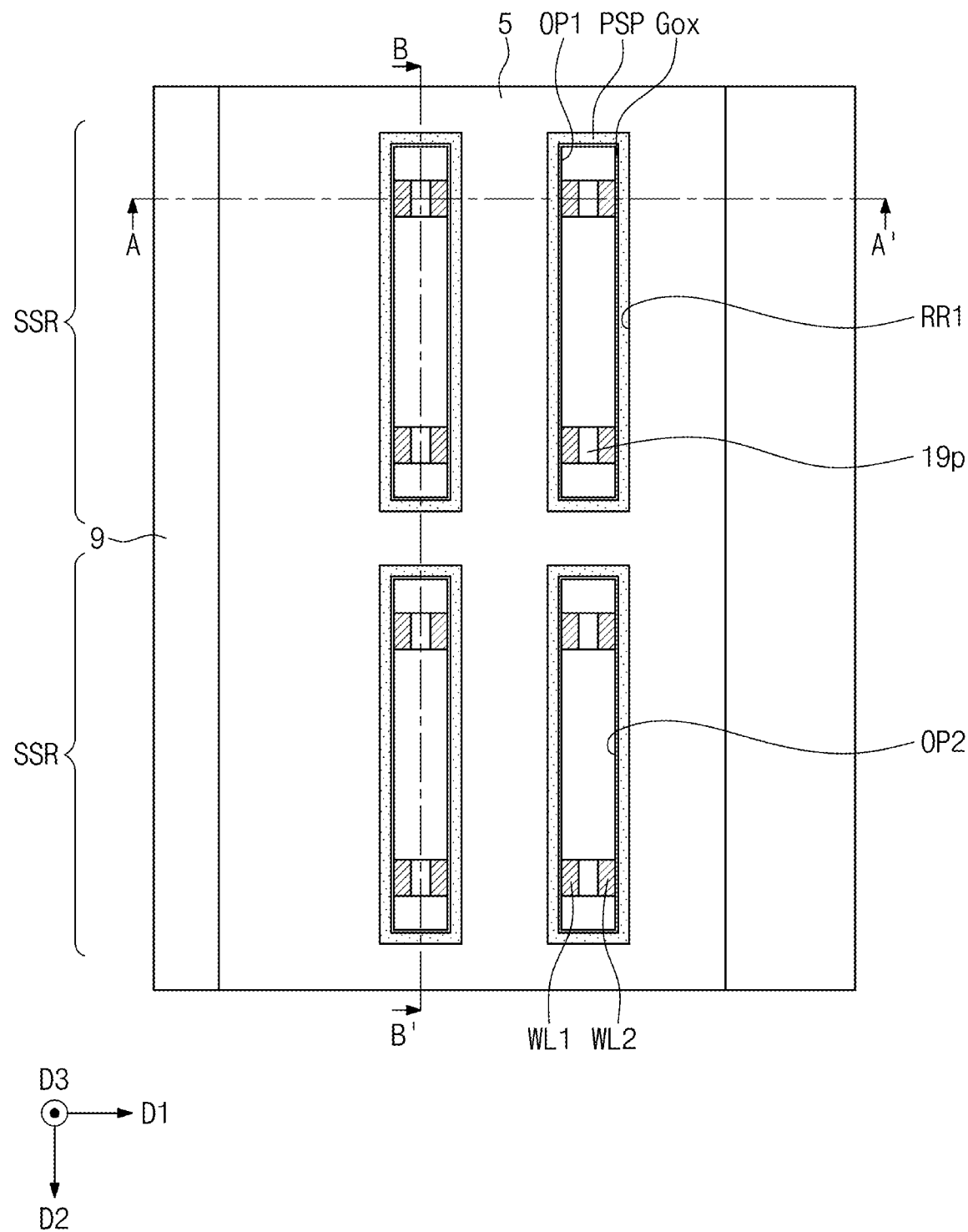
Figure 10C:
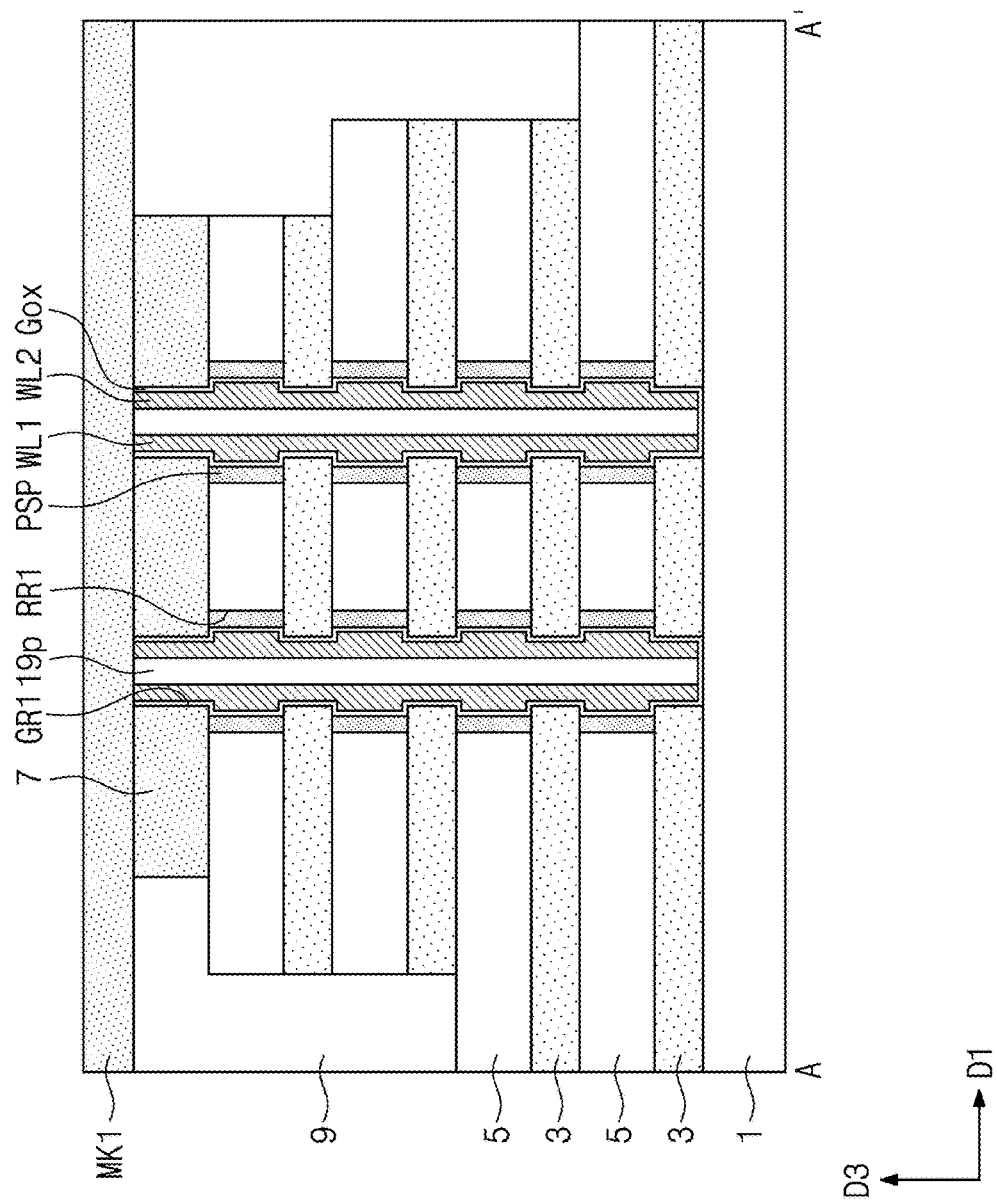
Figure 10D:
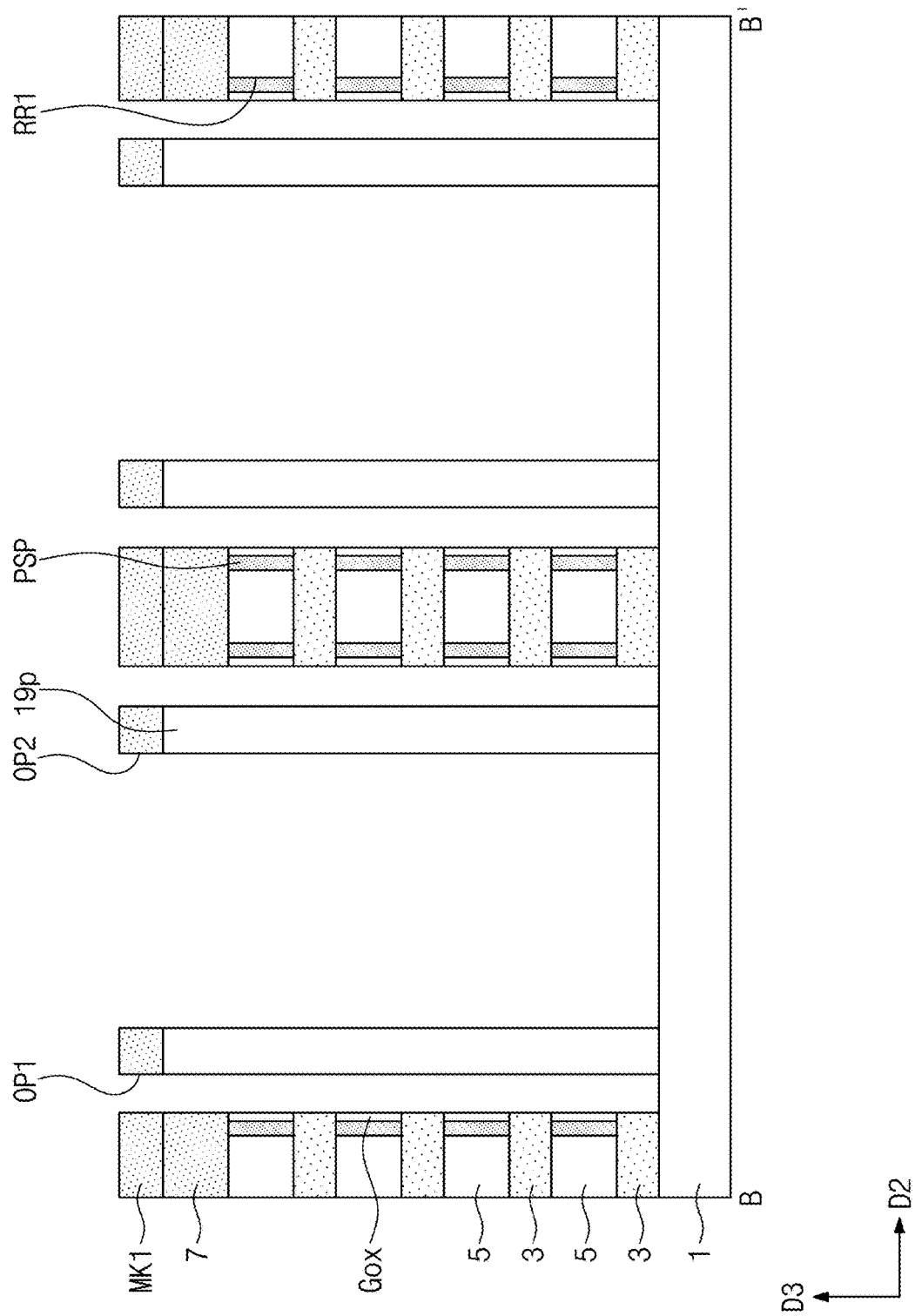
Figure 11A:
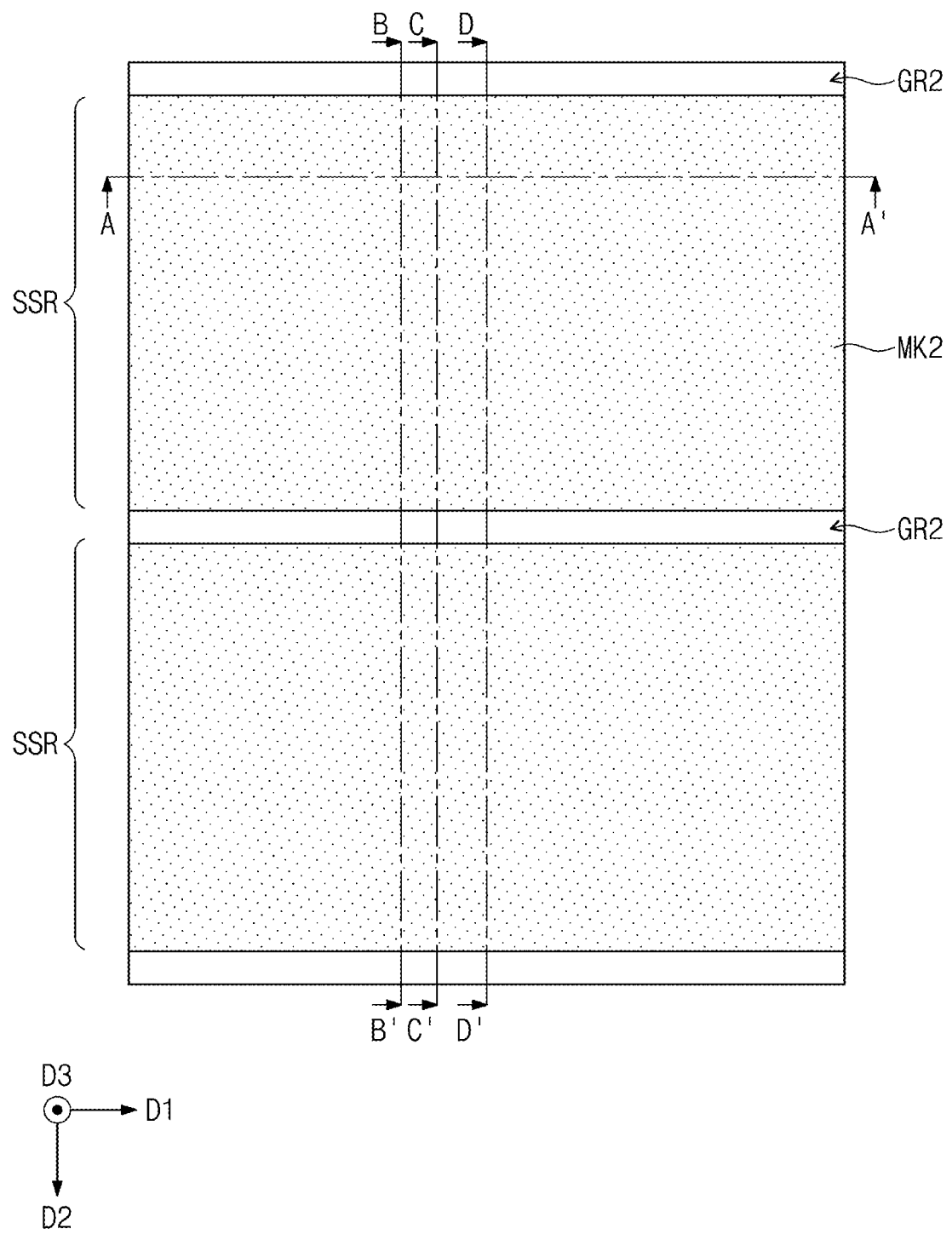
Figure 11B:
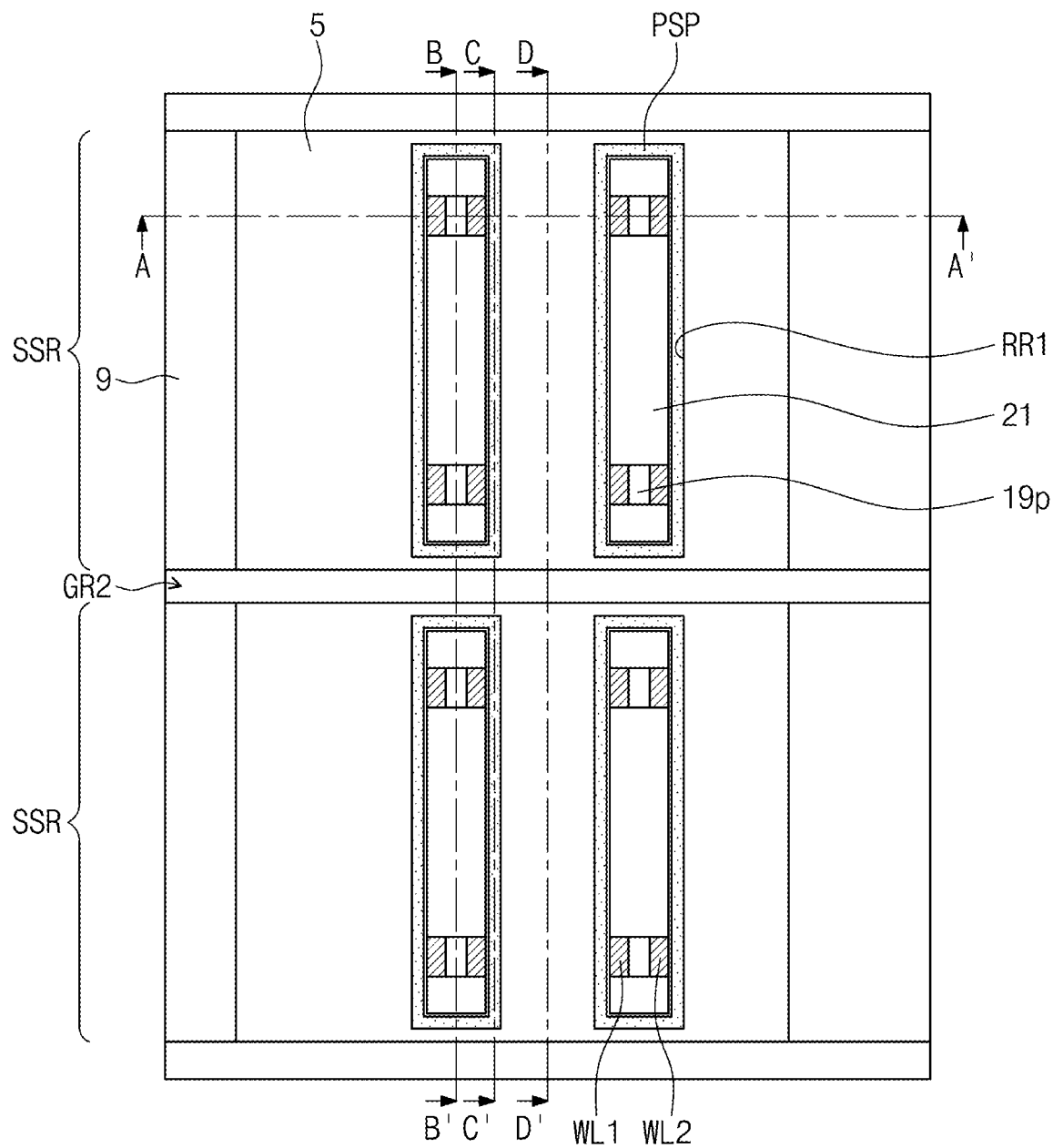
Figure 11C:
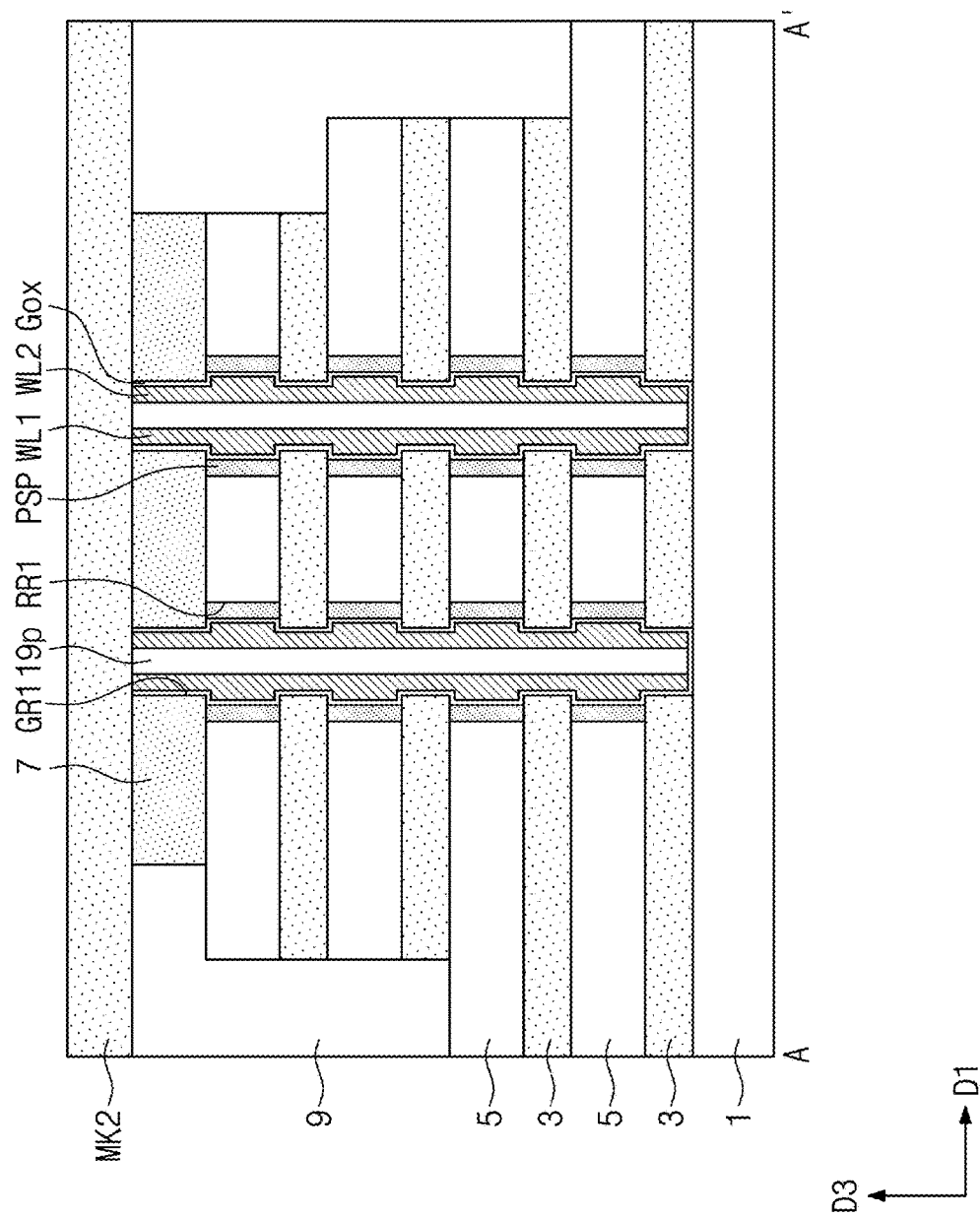
Figure 11D:
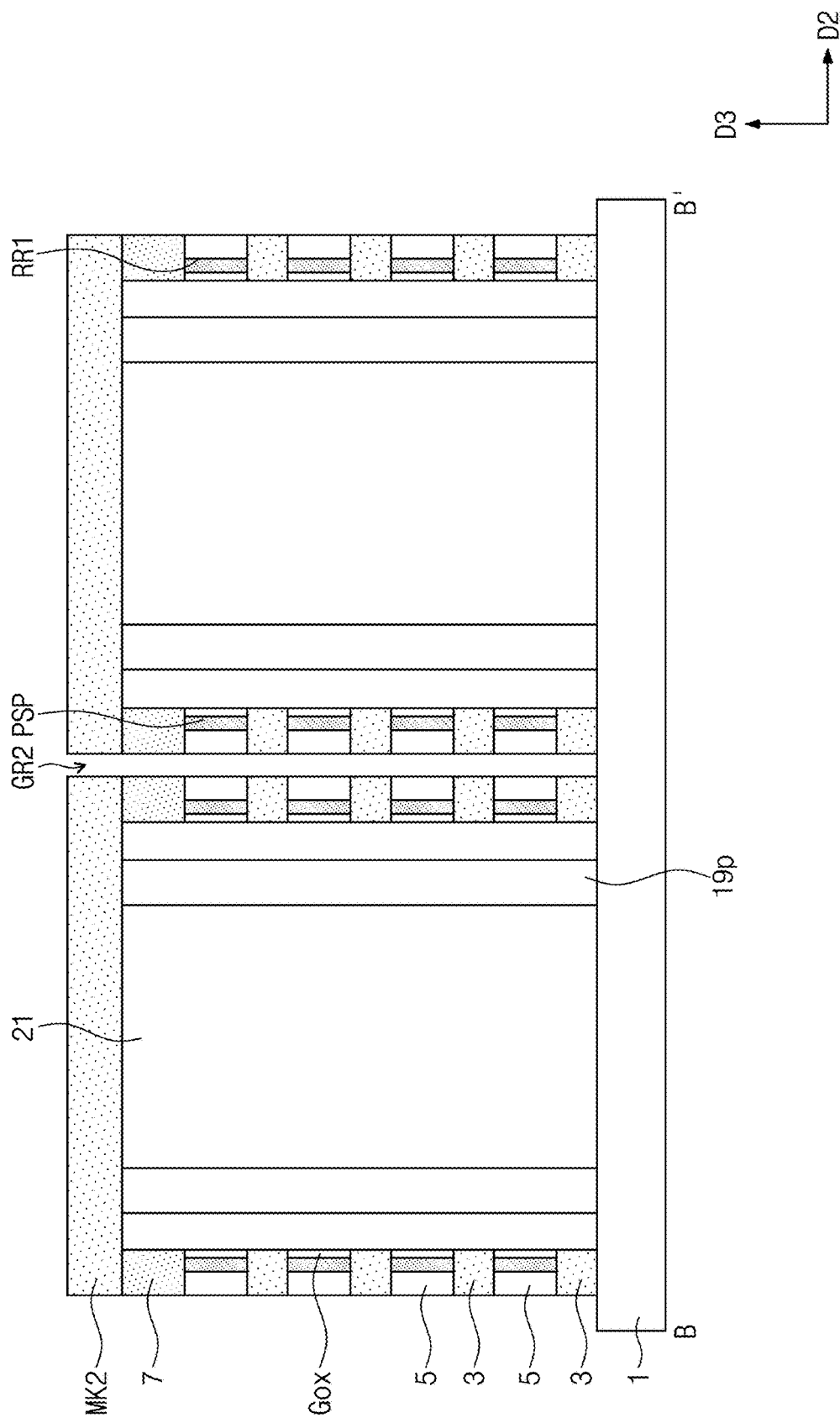
Figure 11E:
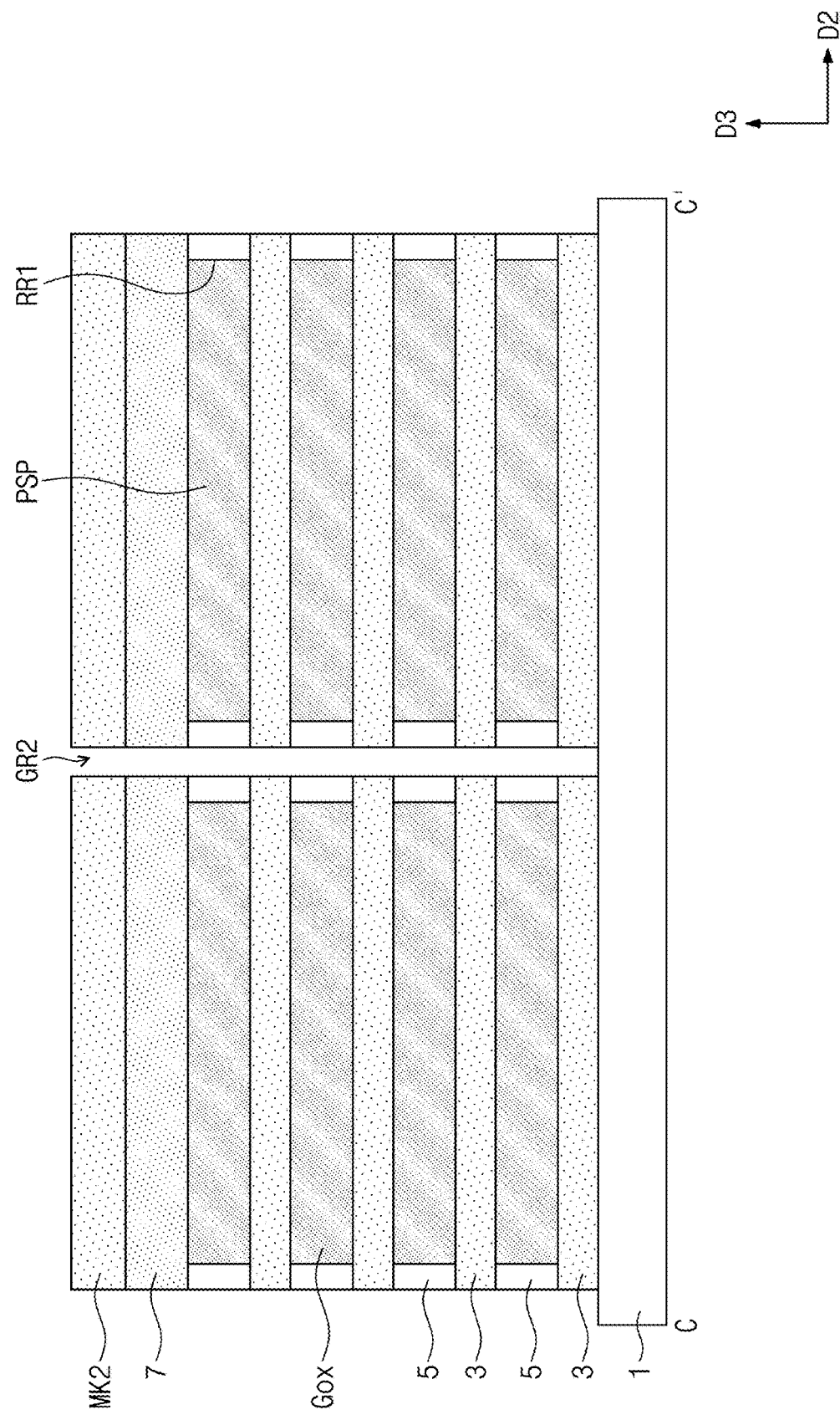
Figure 12A:
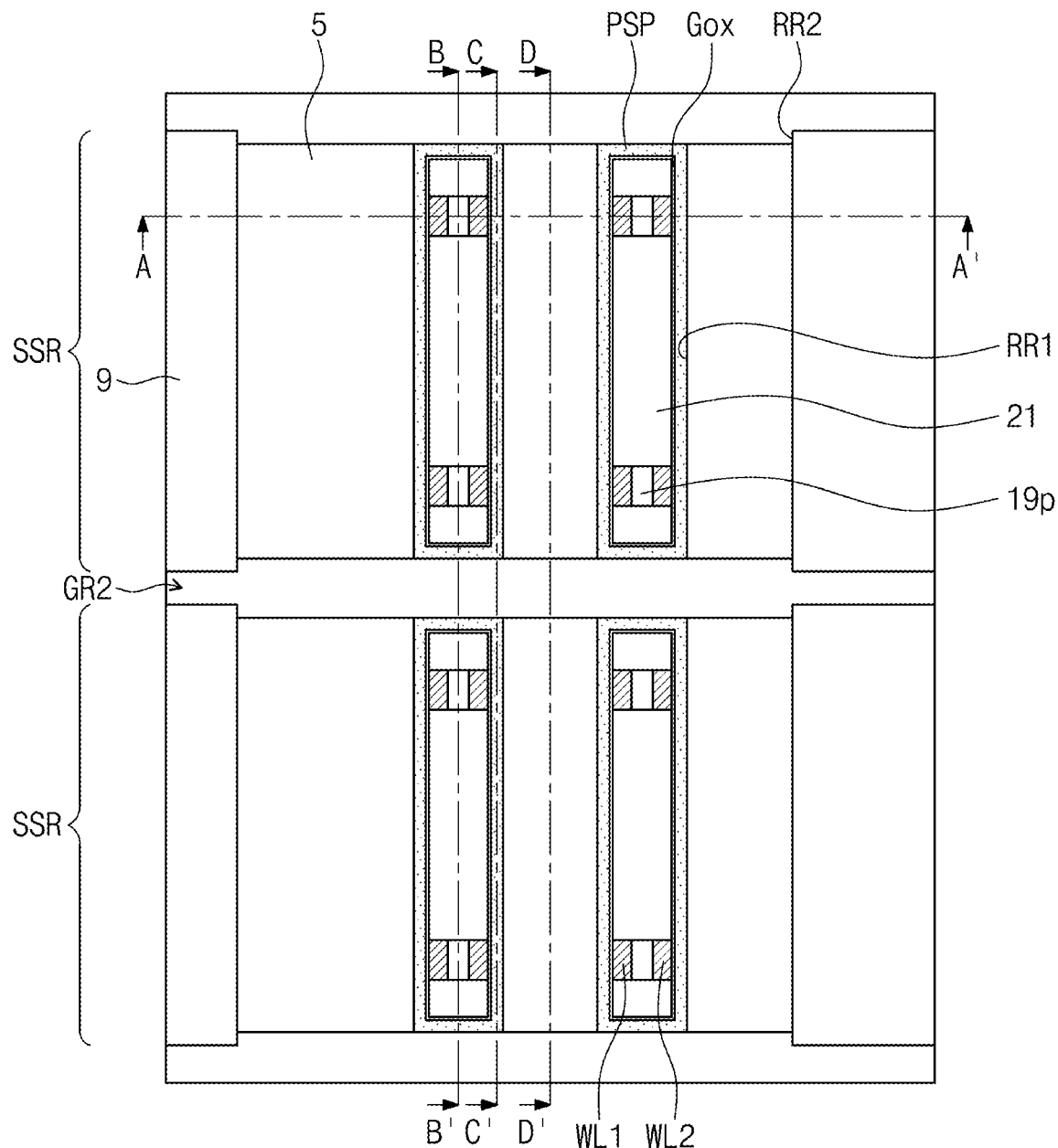
Figure 12B:
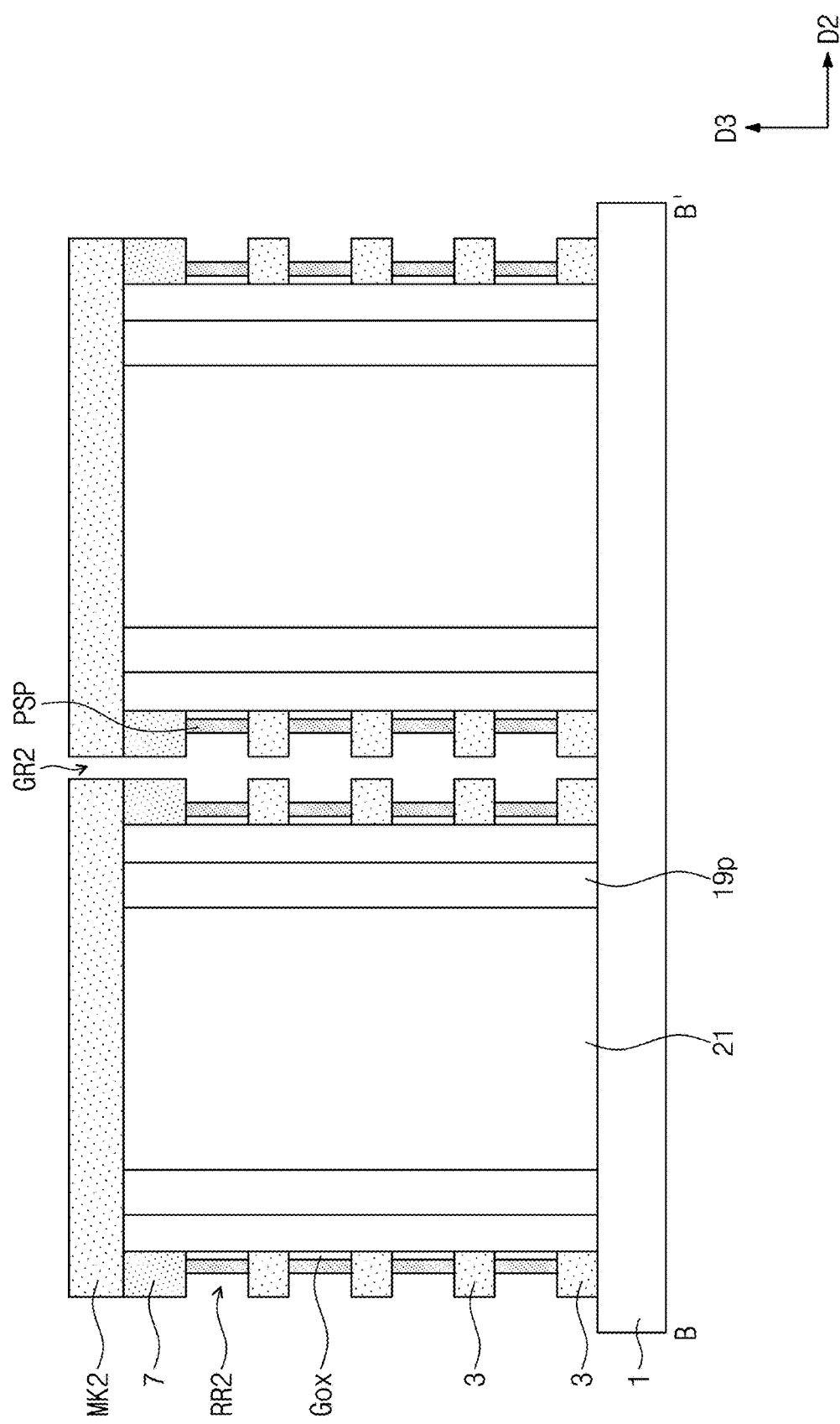
FIGS. 12B, 13C, 14C, and 15B illustrate cross-sectional views taken along line B-B' of FIGS. 12A, 13A, 14B, and 15A, respectively.
Figure 12C:
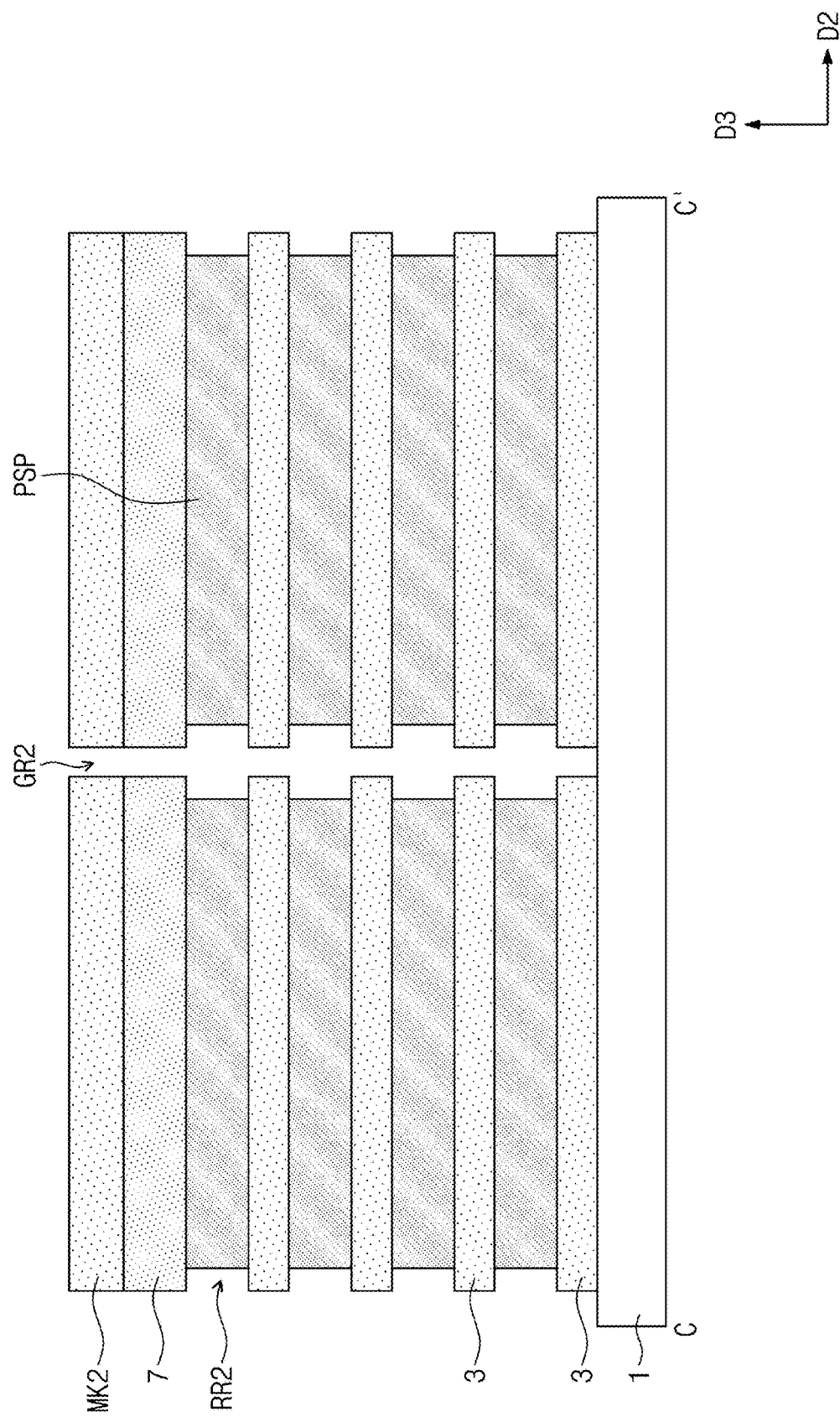
Figure 12D:
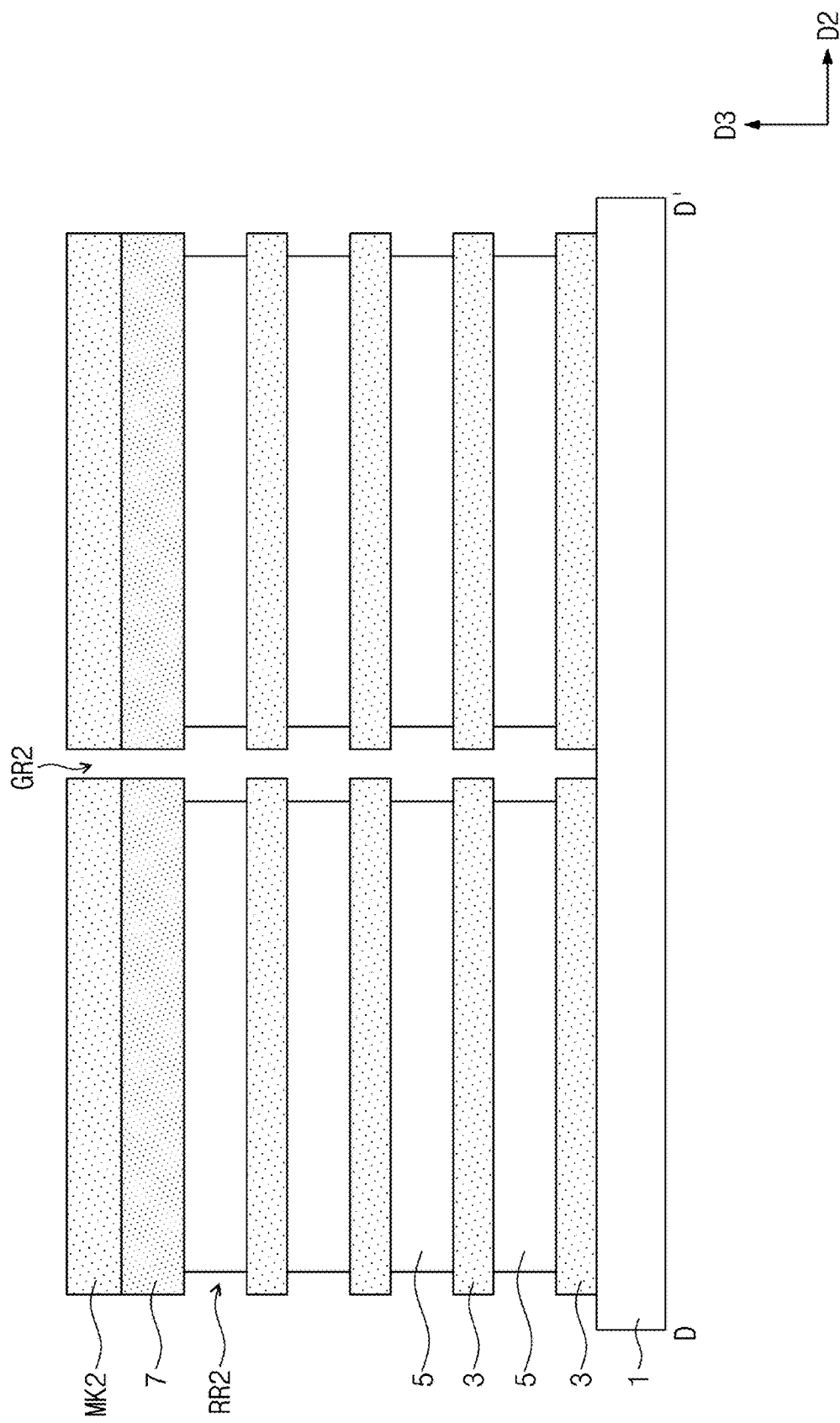

Referring to FIGS. 7A to 7C and 8A to 8D, the sacrificial buried pattern 13 may be removed to expose a sidewall of the semiconductor layer 15. An isotropic etching process, such as a wet etching process, may be performed to remove, e.g. partially remove, the semiconductor layer 15 and to form preliminary semiconductor patterns PSP that partially fill the first recessed region RR1 and that are spaced apart from each other. Accordingly, the first and third interlayer dielectric patterns 3 and 7 may be exposed on their sidewalls. Moreover, the first and third interlayer dielectric patterns 3 and 7 may be partially exposed on their top and bottom surfaces. As shown in FIG. 8B, each of the preliminary semiconductor patterns PSP may be formed to have a closed curve shape elongated in the second direction D2 along a sidewall of the first recessed region RR1.

Referring to FIGS. 9A to 9E, a gate dielectric layer Gox may be formed, e.g. conformally formed on or surrounding the entire surface of the substrate 1. The gate dielectric layer Gox may be formed with a PECVD process and/or may be partially formed with a thermal oxidation process on exposed portions of the preliminary semiconductor patterns PSP; however, inventive concepts are not limited thereto. A conductive layer may be stacked, e.g. deposited, on the gate dielectric layer Gox, and then an anisotropic etching process may be performed to form preliminary word line patterns 17 covering the sidewalls of the first grooves GR1. The gate dielectric layer Gox may be partially exposed on a floor of the first groove GR1, e.g. adjacent to a top surface of the substrate 1. First buried dielectric layers 19 may be formed to fill the first grooves GR1.

Referring to FIGS. 10A to 10D, a first mask pattern MK1 may be formed on the third interlayer dielectric pattern 7. The first mask pattern MK1 may include, for example, at least one of a photoresist pattern, a spin on carbon (SOC) layer, a spin on hardmask (SOH) layer, or an amorphous carbon layer (ACL). The first mask pattern MK1 may include first openings OP1 and second openings OP2 located at positions overlapping the first grooves GR1. On a single stack structure region SSR, two first openings OP1 adjacent to each other in the second direction D2 may overlap opposite ends of a single first groove GR1, and the second opening OP2 may be disposed between the two first openings OP1. At least the preliminary word line patterns 17 may be etched by performing an anisotropic etching process in which the first mask pattern MK1 is used as an etching mask. Therefore, word lines WL1 and WL2 may be formed spaced apart from each other. At this stage, the first buried dielectric layers 19 may also be etched to form first buried dielectric patterns 19p shown in FIG. 10D. The first mask pattern MK1 may be removed to expose the top surface of the third interlayer dielectric pattern 7. The first mask pattern MK1 may be removed, for example, with an ashing process such as an O2 ashing process.

Referring to FIGS. 11A to 11F, a second buried dielectric layer may be stacked, and then a planarization etching process may be performed to form second buried dielectric patterns 21 filling the first grooves GR1. The planarization etching process may include, for example, a blanket etch-back process and/or a CMP process. A second mask pattern MK2 may be formed on the third interlayer dielectric pattern 7. The second mask pattern MK2 may include, for example, at least one of a photoresist pattern, a spin on carbon (SOC) layer, a spin on hardmask (SOH) layer, or an amorphous carbon layer (ACL). The second mask pattern MK2 may include second grooves GR2 spaced apart from each other.

The second groove GR2 may be disposed between the stack structure regions SSR. An anisotropic etching process may be performed in which the second mask pattern MK2 is used as an etching mask to etch the first, second, and third interlayer dielectric patterns 3, 5, and 7 between the stack structure regions SSR, such that the second grooves GR2 may be transferred onto the first, second, and third interlayer dielectric patterns 3, 5, and 7. The second groove GR2 may expose a top surface of the substrate 1.

Referring to FIGS. 12A to 12D, an isotropic etching process may be performed to recess, e.g. to partially remove, the second interlayer dielectric patterns 5 exposed through the second grooves GR2, which may result in exposure of sidewalls of the preliminary semiconductor patterns PSP shaped like closed curves. At this stage, the fourth interlayer dielectric pattern 9 may also be exposed on a sidewall thereof. Thus, second recessed regions RR2 may be formed on corresponding second interlayer dielectric patterns 5. A cross-section taken along line A-A' of FIG. 12A may be the same as that shown in FIG. 11C.

Referring to FIGS. 13A to 13D, an isotropic etching process, e.g. a wet etching process, may be performed to partially remove the preliminary semiconductor patterns PSP exposed to the second recessed regions RR2, which may result in exposure of the gate dielectric layer Gox and also in formation of first preliminary semiconductor patterns PSP1 and second preliminary semiconductor patterns PSP2 spaced apart from each other. The first and second preliminary semiconductor patterns PSP1 and PSP2 may each have a linear shape elongated in the second direction D2. For example, opposite ends of a single preliminary semiconductor pattern PSP shaped like a closed curve may be removed to form a pair of first and second preliminary semiconductor patterns PSP1 and PSP2. Third recessed regions RR3 may be formed on areas where portions of the preliminary semiconductor patterns PSP are removed.

Referring to FIGS. 14A to 14E, a ion implantation process may be performed to implant first conductivity type impurities into portions adjacent to ends of the preliminary semiconductor patterns PSP exposed to the third recessed regions RR3, with the result that first source/drain regions SD1 may be formed. The ion implantation process may be a beamline ion implantation process that is tilted at an angle. The angle may be determined based on a shadowing amount of surrounding structures. Alternatively or additionally, the ion implantation process may be a plasma assisted doping (PLAD) process. The first conductivity type may be n-type; however, inventive concepts are not limited thereto. A conductive layer may be stacked on the entire surface of the substrate 1, and then an anisotropic etching process may be performed to form bit lines BL spaced apart from each other. The bit lines BL may fill the second and third recessed regions RR2 and RR3 between the first and third interlayer dielectric patterns 3 and 7. The bit lines BL may be formed to fill the third recessed regions RR3 and thus may have bit line protrusions BLP of FIG. 2B. After the bit lines BL are formed, the second mask pattern MK2 may be removed to expose the top surface of the third interlayer dielectric pattern 7. The second mask pattern MK2 may be removed with an ash process, such as an O2 ash process; however, inventive concepts are not limited thereto. The substrate 1 may be provided on its entire surface with a separation dielectric layer filling the second grooves GR2, and then a planarization etching process may be performed to form separation dielectric patterns 25 each of which fills the second groove GR2 and separates the stack structure regions SSR from each other. The planarization etching process may include a blanket etch-back process and/or a CMP process. A cross-section taken along line A-A' of FIG. 14A may be the same as a structure shown in FIG. 13B except for the second mask pattern MK2.

Referring to FIGS. 15A to 15D, a third mask pattern MK3 may be formed on the third interlayer dielectric pattern 7. The third mask pattern MK3 may include, for example, at least one of a photoresist pattern, a spin on carbon (SOC) layer, a spin on hardmask (SOH) layer, or an amorphous carbon layer (ACL). The third mask pattern MK3 may include third openings OP3. The third openings OP3 may each be positioned on a central portion of the stack structure region SSR. The third opening OP3 may have a bar shape elongated in the first direction D1. The third opening OP3 may be disposed to intersect the first and second preliminary semiconductor patterns PSP1 and PSP2. An anisotropic etching process may be performed in which the third mask pattern MK3 is used as an etching mask to partially remove the first and second preliminary semiconductor patterns PSP1 and PSP2. Therefore, the first preliminary semiconductor patterns PSP1 may be formed into first semiconductor patterns SP1 spaced apart from each other in the second direction D2. Alternatively or additionally, the second preliminary semiconductor patterns PSP2 may be formed into second semiconductor patterns SP2 spaced apart from each other in the second direction D2. At this stage, the second buried dielectric pattern 21 may also be etched. Furthermore, referring to FIGS. 15C and 15D, the first, second, and third interlayer dielectric patterns 3, 5, and 7 may also be partially etched, and the third openings OP3 may be transferred onto the first, second, and third interlayer dielectric patterns 3, 5, and 7. The third opening OP3 may expose sidewalls of the first and second semiconductor patterns SP1 and SP2. A cross-section taken along line A-A' of FIG. 15A may have a structure shown in FIG. 13B in which the third mask pattern MK3 takes the place of the second mask pattern MK2.

Figure 16A:
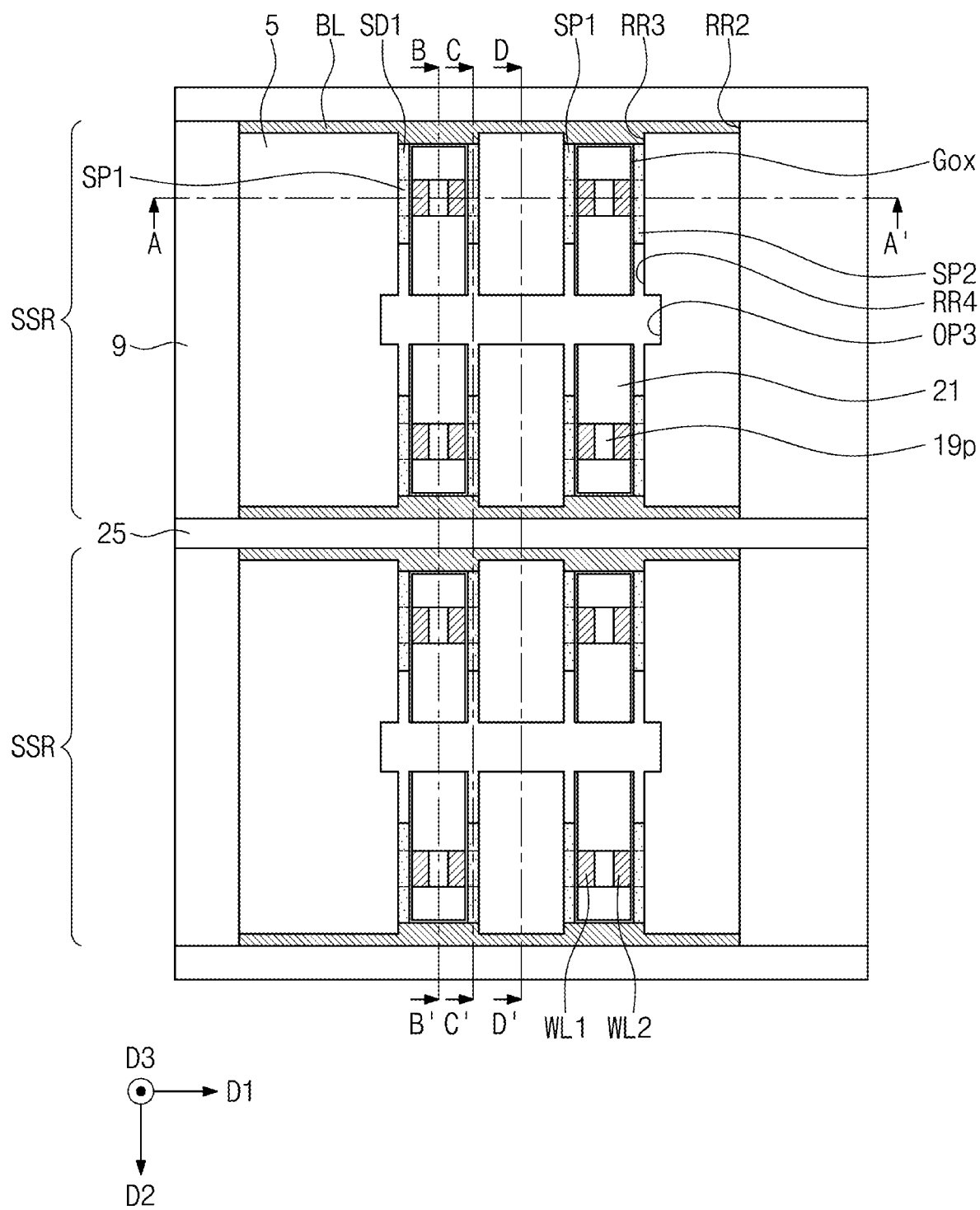
Figure 16B:
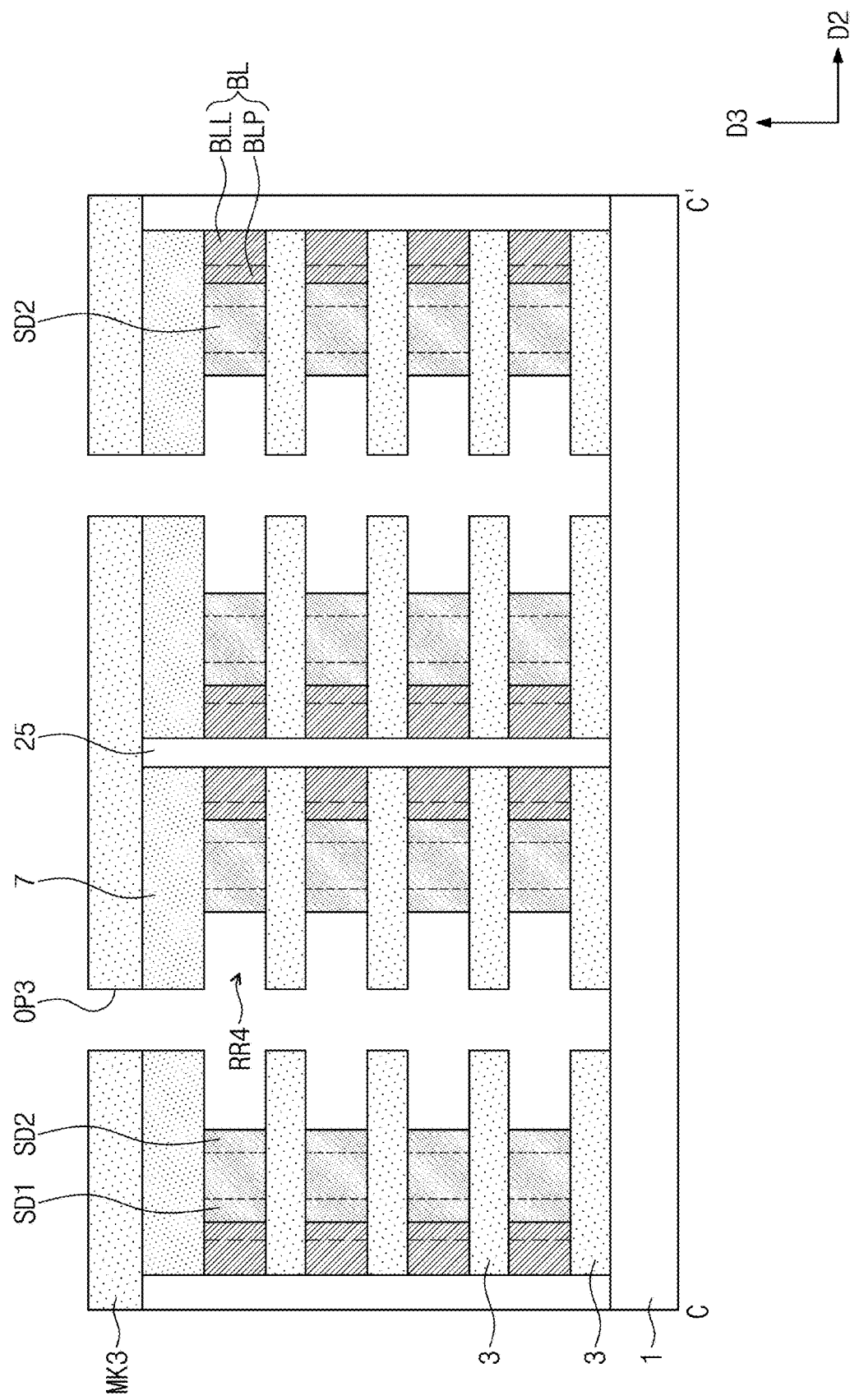

Referring to FIGS. 16A and 16B, an isotropic etching process, such as a wet etching process, may be performed to recess, e.g. partially remove, the first and second semiconductor patterns SP1 and SP2 exposed to the third opening OP3, such that fourth recessed regions RR4 may be formed to expose the top and bottom surfaces of the first and third interlayer dielectric patterns 3 and 7. Thus, the first and second semiconductor patterns SP1 and SP2 may decrease in length parallel to the second direction D2. An ion implantation process such as a tilted ion implantation process and/or a PLAD process may be performed to implant first conductivity type impurities into portions adjacent to ends of the first and second semiconductor patterns SP1 and SP2 exposed to the fourth recessed regions RR4, with the result that second source/drain regions SD2 may be formed. The second source/drain regions SD2 may be formed spaced apart from the first source/drain regions SD1. A cross-section taken along line A-A' of FIG. 16A may have a structure shown in FIG. 13B in which the third mask pattern MK3 takes the place of the second mask pattern MK2. A cross-sections taken along line B-B' of FIG. 16A may be the same as that of FIG. 15B, and a cross-sections taken along line D-D' of FIG. 16A may be the same as that of FIG. 15D.

Subsequently, referring back to FIGS. 3A to 3F, a first electrode layer may be conformally formed, and then an anisotropic etching process may be performed to form first electrodes BE in the fourth recessed regions RR4. An isotropic etching process may be performed to further remove the second interlayer dielectric patterns 5, exposing surfaces of the first electrodes BE. In addition, a dielectric layer DL may be conformally stacked, a second electrode layer may be stacked to fill the third opening OP3, and then a planarization etching process may be performed to form a second electrode UE.

Figure 13A:
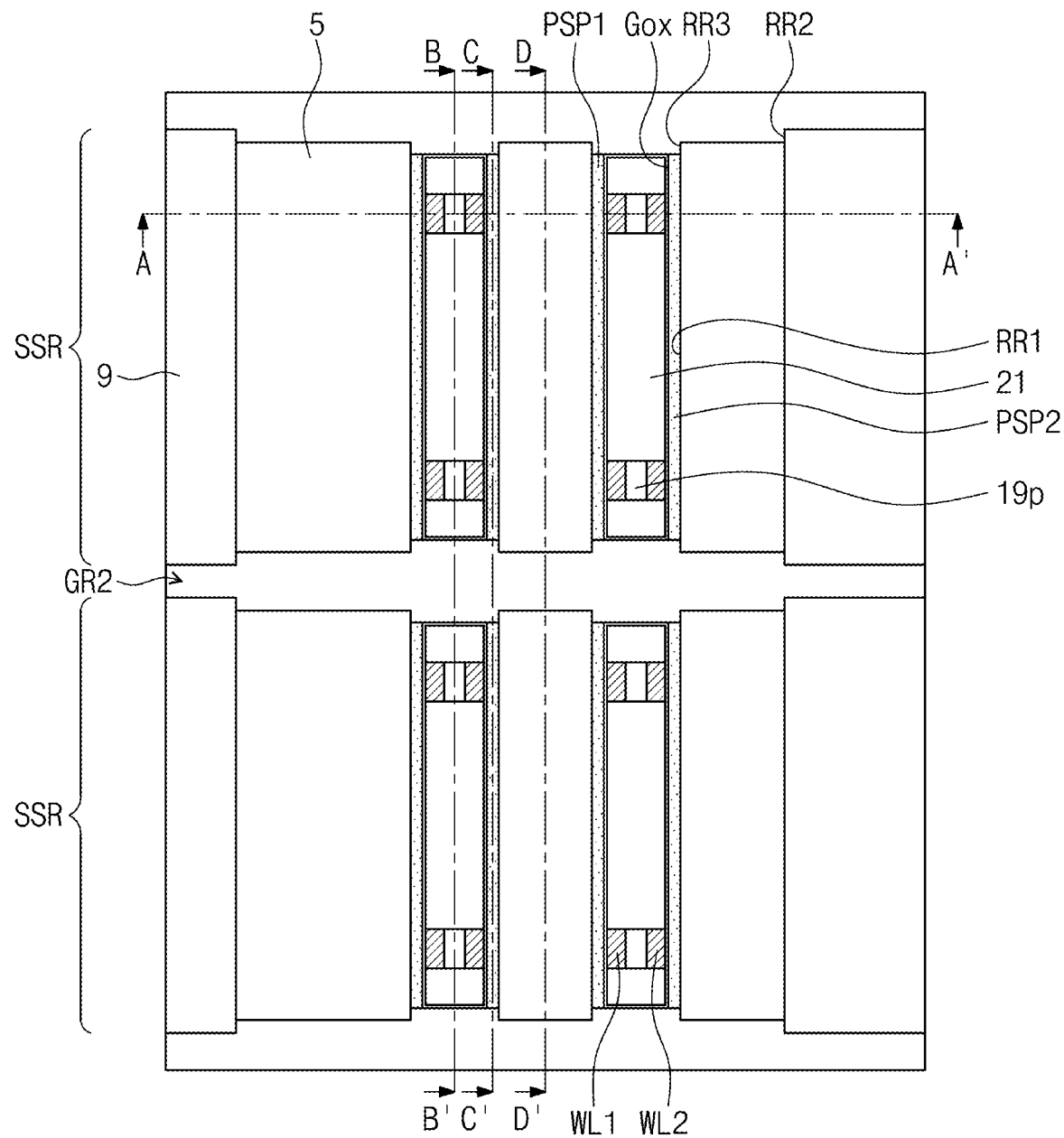
Figure 13A:
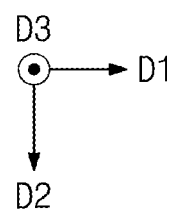
Figure 13B:
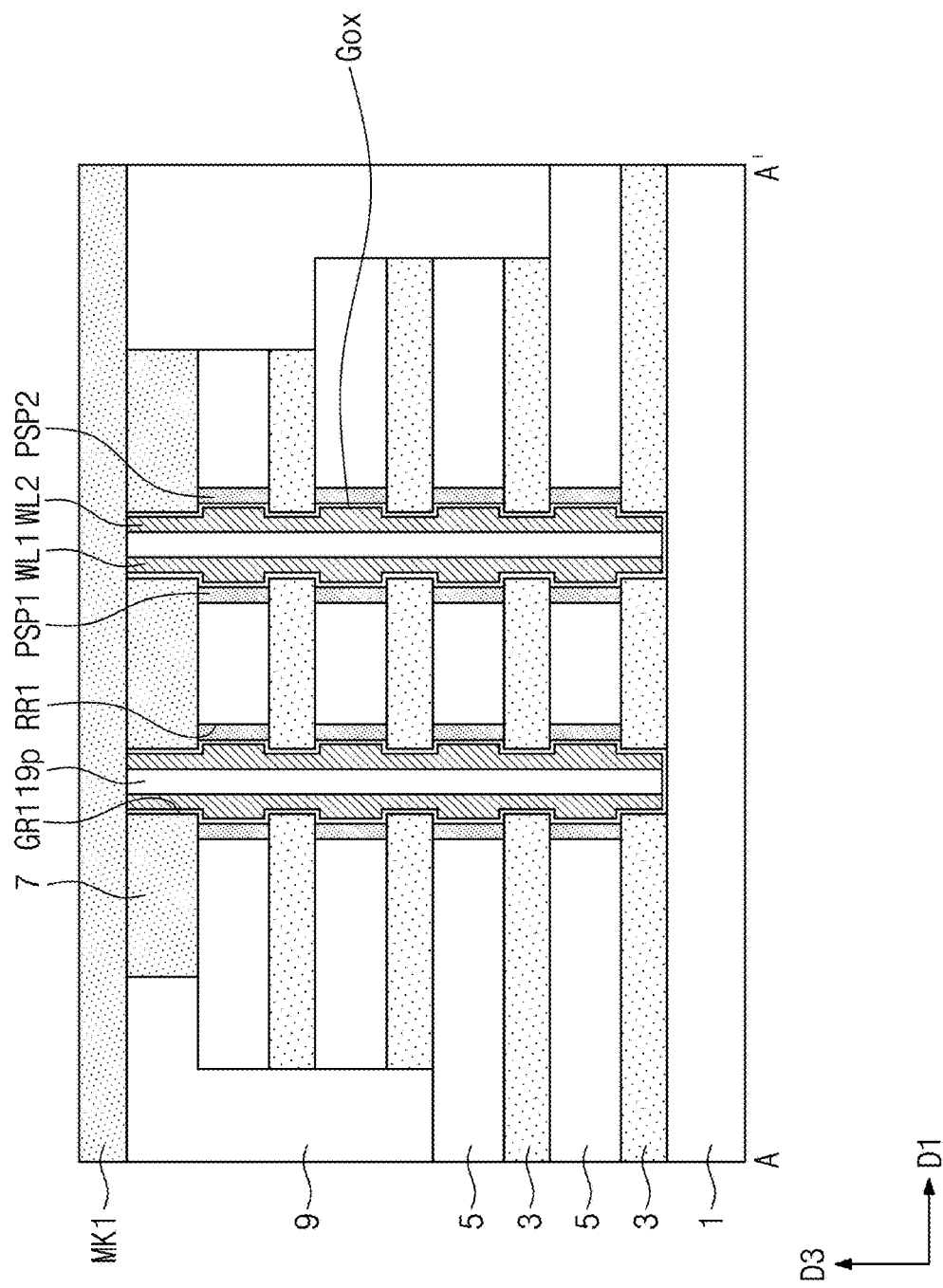
FIG. 13B illustrates a cross-sectional view taken along line A-A' of FIG. 13A.
Figure 13C:
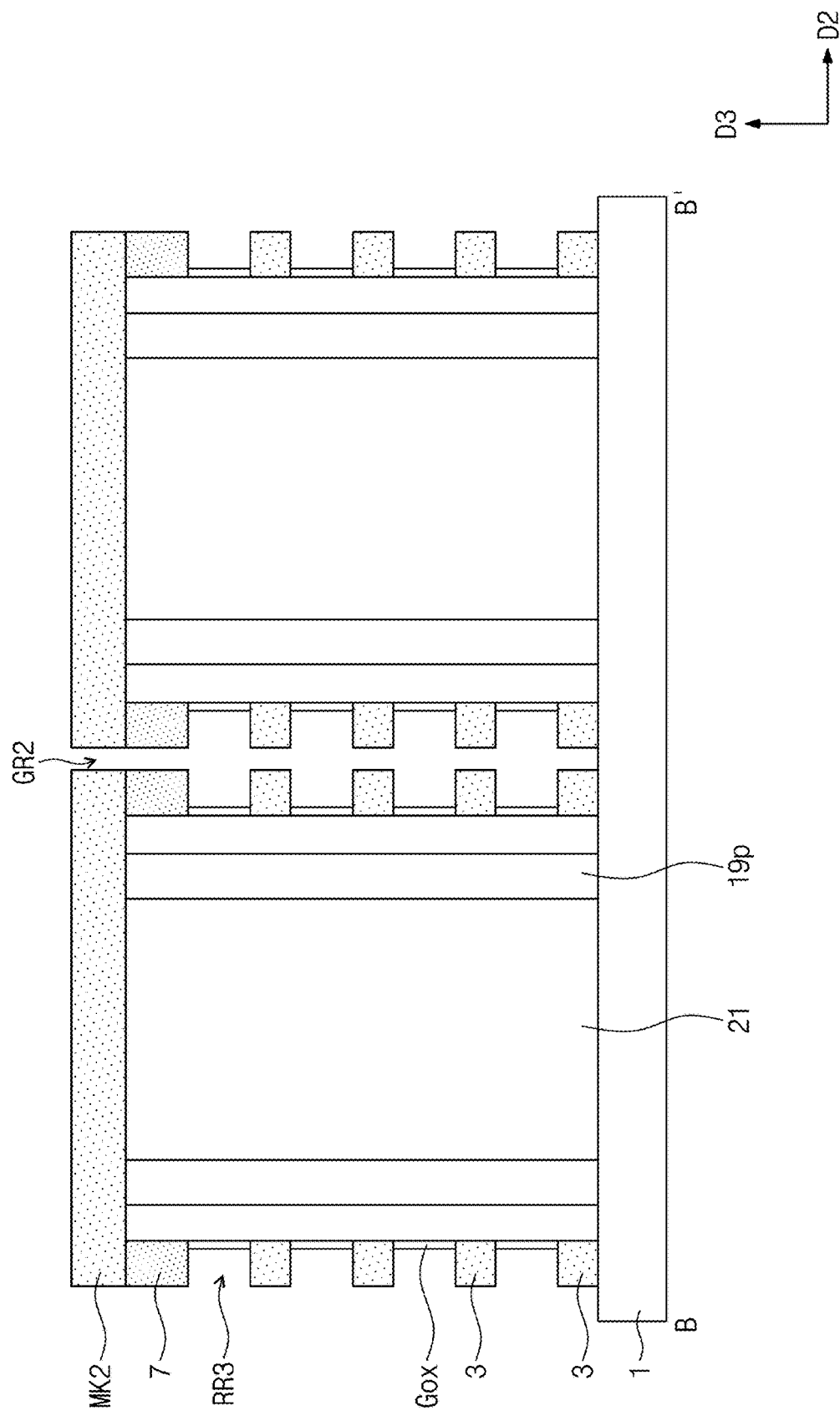
Figure 13D:
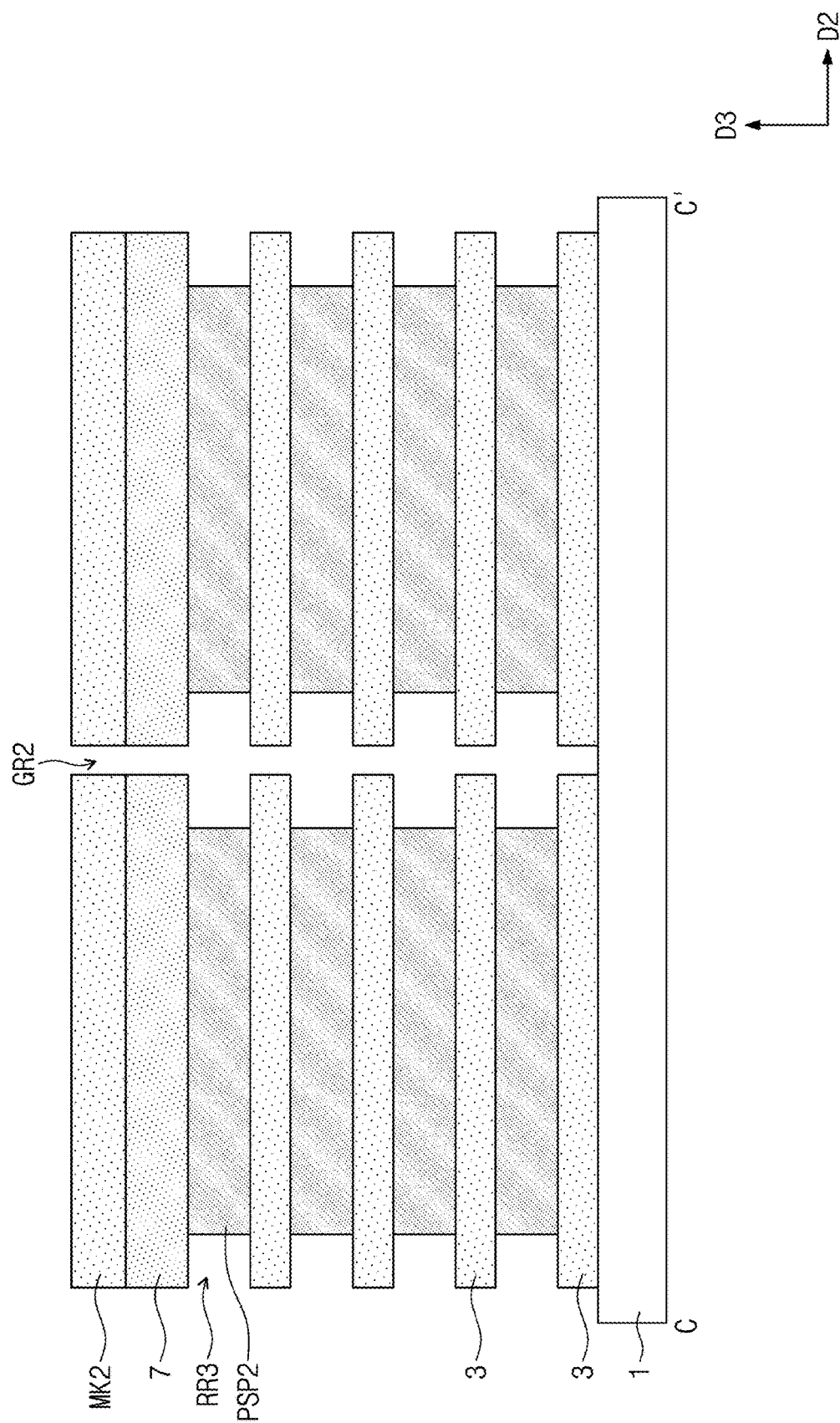
Figure 14A:
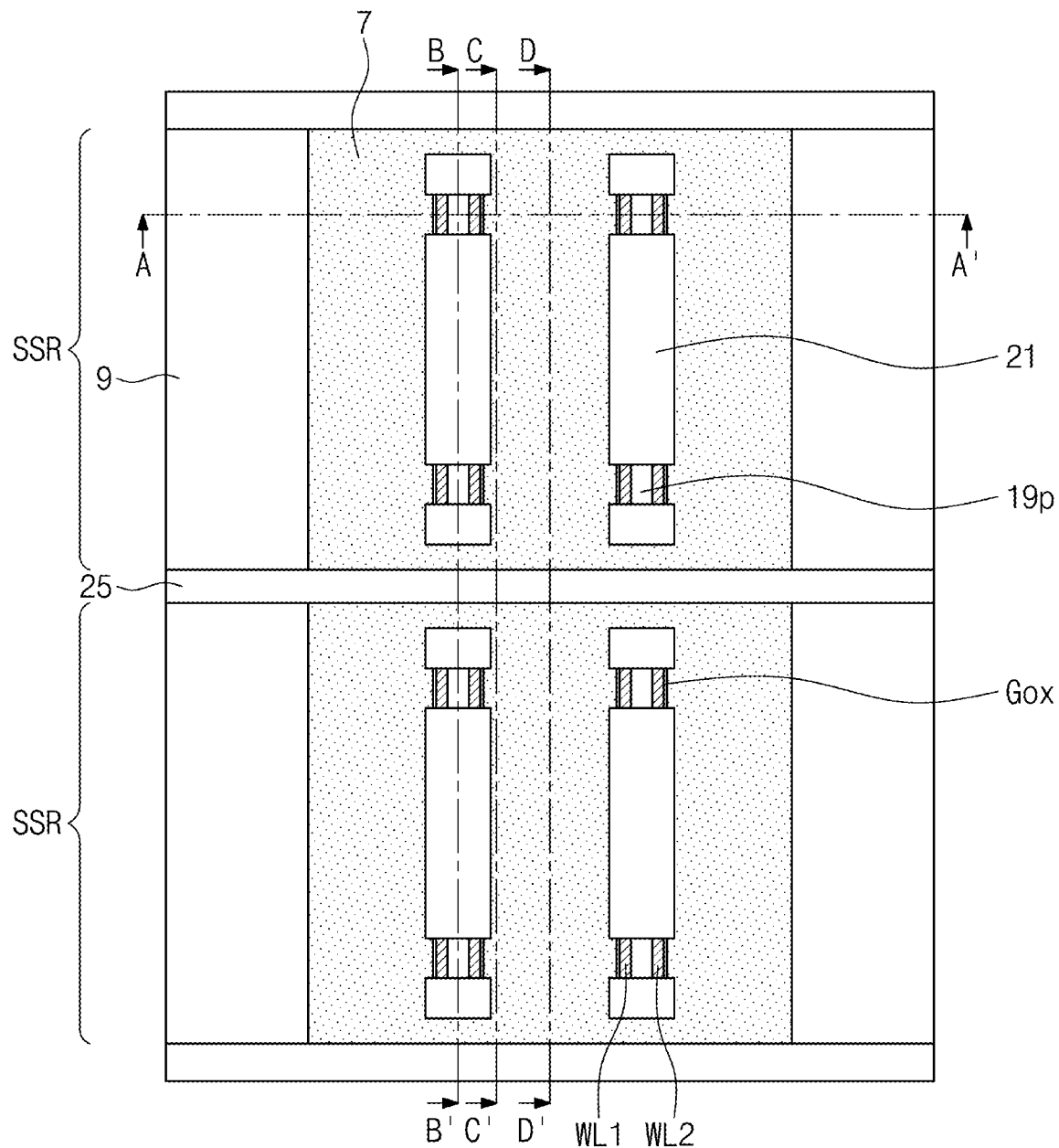
Figure 14A:
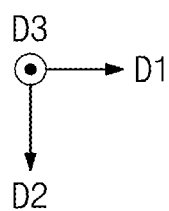
Figure 14B:
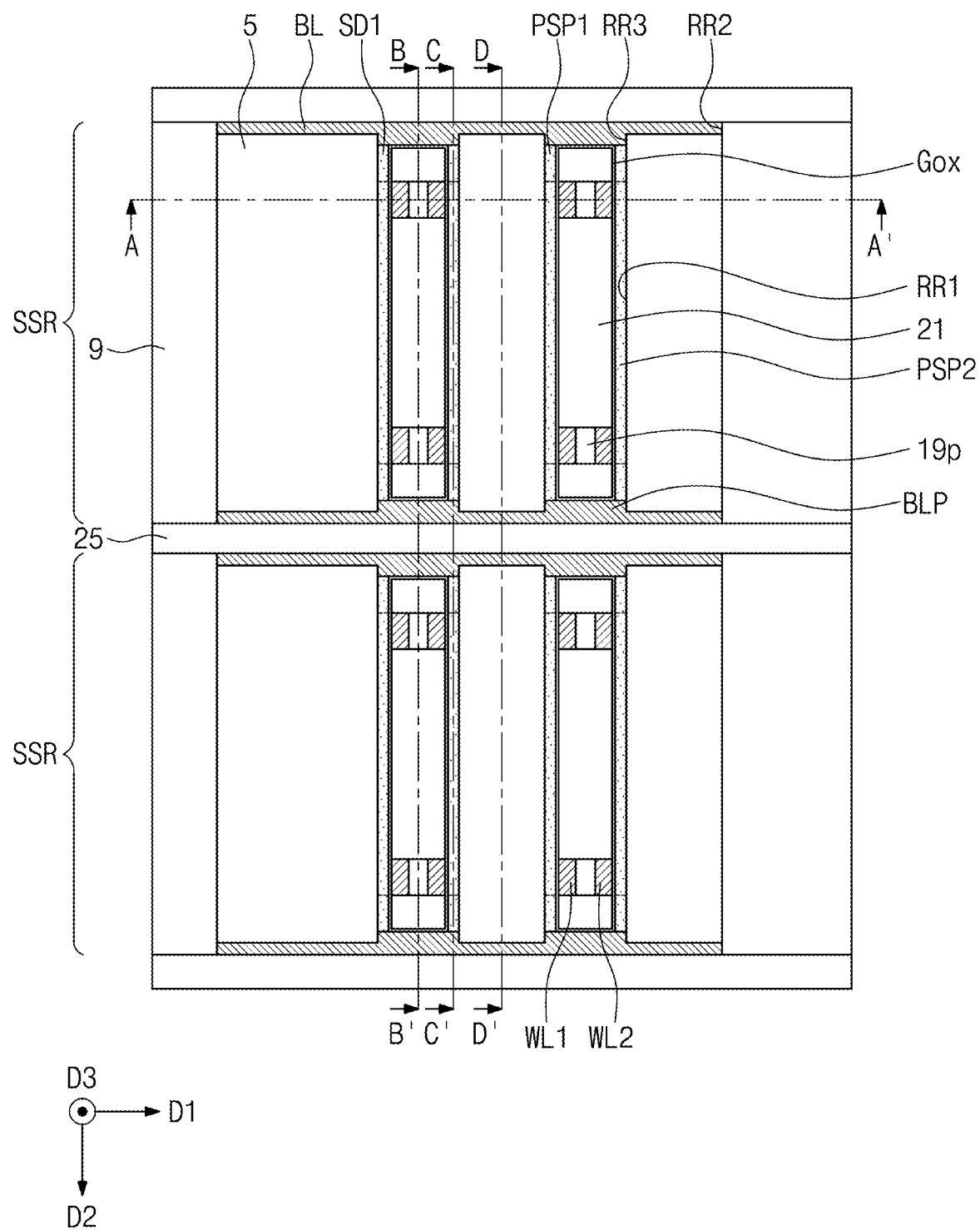
Figure 14C:
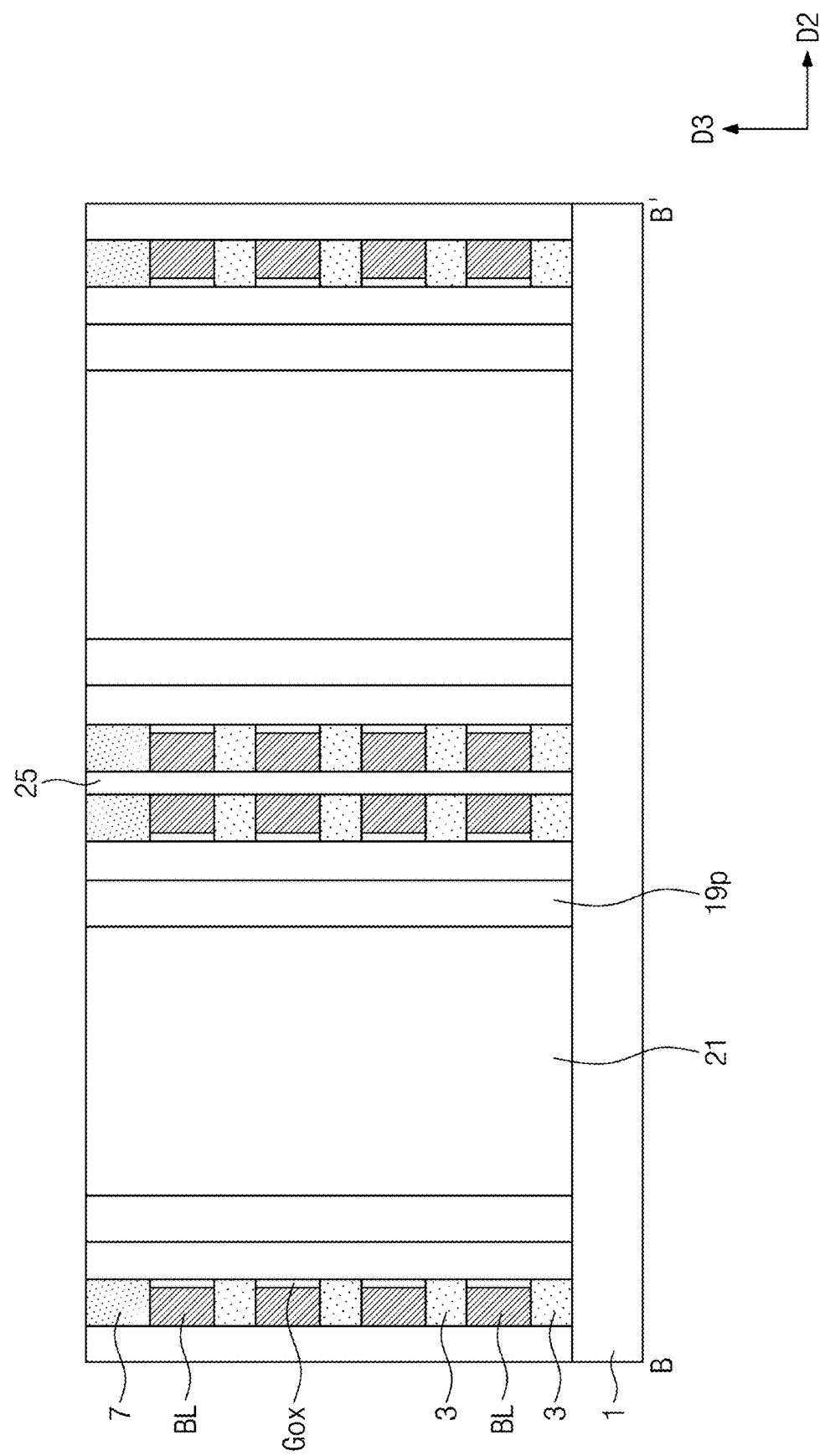
Figure 14D:
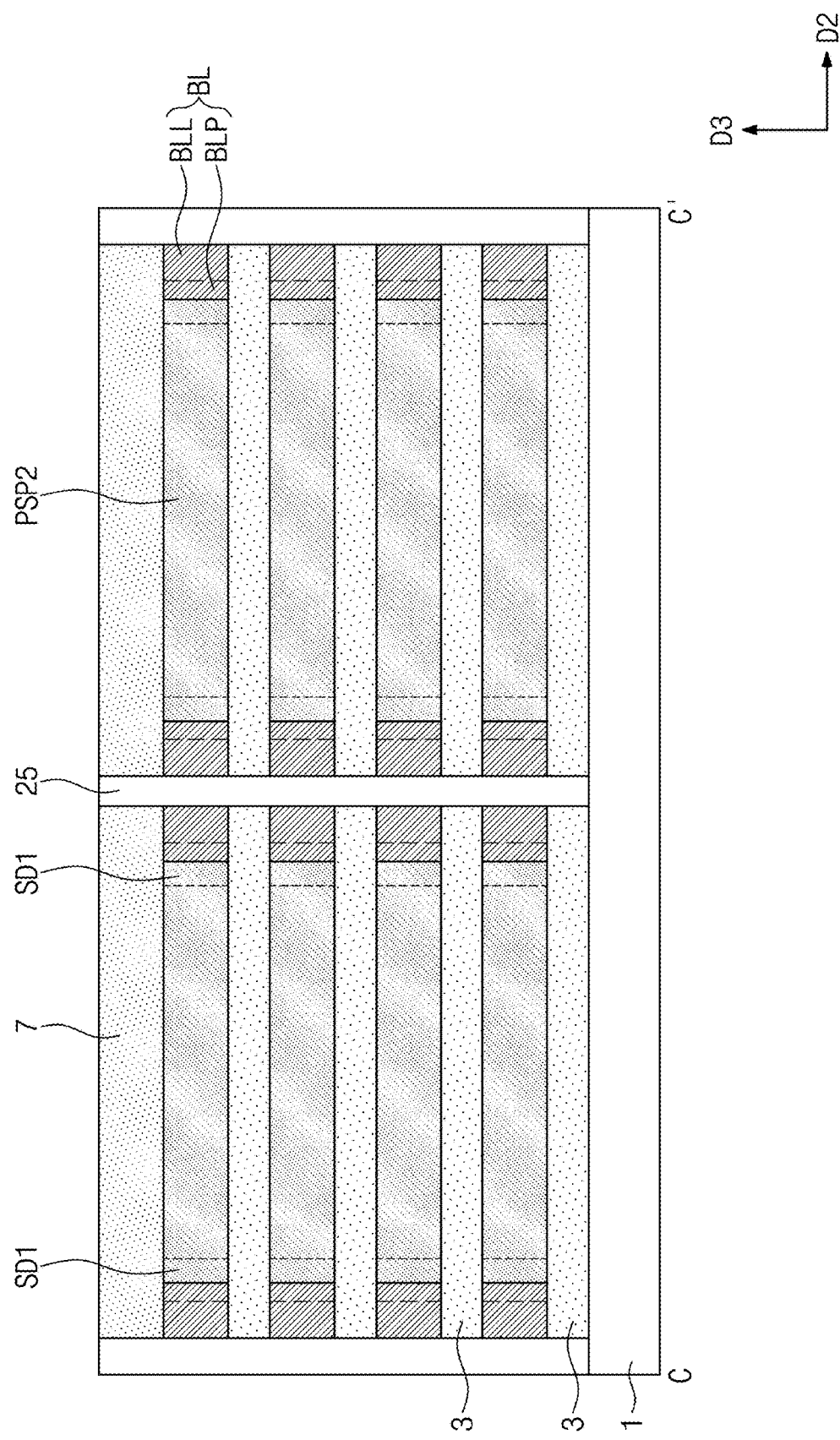
Figure 14E:
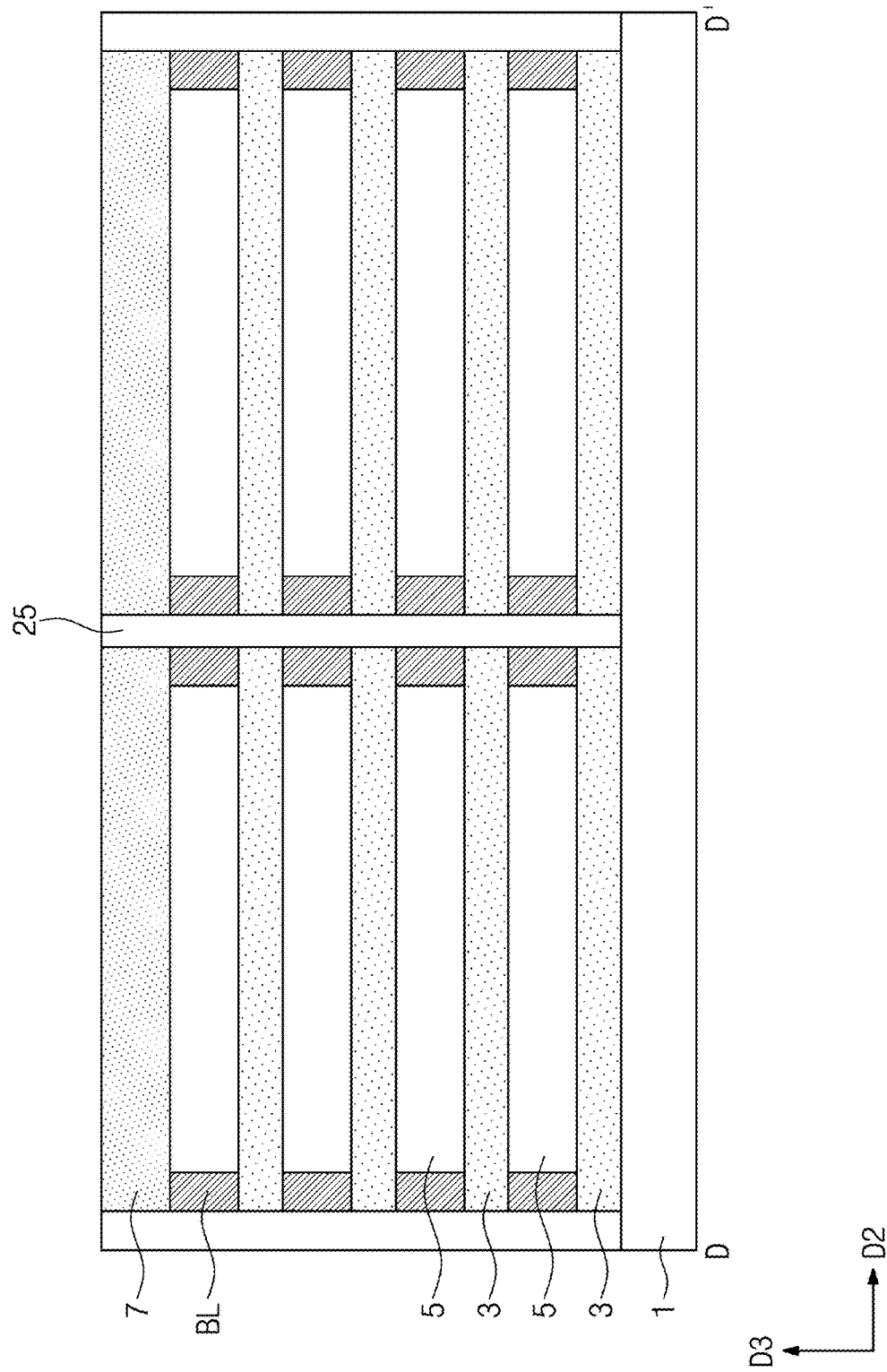
Figure 15A:
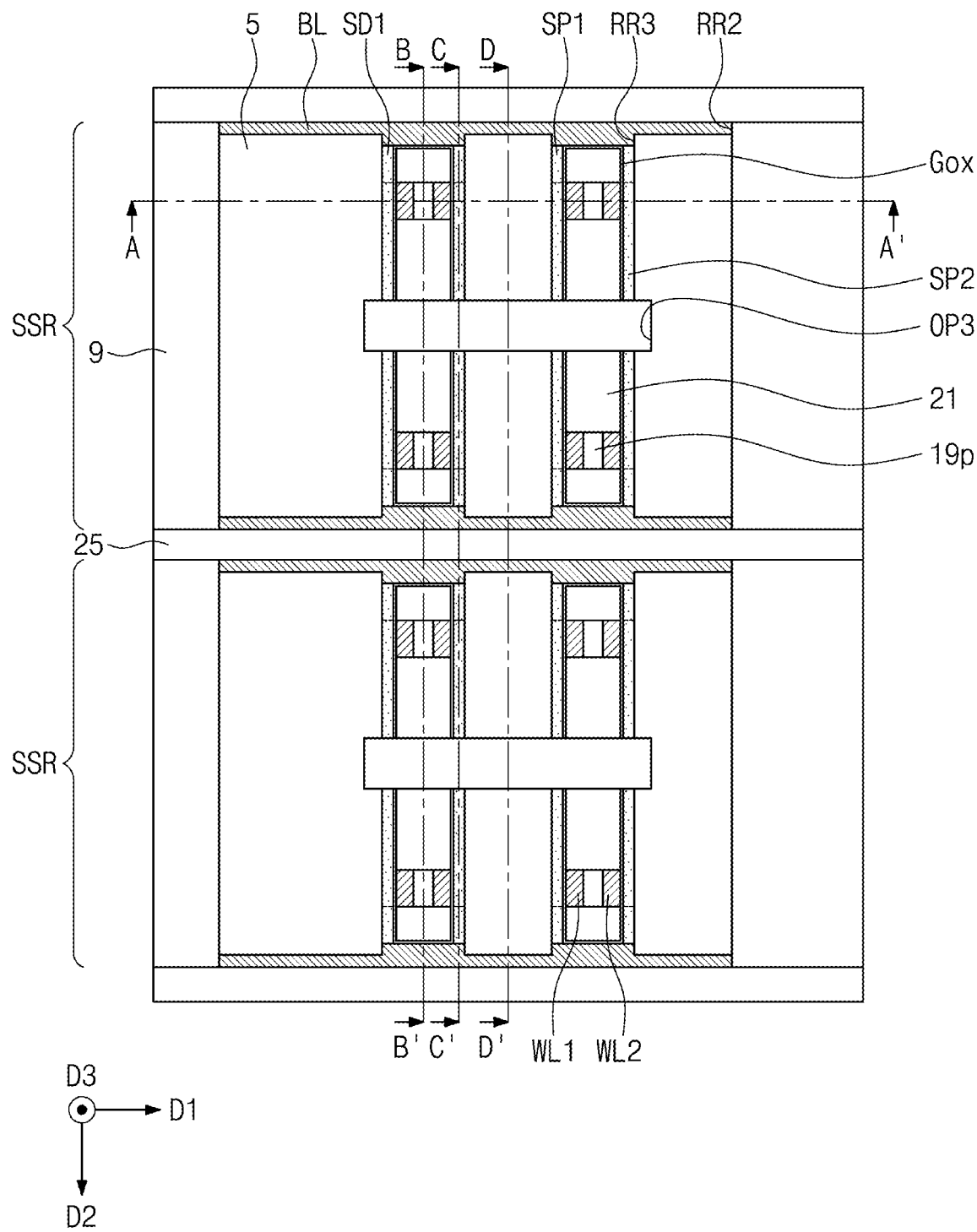
Figure 15B:
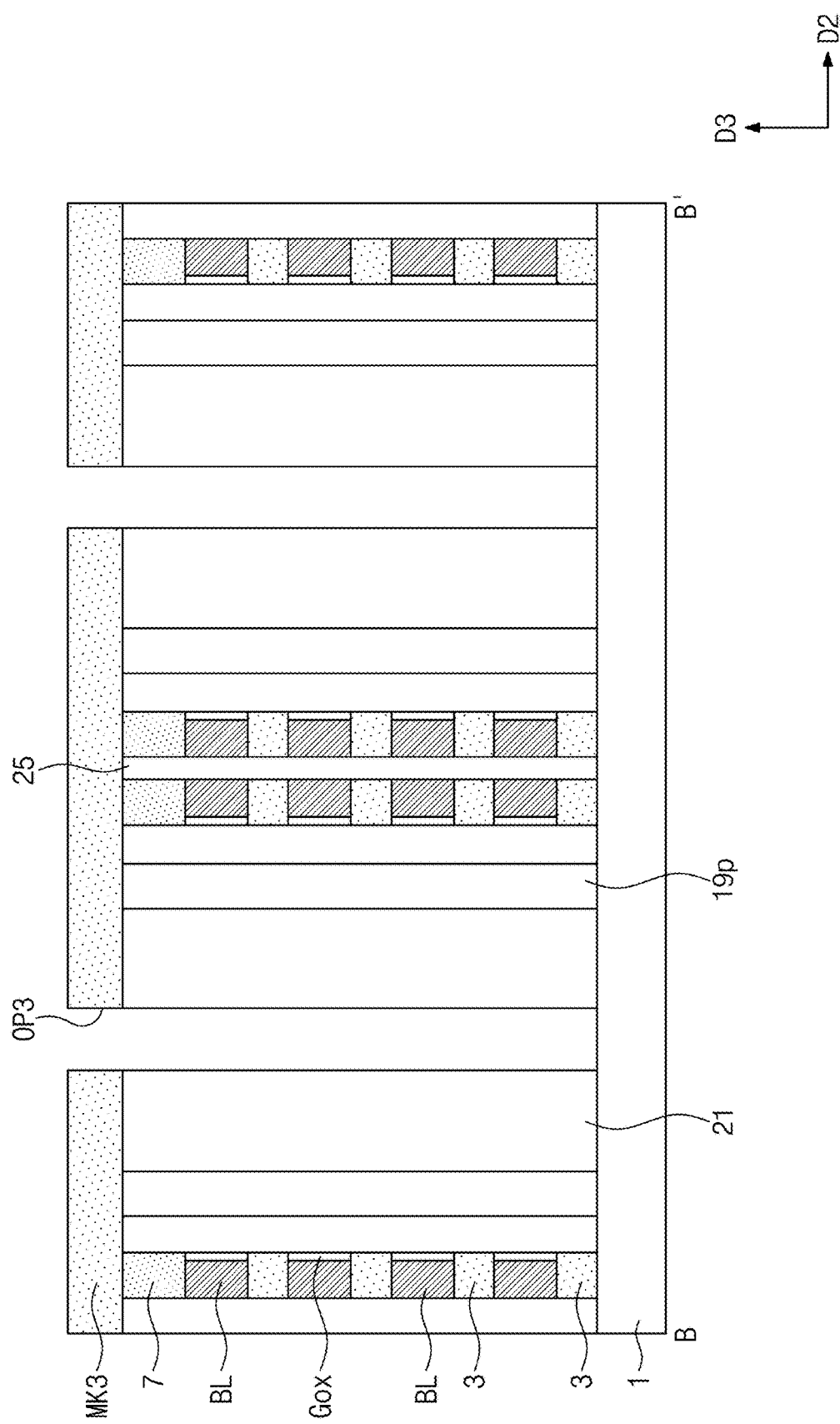
Figure 15C:
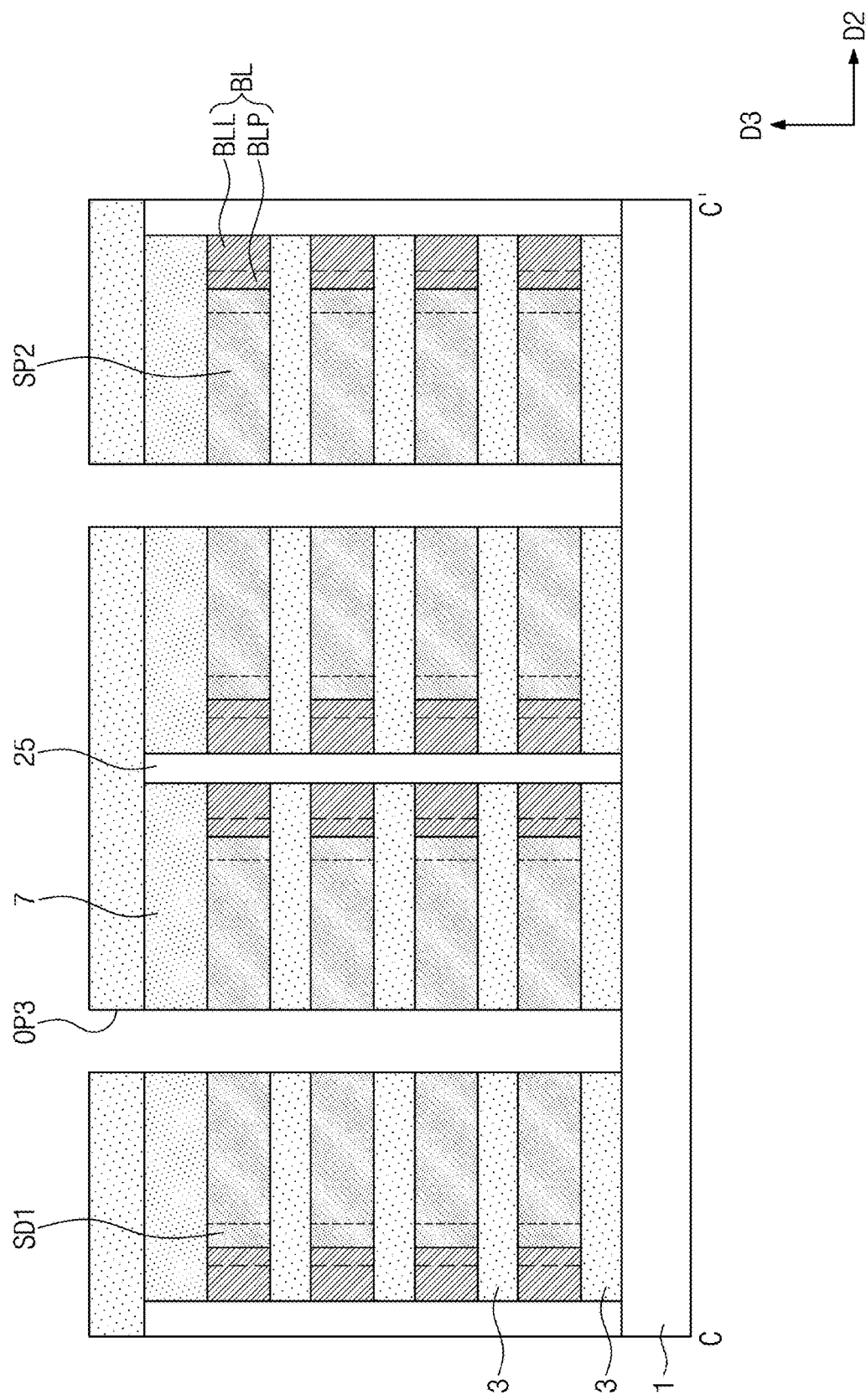
Figure 15D:
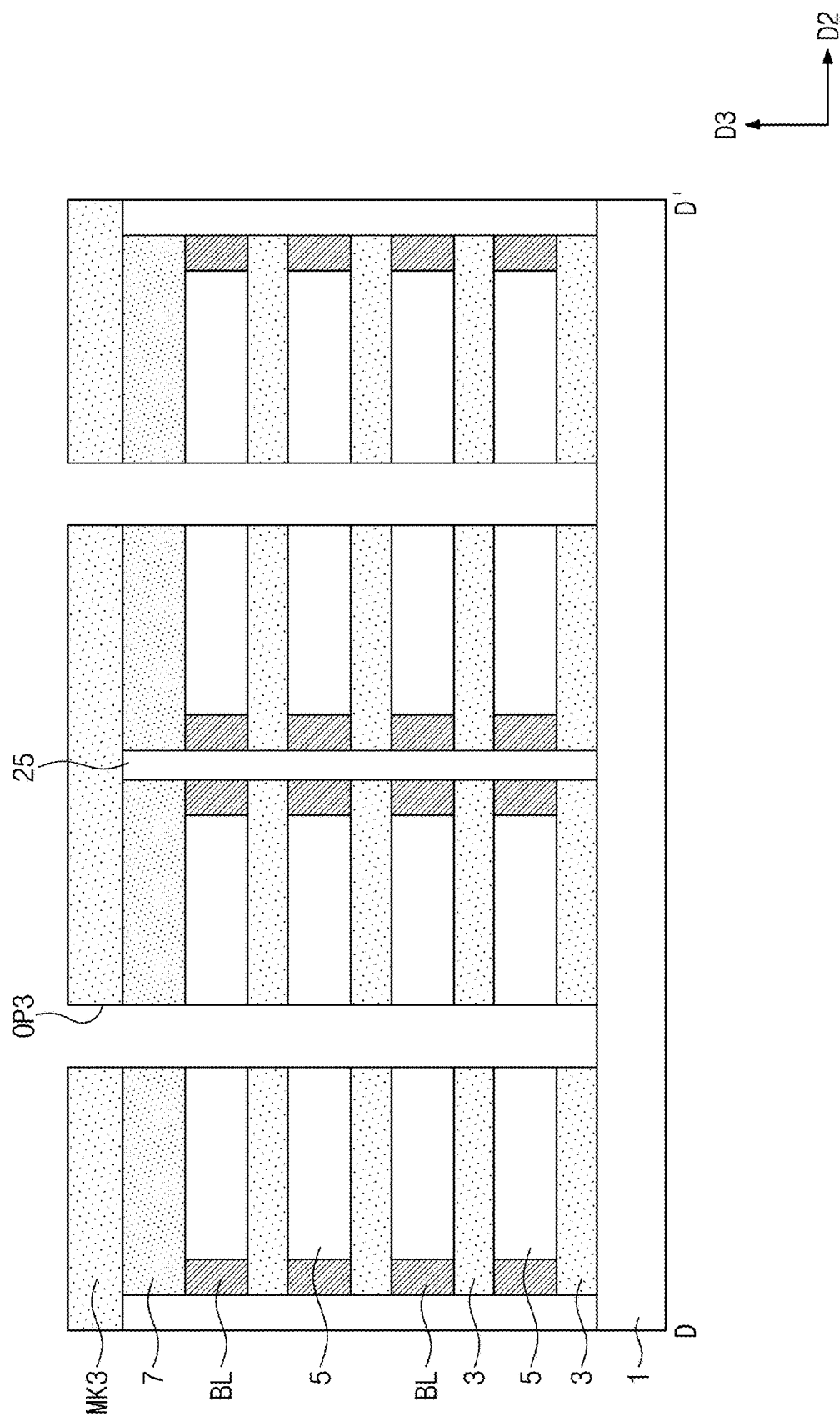

In a method of fabricating a semiconductor memory device according to some example embodiments of inventive concepts, because a single first groove GR1 shown in FIG. 4A is used to form two preliminary semiconductor patterns PSP1 and PSP2 shown in FIG. 13A, it may be possible to double the number of semiconductor patterns that are finally formed. As a result, integration may improve and/or productivity may increase. Moreover, when first interlayer dielectric layers and second interlayer dielectric layers are stacked as shown in FIG. 4B, no semiconductor layer may be formed between the first and second interlayer dielectric layers, which may simplify a fabrication process and/or reduce manufacturing costs.

Figure 17:
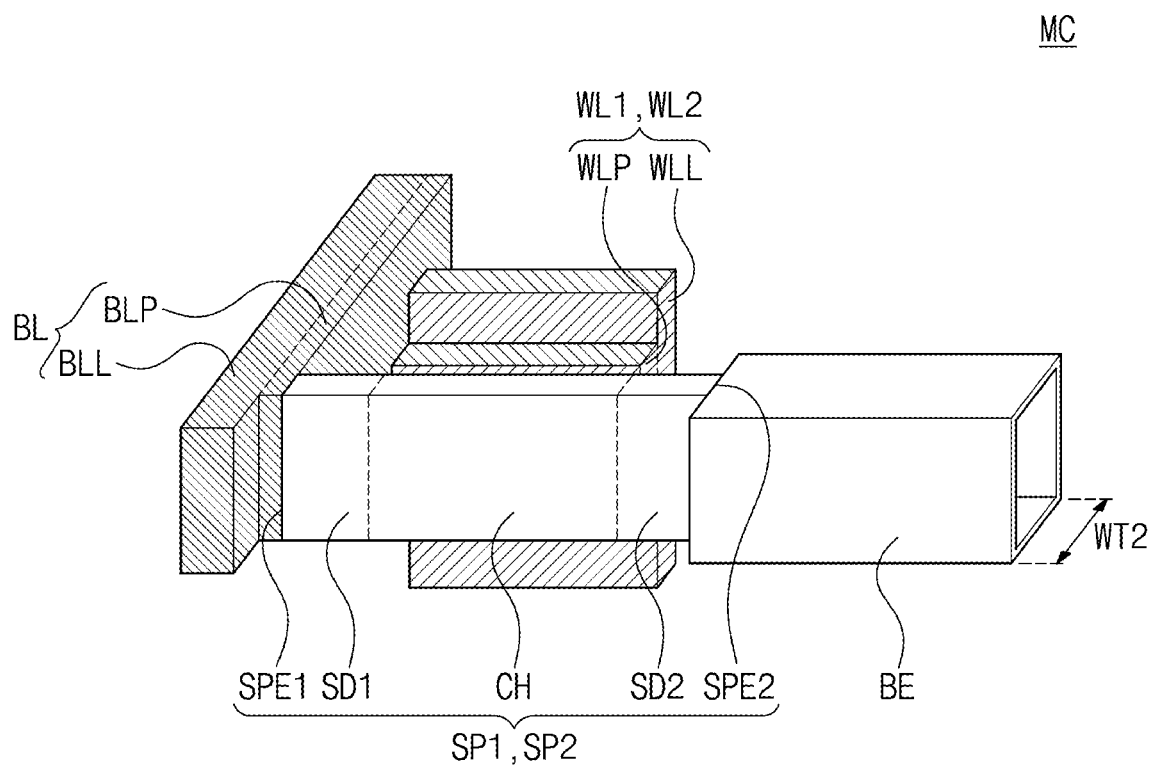
FIG. 17 illustrates a perspective view showing a unit memory cell of a semiconductor memory device according to some example embodiments of inventive concepts.

FIG. 17 illustrates a perspective view showing a unit memory cell of a semiconductor memory device according to some example embodiments of inventive concepts.

Referring to FIG. 17, a unit memory cell MC according to some example embodiments may be configured such that the first electrode BE may have a bottom surface coplanar with that of any of the semiconductor patterns SP1 and SP2. The first electrode BE may have a top surface coplanar with that of any of the semiconductor patterns SP1 and SP2. The first electrode BE may have a second width WT2 parallel to the first direction D1. The second width WT2 may be greater than the first width WT1 of the first electrode BE shown in FIG. 2A. Therefore, the capacitor CAP may have an increase in area, and a corresponding increase in capacitance. The increase in capacitance may improve the electrical performance of the unit memory cell MC; for example, the increase in capacitance may improve the refresh performance of the unit memory cell MC. Other configurations may be identical or similar to those discussed above with reference to FIG. 2A.

Figure 18:
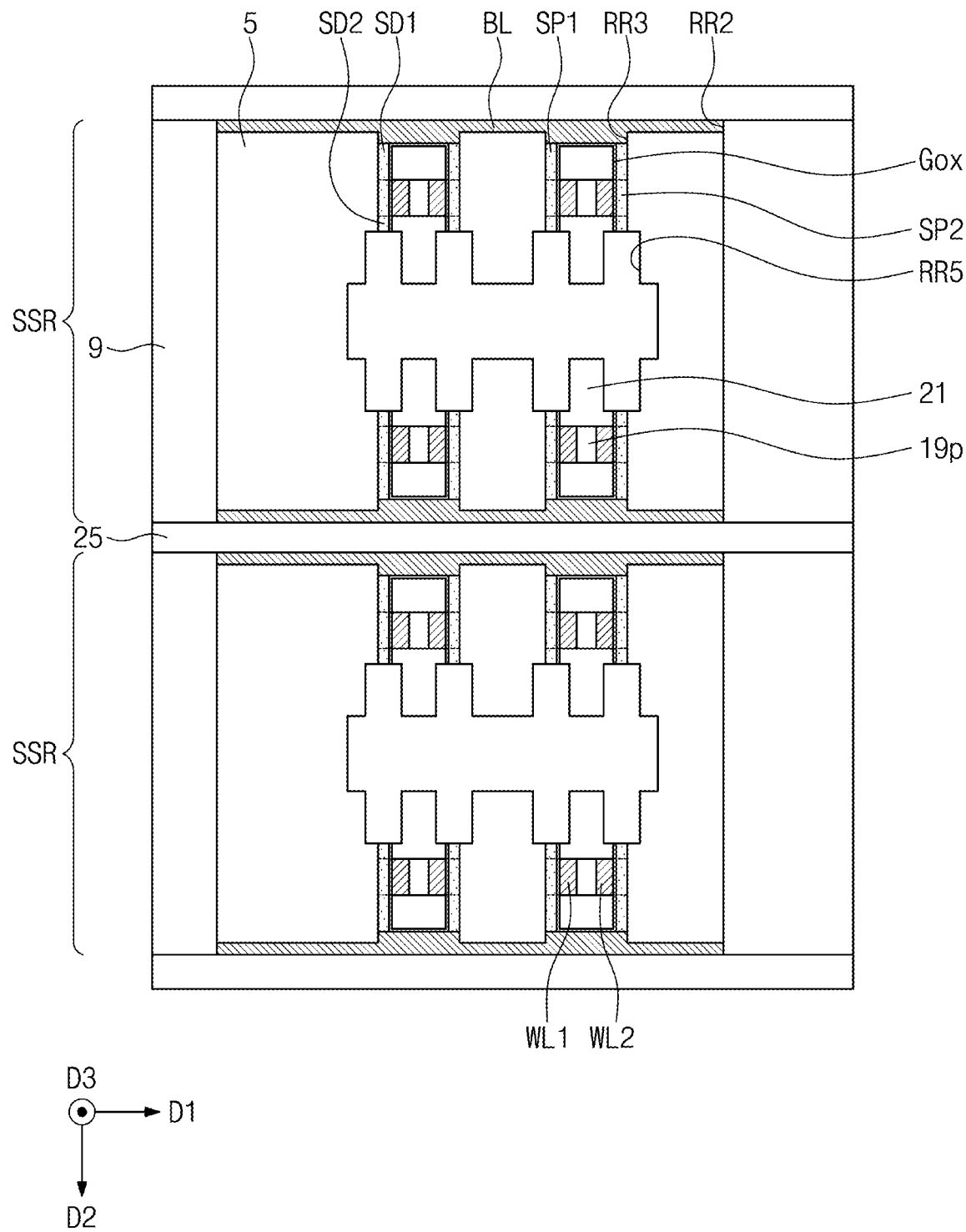
FIG. 18 illustrates a plan view showing a method of fabricating the semiconductor memory device of FIG. 17.

FIG. 18 illustrates a plan view showing a method of fabricating the semiconductor memory device depicted in FIG. 17.

Referring to FIG. 18, an isotropic etching process, such as a wet etching process, may be additionally performed to partially remove the second interlayer dielectric patterns 5 without performing the formation of the first electrode BE in a step described in connection with FIG. 16A. At this stage, the isotropic etching process may also partially remove the second buried dielectric pattern 21 and the gate dielectric layer Gox in contact with the second interlayer dielectric patterns 5. Thus, at the second interlayer dielectric patterns 5, fifth recessed regions RR5 may be formed which are wider than the fourth recessed regions RR4 of FIG. 16A. Afterwards, as discussed with reference to FIGS. 3A to 3F, subsequent processes may be performed to form the first electrode BE, the dielectric layer DL, and the second electrode UE. As a result, the first electrode BE of FIG. 17 may be formed to have the wider second width WT2.

Figure 19:
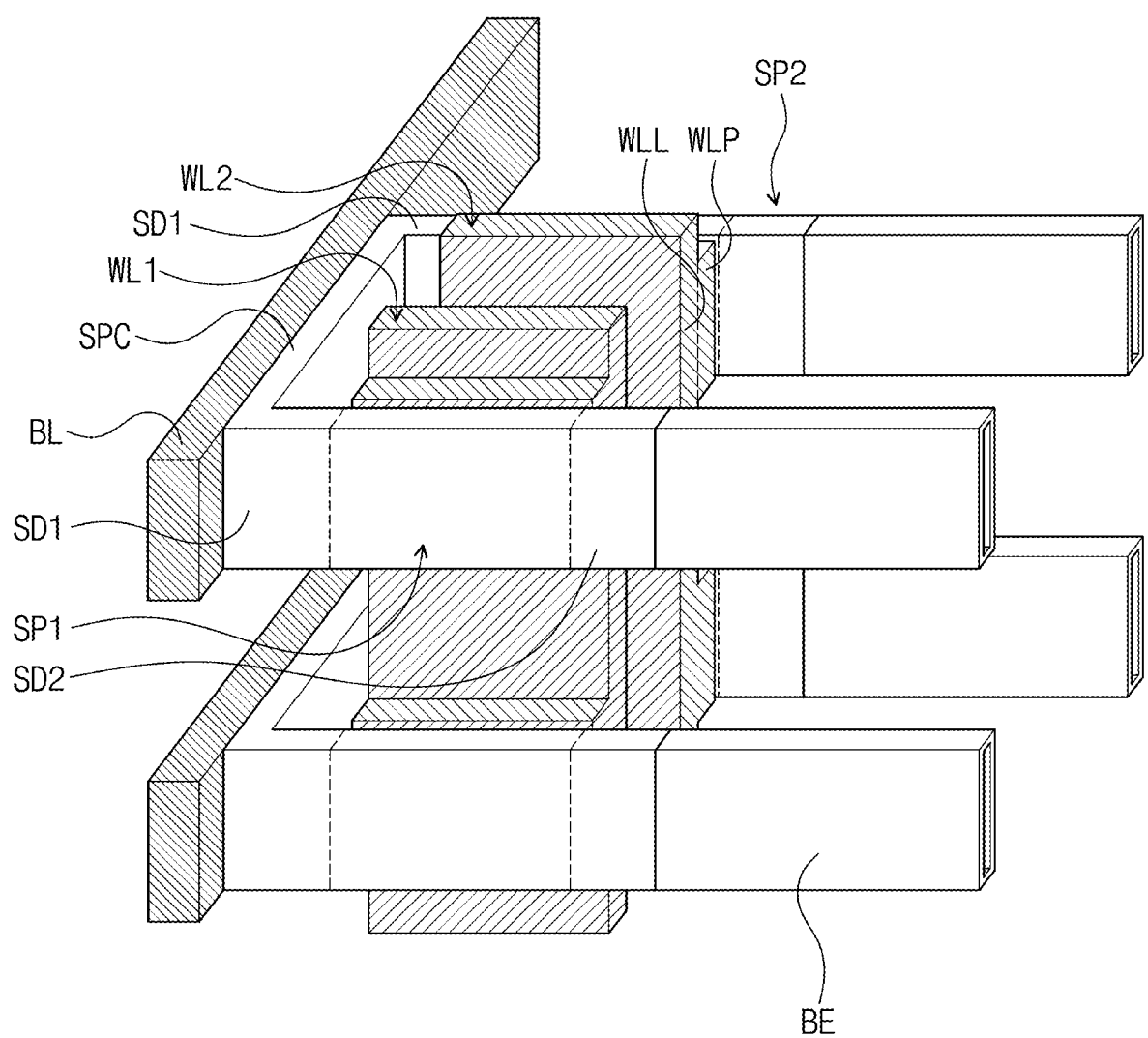
FIG. 19 illustrates a perspective view showing a semiconductor memory device according to some example embodiments of inventive concepts.
Figure 20:
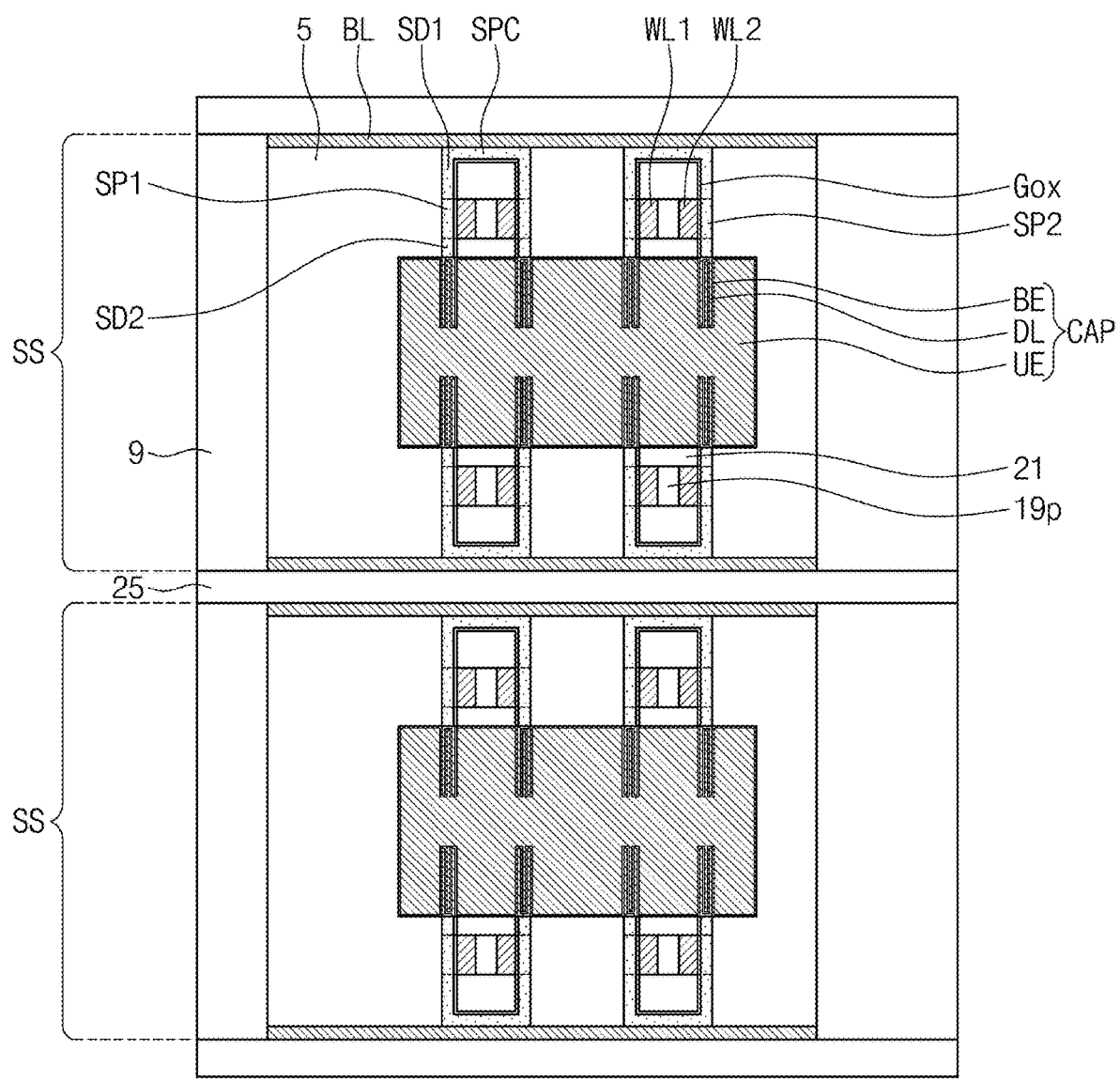
FIG. 20 illustrates a plan view at a certain level showing the semiconductor memory device of FIG. 19.

FIG. 19 illustrates a perspective view showing a semiconductor memory device according to some example embodiments of inventive concepts. FIG. 20 illustrates a plan view at a certain level showing the semiconductor memory device of FIG. 19.

Referring to FIGS. 19 and 20, a semiconductor memory device according to some example embodiments may be configured such that a connection semiconductor pattern SPC may connect the first semiconductor pattern SP1 and the second semiconductor pattern SP2 which neighbor each other. The connection semiconductor pattern SPC may connect the first source/drain regions SD1 of the first and second semiconductor patterns SP1 and SP2. The connection semiconductor pattern SPC may be doped with impurities whose type and concentration are the same as those of impurities doped in the first source/drain regions SD1. The connection semiconductor pattern SPC may contact the bit line BL. The bit line BL may include no bit line protrusion BLP of FIG. 2B. The bit line BL may have uniform width and thickness that is independent of position. Other structural features may be identical or similar to those discussed above.

The semiconductor memory device of FIGS. 19 and 20 may be fabricated by the same process illustrated in FIGS. 4A to 16B except for a difference in the procedures depicted in FIGS. 13A to 13D. For example, an ion implantation process such as a tilted ion implantation process and/or a PLAD process may be performed in a step described in connection with FIGS. 12A to 12D to form the first source/drain regions SD1 on the preliminary semiconductor patterns PSP and to form the bit lines BL. Afterwards, the procedures discussed with reference to FIGS. 15A to 16B may be subsequently performed.

Figure 21:
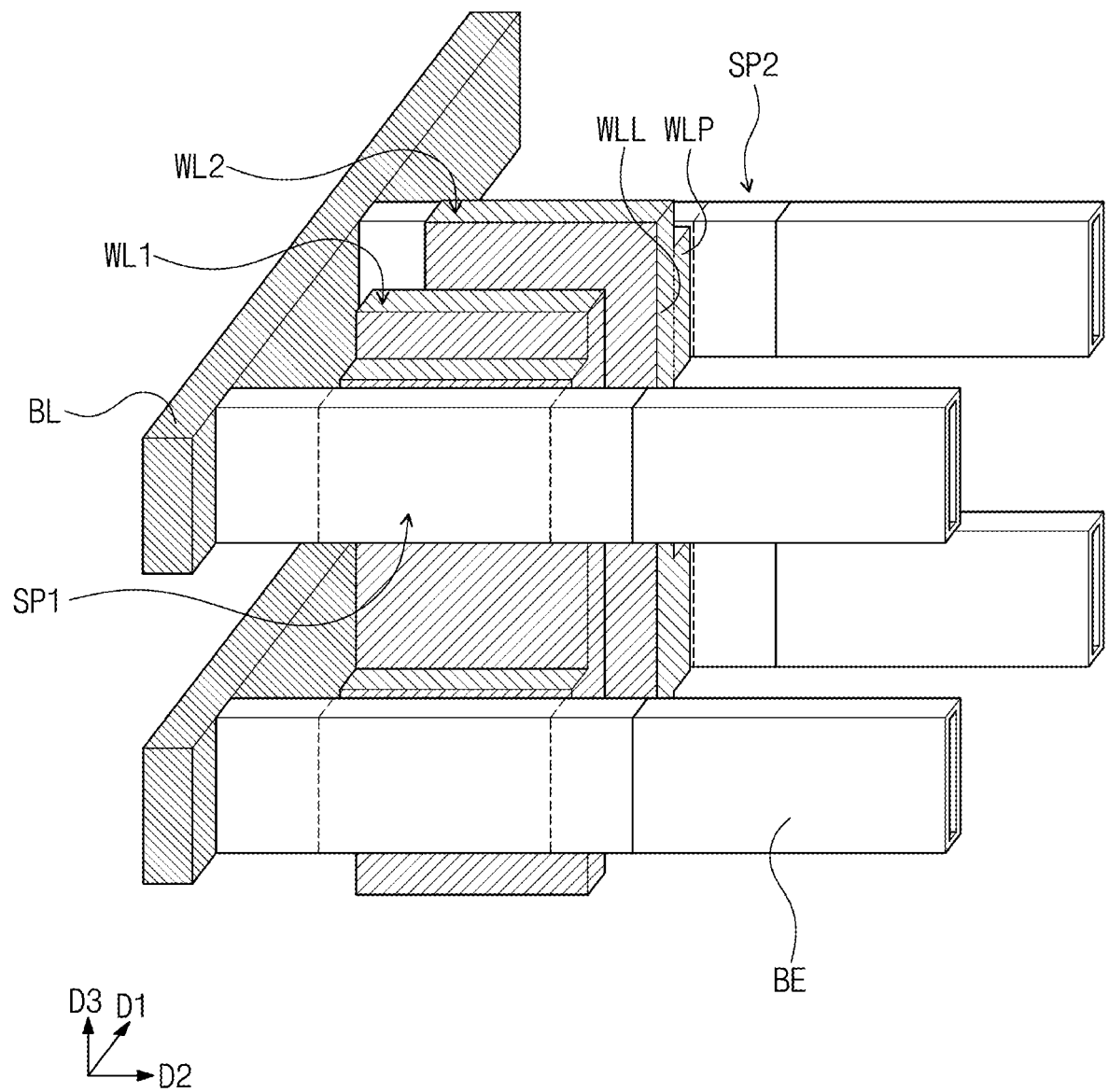
FIG. 21 illustrates a perspective view showing a semiconductor memory device according to some example embodiments of inventive concepts.

FIG. 21 illustrates a perspective view showing a semiconductor memory device according to some example embodiments of inventive concepts.

Referring to FIG. 21, a semiconductor memory device according to some example embodiments may be configured such that the bit line BL may include no bit line protrusion BLP of FIG. 2B. The bit line BL may contact, e.g. directly contact, ends of the first and second semiconductor patterns SP1 and SP2 without intervention of the connection semiconductor pattern SPC shown in FIG. 19. Other structural features may be identical or similar to those discussed above.

Figure 22:
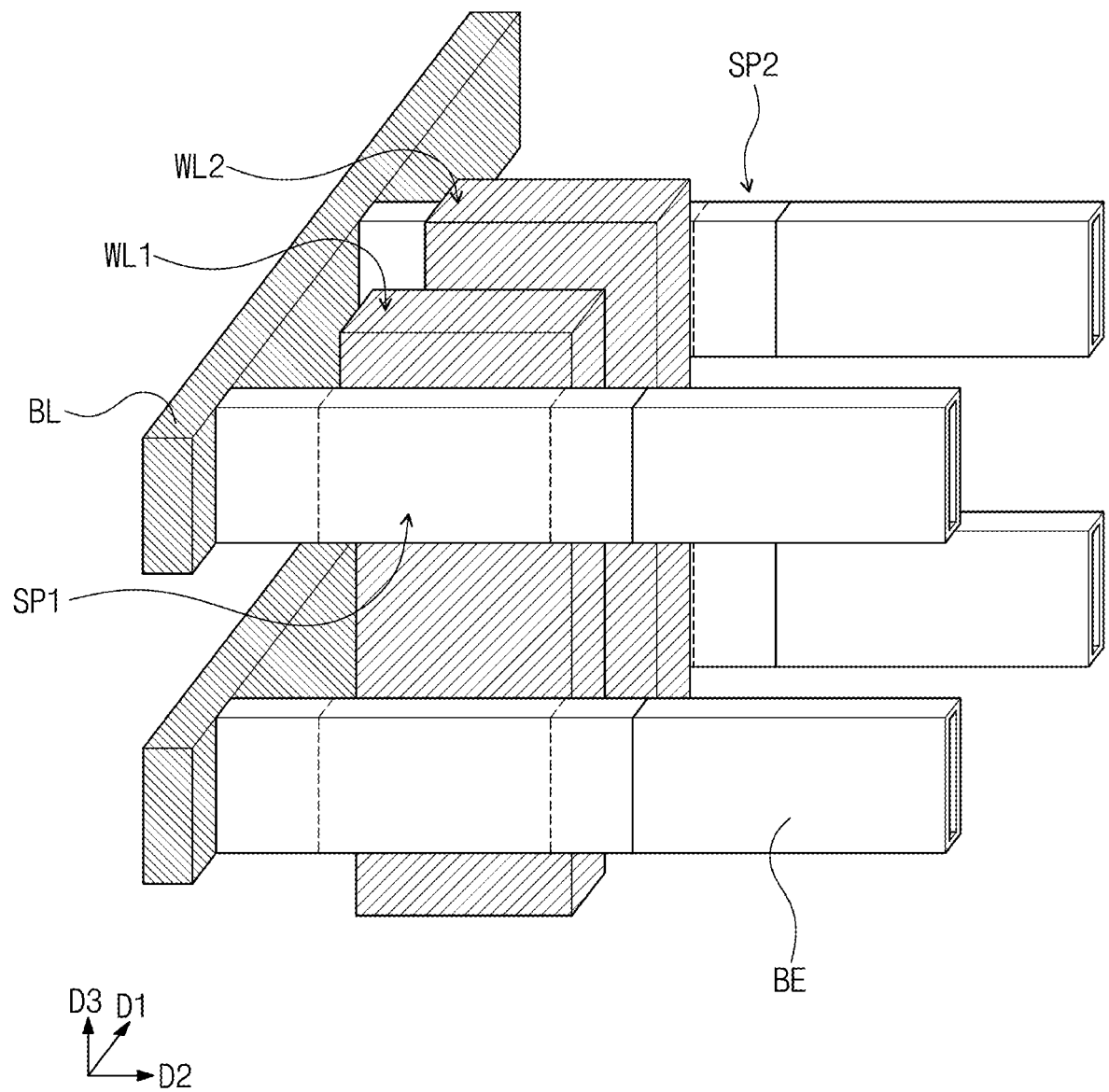
FIG. 22 illustrates a perspective view showing a semiconductor memory device according to some example embodiments of inventive concepts.
Figure 23:
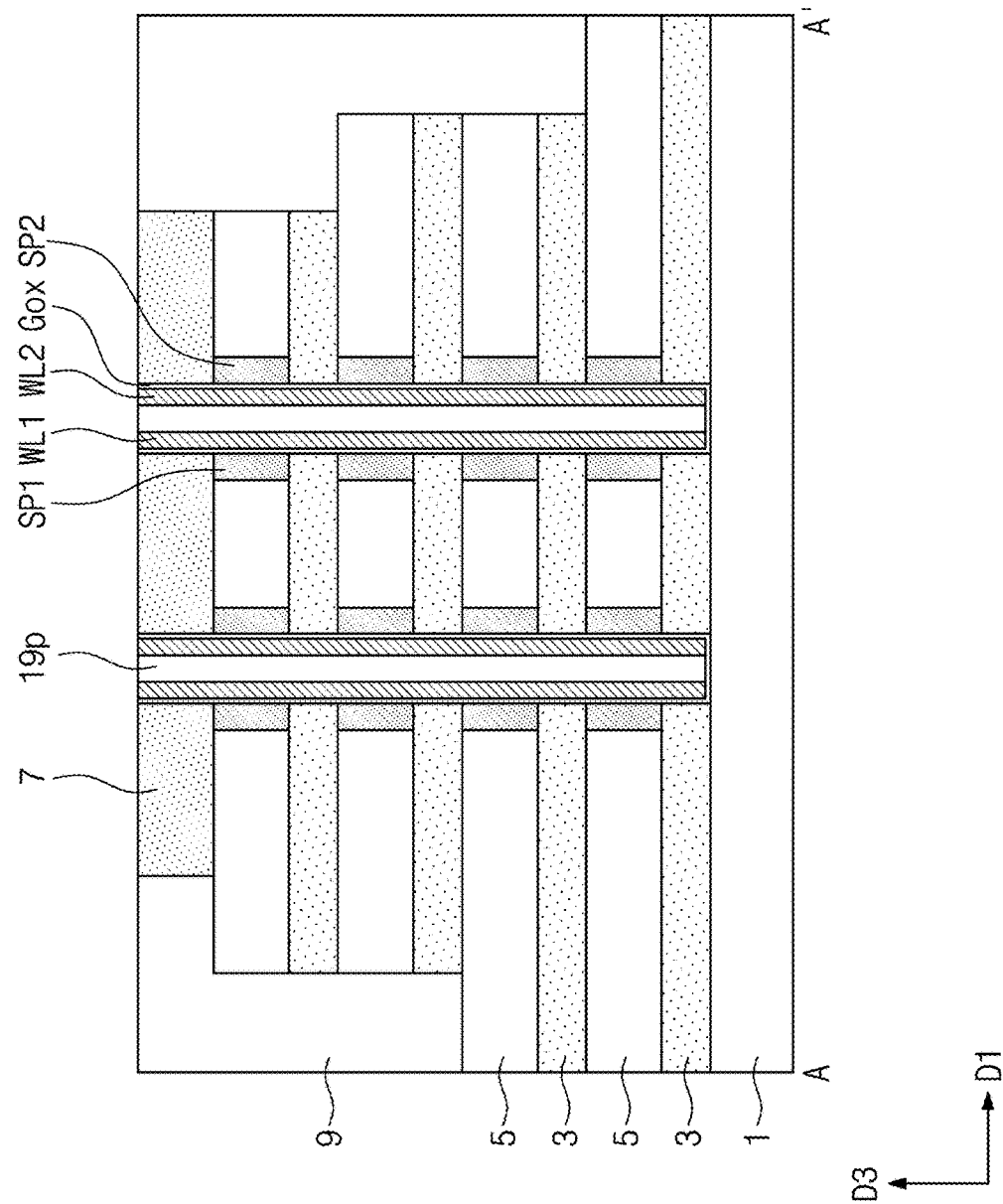
FIG. 23 illustrates a cross-sectional view showing the semiconductor memory device of FIG. 22.

FIG. 22 illustrates a perspective view showing a semiconductor memory device according to some example embodiments of inventive concepts. FIG. 23 illustrates a cross-sectional view showing the semiconductor memory device of FIG. 22.

Referring to FIGS. 22 and 23, a semiconductor memory device according to the present embodiment may be configured such that each of the word lines WL1 and WL2 may include no word line protrusion WLP of FIG. 2B. The word lines WL1 and WL2 may each have uniform width and thickness independent of position. The bit line BL may also include no bit line protrusion BLP of FIG. 2B, and may have uniform width and thickness regardless of position. The semiconductor patterns SP1 and SP2 may have their sidewalls aligned with lateral surfaces of the first and third interlayer dielectric patterns 3 and 7. A cross-section of the gate dielectric layer Gox may have no uneven structure. Other structural features may be identical or similar to those discussed above.

The following will describe a method of fabricating the semiconductor memory device shown in FIGS. 22 and 23.

When an isotropic etching process is executed in which the semiconductor layer 15 is partially removed (see FIG. 7B) to form the preliminary semiconductor patterns PSP (see FIG. 8C) in performing the procedures illustrated in FIGS. 4A to 16B, the degree of removal of the semiconductor layer 15 may be so controlled that the preliminary semiconductor patterns PSP are formed to completely fill the first recessed region RR1 and spaced apart from each other. Subsequently, as discussed with reference to FIGS. 9A to 16B, identical or similar processes may be executed.

A semiconductor memory device according to some example embodiments of inventive concepts may be configured such that a single unit memory cell may be constituted by, or correspond to, a bit line and a semiconductor pattern that are located at the same level, and that the semiconductor pattern may have a width less than a thickness thereof, with the result that the semiconductor memory device may increase in integration.

In a method of fabricating a semiconductor memory device according to some example embodiments of inventive concepts, a single first groove may be used to form two preliminary semiconductor patterns, and accordingly it may be possible to double the number of semiconductor patterns that are finally formed. Integration may improve and/or productivity may increase.

Although some example embodiments of inventive concepts have been discussed with reference to accompanying figures, it will be understood that various changes in form and details may be made therein without departing from the spirit and scope of inventive concepts. It therefore will be understood that the some example embodiments described above are just illustrative but not limitative in all aspects.

What is claimed is:

1. A semiconductor memory device, comprising:
a first semiconductor pattern on a substrate, the first semiconductor pattern including a first end and a second end facing the first end;
a first conductive line adjacent to a lateral surface of the first semiconductor pattern, the first conductive line between the first end and the second end when viewed along a first lateral direction, the first conductive line perpendicular to a top surface of the substrate;
a second conductive line in contact with a side surface of the first end of the first semiconductor pattern and spaced part from the first conductive line, the second conductive line parallel to the top surface of the substrate; and
a data storage pattern in contact with the second end of the first semiconductor pattern,
wherein the first conductive line includes a protrusion that protrudes adjacent to the lateral surface of the first semiconductor pattern.

2. The device of claim 1, further comprising:
an interlayer dielectric pattern between the first semiconductor pattern and the substrate,
wherein a lateral surface of the interlayer dielectric pattern protrudes more toward the first conductive line than the lateral surface of the first semiconductor pattern protrudes toward the first conductive line.

3. The device of claim 1, wherein the second conductive line includes a protrusion in contact with the first end of the first semiconductor pattern.

4. The device of claim 1, wherein a lateral surface of the second conductive line contacts the first end of the first semiconductor pattern, and the lateral surface has an uneven structure.

5. The device of claim 1, wherein,
the first semiconductor pattern is provided in plural, and the plurality of first semiconductor patterns are sequentially stacked on the substrate,
the first conductive line is adjacent to lateral surfaces of the first semiconductor patterns, and
the semiconductor memory device further includes,
a plurality of interlayer dielectric patterns among the first semiconductor patterns, and
a gate dielectric layer between the first conductive line and each of the interlayer dielectric patterns and between the first conductive line and each of the first semiconductor patterns, wherein a lateral surface of the gate dielectric layer has an uneven structure.

6. The device of claim 1, further comprising:
a second semiconductor pattern on the substrate at a height the same as a height of the first semiconductor pattern and spaced apart from the first semiconductor pattern, the second semiconductor pattern including a third end and a fourth end facing the third end; and
a third conductive line adjacent to a lateral surface of the second semiconductor pattern, the third conductive line between the third end and the fourth end, the third conductive line perpendicular to the top surface of the substrate,
wherein the third conductive line includes a protrusion that protrudes adjacent to the lateral surface of the second semiconductor pattern.

7. The device of claim 6, wherein the second conductive line extends to be in contact with the third end of the second semiconductor pattern.

8. The device of claim 6, wherein the first conductive line and the third conductive line are spaced apart from each other, and are between the first semiconductor pattern and the second semiconductor pattern.

9. The device of claim 6, further comprising:
a connection semiconductor pattern connecting the first end of the first semiconductor pattern to the third end of the second semiconductor pattern,
wherein the connection semiconductor pattern is in contact with the second conductive line.

10. The device of claim 9, wherein the connection semiconductor pattern, the first end, and the third end are doped with a same conductivity type impurity.

11. The device of claim 1, wherein,
the first conductive line extends in a first direction,
the second conductive line extends in a second direction, the second direction intersecting the first direction, and
the first semiconductor pattern has a first length and a second length, the first length parallel to the first direction and the second length parallel to the second direction,
wherein the first length is greater than the second length.

12. The device of claim 1, further comprising:
a second semiconductor pattern on the substrate at a height the same as a height of the first semiconductor pattern and spaced apart from the first semiconductor pattern; and
an interlayer dielectric pattern between the first semiconductor pattern and the second semiconductor pattern, the interlayer dielectric pattern simultaneously contacting the first semiconductor pattern and the second semiconductor pattern.

13. The device of claim 1, wherein the first semiconductor pattern and the second conductive line are at a same height.

14. The device of claim 1, wherein the data storage pattern includes a first electrode, and
a first width of the first electrode is greater than a second width of the first semiconductor pattern, the first and second widths being parallel to the second conductive line.

15. A semiconductor memory device, comprising:
a plurality of first interlayer dielectric patterns stacked on a substrate and a plurality of second interlayer dielectric patterns stacked on the substrate, the plurality of first interlayer dielectric patterns vertically alternating with the plurality of second interlayer dielectric patterns;

a first conductive line penetrating the second interlayer dielectric patterns and the first interlayer dielectric patterns and extending perpendicularly from a top surface of the substrate; and a plurality of semiconductor patterns horizontally between the first conductive line and at least a portion of the second interlayer dielectric patterns, respectively;

a second conductive line in contact with an end of one of the plurality of semiconductor patterns and spaced part from the first conductive line, the second conductive line parallel to the top surface of the substrate;

wherein the semiconductor patterns contact the second interlayer dielectric patterns, respectively, and wherein the second conductive line includes a protrusion in contact with the end of one of the plurality of semiconductor patterns.

16. The device of claim 15, wherein lateral surfaces of the semiconductor patterns are aligned to lateral surfaces of the first interlayer dielectric patterns.

17. The device of claim 15, wherein the first conductive line includes a plurality of protrusions that protrude toward the semiconductor patterns.

18. The device of claim 15, wherein,
the semiconductor patterns include a plurality of first semiconductor patterns at a first height, and
the semiconductor memory device further comprises a second conductive line contacting ends of the first semiconductor patterns and extending in a direction intersecting a longitudinal direction of the first conductive line.

19. The device of claim 18, wherein a bottom surface of the second conductive line is coplanar with bottom surfaces of the first semiconductor patterns.

20. A semiconductor memory device, comprising:
a plurality of first interlayer dielectric patterns stacked on a substrate and a plurality of second interlayer dielectric patterns stacked on the substrate, the plurality of first interlayer dielectric patterns alternating with the plurality of second interlayer dielectric patterns;

a first conductive line and a second conductive line, the first conductive line and the second conductive line penetrating the second interlayer dielectric patterns and the first interlayer dielectric patterns, the first conductive line and the second conductive line extending perpendicularly from a top surface of the substrate, the first and second conductive lines being spaced apart from each other;

a plurality of first semiconductor patterns between the first conductive line and at least a portion of the second interlayer dielectric patterns, respectively;

a plurality of second semiconductor patterns between the second conductive line and at least a portion of the second interlayer dielectric patterns, respectively;

a third conductive line in contact with an end of one of the plurality of first semiconductor patterns and spaced part from the first conductive line and the second conductive line, the third conductive line parallel to the top surface of the substrate;

wherein the first conductive line has a structure symmetrical to a structure of the second conductive line with respect to a virtual vertical plane separating the first conductive line and the second conductive line, and wherein the third conductive line includes a protrusion in contact with the end of one of the plurality of first semiconductor patterns.

* * * * *